United States Patent
Gawase et al.

(10) Patent No.: US 12,477,718 B2
(45) Date of Patent: Nov. 18, 2025

(54) SEMICONDUCTOR DEVICE AND SEMICONDUCTOR MEMORY DEVICE EACH HAVING PORTIONS OF OXIDE SEMICONDUCTOR BETWEEN GATE INSULATING LAYER AND ELECTRODES

(71) Applicant: Kioxia Corporation, Tokyo (JP)

(72) Inventors: Akifumi Gawase, Kuwana Mie (JP); Ha Hoang, Kuwana Mie (JP); Atsuko Sakata, Yokkaichi Mie (JP); Yuta Kamiya, Nagoya Aichi (JP); Kazuhiro Matsuo, Kuwana Mie (JP); Keiichi Sawa, Yokkaichi Mie (JP); Kota Takahashi, Yokkaichi Mie (JP); Kenichiro Toratani, Yokkaichi Mie (JP); Yimin Liu, Yokkaichi Mie (JP)

(73) Assignee: Kioxia Coporation, Tokyo (JP)

( * ) Notice: Subject to any disclaimer, the term of this patent is extended or adjusted under 35 U.S.C. 154(b) by 751 days.

(21) Appl. No.: 17/841,129

(22) Filed: Jun. 15, 2022

(65) Prior Publication Data
US 2023/0200050 A1 Jun. 22, 2023

(30) Foreign Application Priority Data
Dec. 20, 2021 (JP) .................................. 2021-205699

(51) Int. Cl.
*H10B 12/00* (2023.01)
*H10D 30/67* (2025.01)
*H10D 99/00* (2025.01)

(52) U.S. Cl.
CPC ............. *H10B 12/30* (2023.02); *H10B 12/05* (2023.02); *H10D 30/6728* (2025.01); *H10D 30/6755* (2025.01); *H10D 99/00* (2025.01)

(58) Field of Classification Search
CPC ........ H10B 12/30; H10B 12/05; H10D 99/00; H10D 30/6755; H10D 30/6728
See application file for complete search history.

(56) References Cited

U.S. PATENT DOCUMENTS

| 6,107,133 A | 8/2000 | Furukawa et al. |
| 6,894,336 B2 | 5/2005 | Van Roijen |

(Continued)

FOREIGN PATENT DOCUMENTS

| JP | 2019-096856 A | 6/2019 |
| JP | 6538598 B2 | 7/2019 |

(Continued)

*Primary Examiner* — Michael Jung
(74) *Attorney, Agent, or Firm* — Foley & Lardner LLP

(57) ABSTRACT

A semiconductor device of embodiments includes: a first electrode; a second electrode; an oxide semiconductor layer between the first electrode and the second electrode; a gate electrode surrounding the oxide semiconductor layer; a gate insulating layer between the gate electrode and the oxide semiconductor layer; a first insulating layer provided between the first electrode and the gate electrode; and a second insulating layer provided between the second electrode and the gate electrode. In a cross section parallel to a first direction from the first electrode to the second electrode, a first portion of the oxide semiconductor layer is provided between the gate insulating layer and the first electrode. In the cross section, a second portion of the oxide semiconductor layer is provided between the gate insulating layer and the second electrode.

20 Claims, 50 Drawing Sheets

(56) References Cited

U.S. PATENT DOCUMENTS

| | | | |
|---|---|---|---|
| 7,919,365 B2 | 4/2011 | Kim et al. | |
| 9,129,983 B2 | 9/2015 | Tang | |
| 9,502,431 B2 | 11/2016 | Sakuma et al. | |
| 9,698,272 B1 | 7/2017 | Ikeda et al. | |
| 10,181,472 B1 | 1/2019 | Huang | |
| 10,446,606 B2 | 10/2019 | Kumar et al. | |
| 10,777,468 B1 * | 9/2020 | Zhang | H10D 84/0195 |
| 2011/0253982 A1 | 10/2011 | Wang et al. | |
| 2015/0249053 A1 | 9/2015 | Or-Bach | |
| 2019/0067453 A1 * | 2/2019 | Torek | H10D 84/83 |
| 2019/0237581 A1 * | 8/2019 | Saito | H10D 30/031 |
| 2019/0296155 A1 | 9/2019 | Sawabe et al. | |
| 2019/0305085 A1 | 10/2019 | Sung et al. | |
| 2020/0013892 A1 | 1/2020 | Kataoka et al. | |
| 2020/0303554 A1 | 9/2020 | Sawabe et al. | |
| 2020/0402994 A1 | 12/2020 | Yang et al. | |
| 2021/0082921 A1 | 3/2021 | Wada et al. | |
| 2022/0399497 A1 * | 12/2022 | Bégon-Lours | H10N 70/068 |

FOREIGN PATENT DOCUMENTS

| | | |
|---|---|---|
| JP | 2020-009911 A | 1/2020 |
| JP | 2020-155495 A | 9/2020 |
| JP | 2021-044526 A | 3/2021 |

* cited by examiner

DD' CROSS SECTION

SEMICONDUCTOR DEVICE AND SEMICONDUCTOR MEMORY DEVICE EACH HAVING PORTIONS OF OXIDE SEMICONDUCTOR BETWEEN GATE INSULATING LAYER AND ELECTRODES

This application is based upon and claims the benefit of priority from Japanese Patent Application No. 2021-205699, filed on Dec. 20, 2021, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent characteristic in that a channel leakage current during off operation, that is, an off-leakage current is very small. In order to apply the oxide semiconductor transistor to a switching transistor of a memory device, it is desired to reduce the on-resistance.

DETAILED DESCRIPTION

Figure 1:
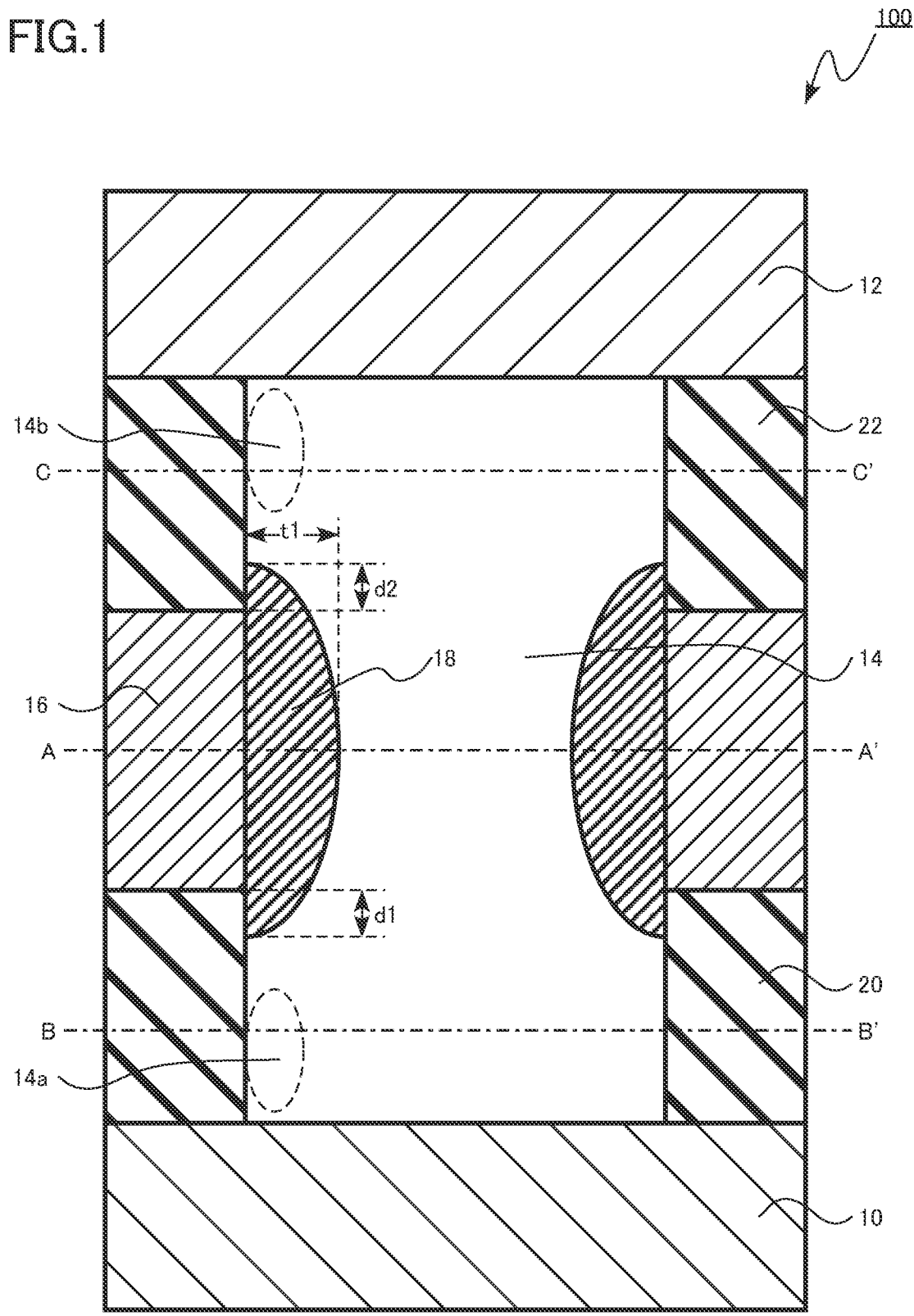
FIG. 1 is a schematic cross-sectional view of a semiconductor device according to a first embodiment.

A semiconductor device of embodiments includes: a first electrode; a second electrode; an oxide semiconductor layer provided between the first electrode and the second electrode; a gate electrode surrounding at least a part of the oxide semiconductor layer; a gate insulating layer, at least a part of the gate insulating layer provided between the gate electrode and the oxide semiconductor layer; a first insulating layer provided between the first electrode and the gate electrode; and a second insulating layer provided between the second electrode and the gate electrode, wherein, in a cross section parallel to a first direction from the first electrode to the second electrode and including the oxide semiconductor layer, a direction connecting a first end of an interface between the first electrode and the first insulating layer on a side of the oxide semiconductor layer and a second end of an interface between the second electrode and the second insulating layer on the side of the oxide semiconductor layer is defined as a second direction, in the cross section, a first portion of the oxide semiconductor layer is provided between the gate insulating layer and the first electrode in the second direction, and in the cross section, a second portion of the oxide semiconductor layer is provided between the gate insulating layer and the second electrode in the second direction.

Hereinafter, embodiments will be described with reference to the diagrams. In addition, in the following description, the same or similar members and the like are denoted by the same reference numerals, and the description of the members and the like once described will be omitted as appropriate.

In addition, in this specification, the term "upper" or "lower" may be used for convenience. "upper" or "lower" is a term indicating the relative positional relationship in the diagram, but is not a term that defines the positional relationship with respect to gravity.

The qualitative analysis and quantitative analysis of the chemical composition of members configuring the semiconductor device and the semiconductor memory device in this specification can be performed by, for example, secondary ion mass spectrometry (SIMS), energy dispersive X-ray spectroscopy (EDX), and Rutherford back-scattering spectroscopy (RBS). In addition, the thickness of each of the members configuring the semiconductor device and the semiconductor memory device, a distance between the members, and the like can be measured by using, for example, a transmission electron microscope (TEM).

First Embodiment

A semiconductor device according to a first embodiment includes: a first electrode; a second electrode; an oxide semiconductor layer provided between the first electrode and the second electrode; a gate electrode surrounding at least a part of the oxide semiconductor layer; a gate insulating layer at least a part of which is provided between the gate electrode and the oxide semiconductor layer; a first insulating layer provided between the first electrode and the gate electrode; and a second insulating layer provided between the second electrode and the gate electrode. In a cross section parallel to a first direction from the first electrode to the second electrode and including the oxide semiconductor layer, a direction connecting a first end of an interface between the first electrode and the first insulating layer on a side of the oxide semiconductor layer and a second end of an interface between the second electrode and the second insulating layer on the side of the oxide semiconductor layer is defined as a second direction. In the cross section, a first portion of the oxide semiconductor layer is provided between the gate insulating layer and the first electrode in the second direction. In the cross section, a second portion of the oxide semiconductor layer is provided between the gate insulating layer and the second electrode in the second direction.

Figure 2:
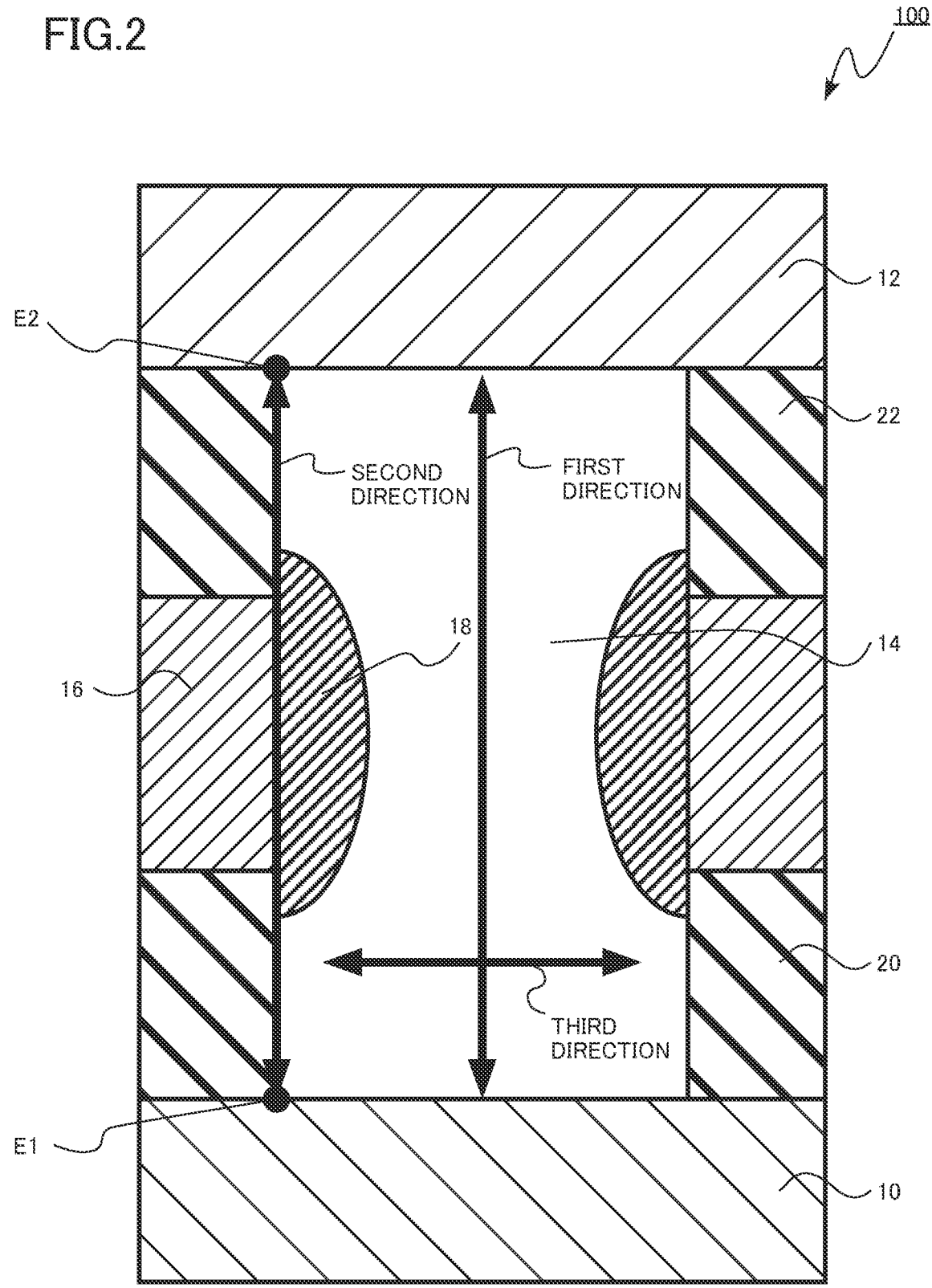
FIG. 2 is a schematic cross-sectional view of the semiconductor device according to the first embodiment.
Figure 3:
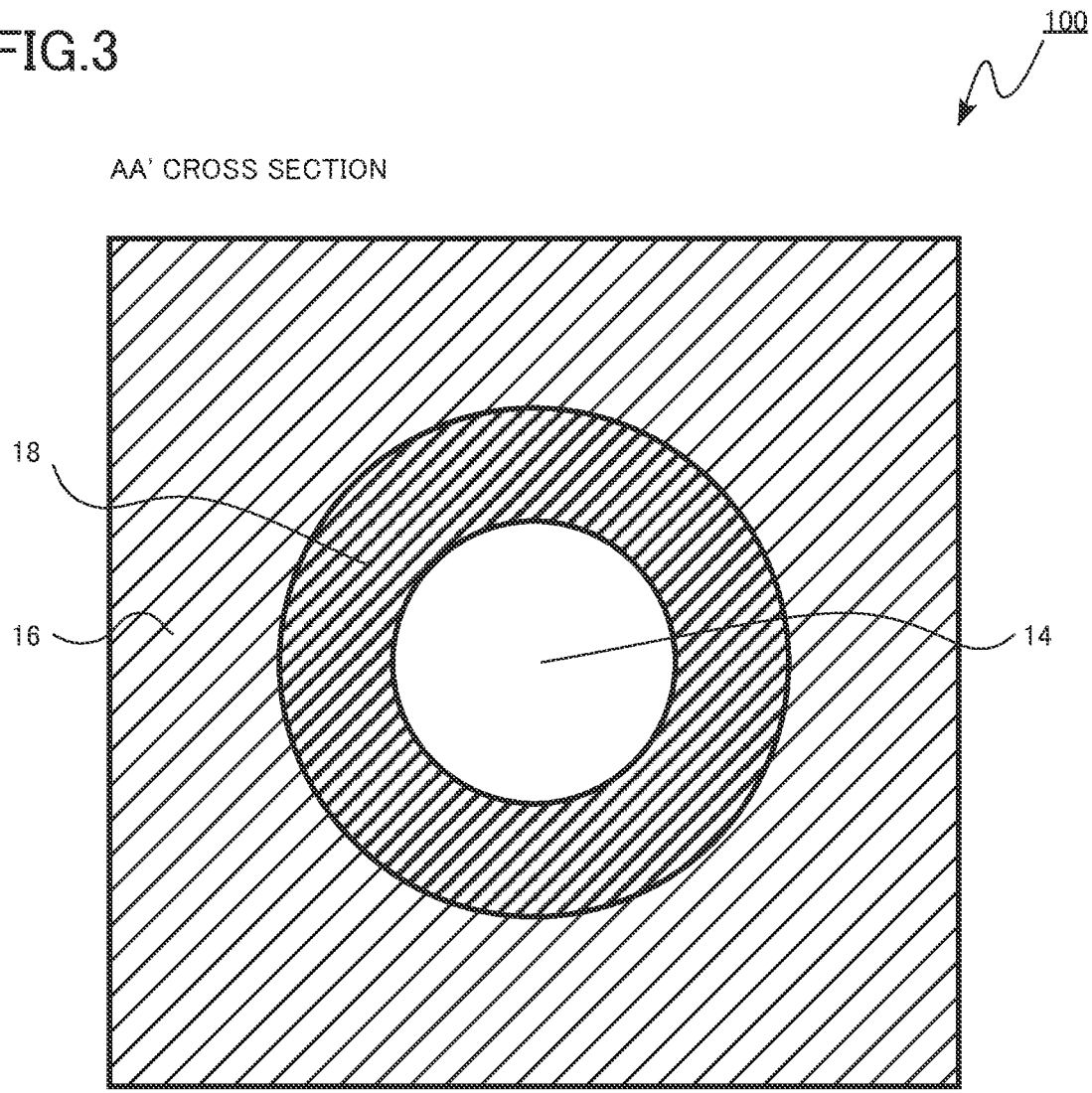
FIG. 3 is a schematic cross-sectional view of the semiconductor device according to the first embodiment.
Figure 4:
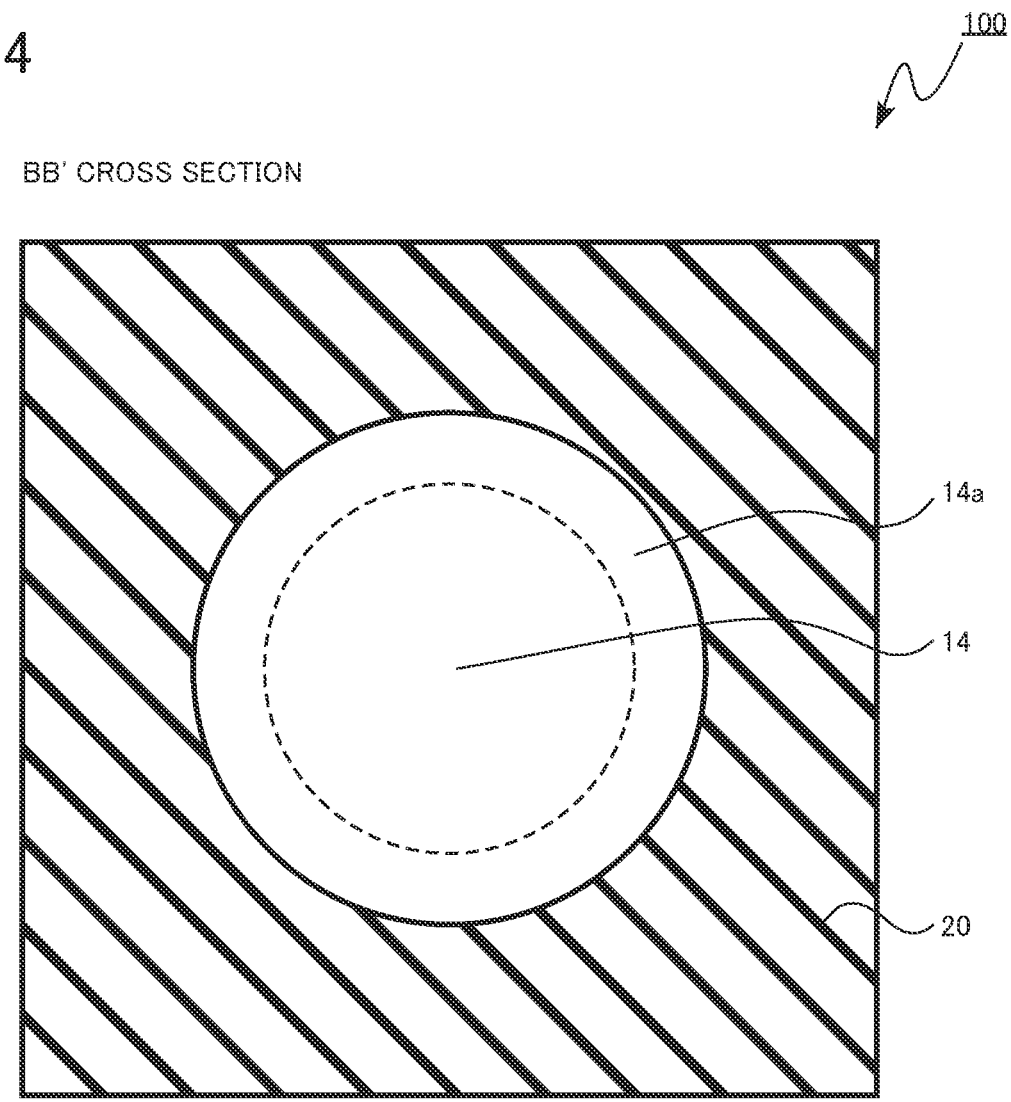
FIG. 4 is a schematic cross-sectional view of the semiconductor device according to the first embodiment.
Figure 5:
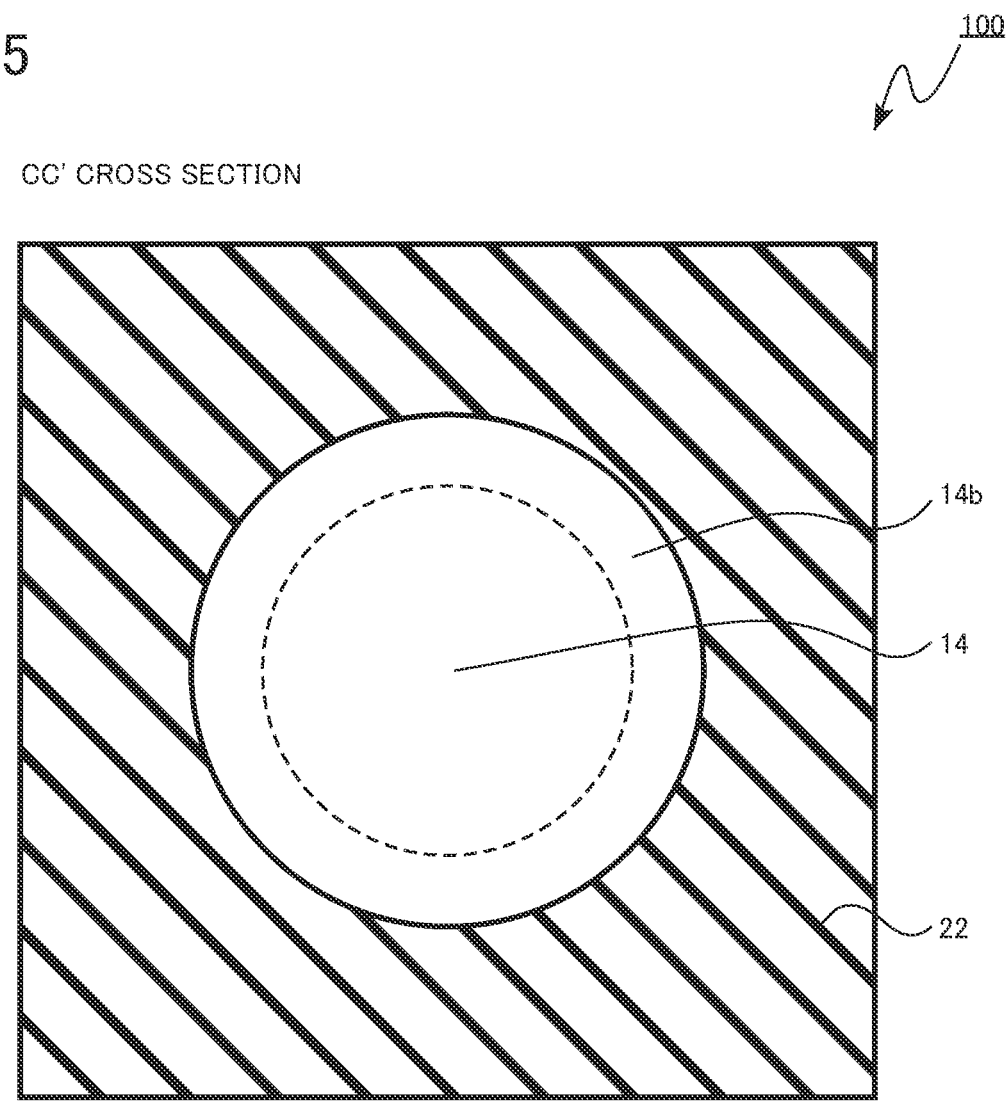
FIG. 5 is a schematic cross-sectional view of the semiconductor device according to the first embodiment.

FIGS. 1 to 5 are schematic cross-sectional views of the semiconductor device according to the first embodiment. FIG. 2 is an explanatory diagram of a first direction and a second direction. FIG. 3 is a cross-sectional view taken along the line AA' of FIG. 1. FIG. 4 is a cross-sectional view taken along the line BB' of FIG. 1. FIG. 5 is a cross-sectional view taken along the line CC' of FIG. 1.

The semiconductor device according to the first embodiment is a transistor 100. The transistor 100 is an oxide semiconductor transistor in which a channel is formed in the oxide semiconductor. The gate electrode of the transistor 100 is provided so as to surround the oxide semiconductor in which the channel is formed. The transistor 100 is a so-called surrounding gate transistor (SGT). The transistor 100 is a so-called vertical transistor.

The transistor 100 includes a lower electrode 10, an upper electrode 12, an oxide semiconductor layer 14, a gate electrode 16, a gate insulating layer 18, a first interlayer insulating layer 20, and a second interlayer insulating layer 22. The oxide semiconductor layer 14 includes a first portion 14a and a second portion 14b.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

As shown in FIG. 2, a direction from the lower electrode 10 to the upper electrode 12 is defined as the first direction. In addition, in a cross section parallel to the first direction and including the oxide semiconductor layer 14, a direction connecting a first end (E1 in FIG. 2) of the interface between the lower electrode 10 and the first interlayer insulating layer 20 on the oxide semiconductor layer 14 side and a second end (E2 in FIG. 2) of the interface between the upper electrode 12 and the second interlayer insulating layer 22 on the oxide semiconductor layer 14 side is defined as the second direction. In addition, in the cross section parallel to the first direction and including the oxide semiconductor layer 14, a direction perpendicular to the first direction is defined as a third direction.

In FIG. 2, the second direction is the same as the first direction.

The lower electrode 10 functions as a source electrode or a drain electrode of the transistor 100.

The lower electrode 10 is a conductor. The lower electrode 10 contains, for example, an oxide conductor or a metal. The lower electrode 10 is, for example, a metal, a metal nitride, or a metal oxide.

The lower electrode 10 is, for example, an oxide conductor containing oxygen (O) and at least one element selected from the group consisting of indium (In), tin (Sn), zinc (Zn), and titanium (Ti). For example, the lower electrode 10 is an oxide conductor containing indium (In), tin (Sn), and oxygen (O). The lower electrode 10 is, for example, an indium tin oxide. For example, the lower electrode 10 is a metal containing tungsten (W), molybdenum (Mo), copper (Cu), aluminum (Al), titanium (Ti), or tantalum (Ta).

The lower electrode 10 may have, for example, a stacked structure of a plurality of conductors.

The upper electrode 12 functions as a source electrode or a drain electrode of the transistor 100.

The upper electrode 12 is a conductor. The upper electrode 12 contains, for example, an oxide conductor or a metal. The upper electrode 12 is, for example, a metal, a metal nitride, or a metal oxide.

The upper electrode 12 is, for example, an oxide conductor containing oxygen (O) and at least one element selected from the group consisting of indium (In), tin (Sn), zinc (Zn), and titanium (Ti). For example, the upper electrode 12 is an oxide conductor containing indium (In), tin (Sn), and oxygen (O). The upper electrode 12 is, for example, an indium tin oxide. For example, the upper electrode 12 is a metal containing tungsten (W), molybdenum (Mo), copper (Cu), aluminum (Al), titanium (Ti), or tantalum (Ta).

The upper electrode 12 may have, for example, a stacked structure of a plurality of conductors.

For example, the lower electrode 10 and the upper electrode 12 are formed of the same material. For example, the lower electrode 10 and the upper electrode 12 are oxide conductors containing oxygen (O) and at least one element selected from the group consisting of indium (In), tin (Sn), zinc (Zn), and titanium (Ti). For example, the lower electrode 10 and the upper electrode 12 are oxide conductors containing indium (In), tin (Sn), and oxygen (O).

The oxide semiconductor layer 14 is provided between the lower electrode 10 and the upper electrode 12. The oxide semiconductor layer 14 is in contact with, for example, the lower electrode 10. The oxide semiconductor layer 14 is in contact with, for example, the upper electrode 12.

A channel serving as a current path is formed in the oxide semiconductor layer 14 when the transistor 100 is turned on.

The oxide semiconductor layer 14 is an oxide semiconductor. The oxide semiconductor layer 14 is, for example, amorphous.

The oxide semiconductor layer 14 contains, for example, zinc (Zn) and at least one element selected from the group consisting of indium (In), gallium (Ga), and aluminum (Al).

The oxide semiconductor layer 14 includes, for example, oxygen vacancies. The oxygen vacancies in the oxide semiconductor layer 14 function as donors.

The length of the oxide semiconductor layer 14 in the first direction is, for example, equal to or more than 80 nm and equal to or less than 200 nm. The width of the oxide semiconductor layer 14 in the third direction is, for example, equal to or more than 20 nm and equal to or less than 100 nm.

As shown in FIG. 3, the gate electrode 16 is provided so as to surround the oxide semiconductor layer 14. The gate electrode 16 surrounds at least a part of the oxide semiconductor layer 14. The gate electrode 16 is provided around the oxide semiconductor layer 14.

The gate electrode 16 includes, for example, a metal, a metal compound, or a semiconductor. The gate electrode 16 includes, for example, tungsten (W). The length of the gate electrode 16 in the second direction is, for example, equal to or more than 20 nm and equal to or less than 100 nm. The length of the gate electrode 16 in the second direction is the gate length of the transistor 100.

The gate electrode 16 is, for example, a metal, a metal compound, or a semiconductor. The gate electrode 16 is, for example, tungsten (W).

The gate insulating layer 18 is provided between the gate electrode 16 and the oxide semiconductor layer 14. At least a part of the gate insulating layer 18 is provided between the gate electrode 16 and the oxide semiconductor layer 14. The gate insulating layer 18 is provided so as to surround the oxide semiconductor layer 14.

The gate insulating layer 18 is not provided between the first interlayer insulating layer 20 and the oxide semiconductor layer 14. The gate insulating layer 18 is not provided between the second interlayer insulating layer 22 and the oxide semiconductor layer 14.

The gate insulating layer 18 has, for example, a plano-convex shape in a cross section parallel to the first direction and including the oxide semiconductor layer 14. The gate insulating layer 18 has, for example, a flat surface on the gate electrode 16 side and a convex surface on the oxide semiconductor layer 14 side.

The gate insulating layer 18 contains, for example, oxide, nitride, or oxynitride. The gate insulating layer 18 contains, for example, silicon oxide, silicon nitride, silicon oxynitride, or aluminum oxide. The gate insulating layer 18 is, for example, a silicon oxide layer, a silicon nitride layer, a silicon oxynitride layer, or an aluminum oxide layer. The thickness (t1 in FIG. 1) of the gate insulating layer 18 in a direction perpendicular to the second direction is, for example, equal to or more than 3 nm and equal to or less than 10 nm.

The length (d1 in FIG. 1) of the interface between the gate insulating layer 18 and the first interlayer insulating layer 20 in the second direction is smaller than, for example, the thickness (t1 in FIG. 1) of the gate insulating layer 18 in the direction perpendicular to the second direction. In addition, the length (d2 in FIG. 1) of the interface between the gate insulating layer 18 and the second interlayer insulating layer 22 in the second direction is smaller than, for example, the thickness (t1 in FIG. 1) of the gate insulating layer 18 in the direction perpendicular to the second direction. Here, the thickness (t1 in FIG. 1) of the gate insulating layer 18 in the direction perpendicular to the second direction is, for example, a maximum thickness in the direction perpendicular to the second direction.

The first portion 14a of the oxide semiconductor layer 14 is provided between the gate insulating layer 18 and the lower electrode 10 in the second direction. The first portion 14a is in contact with, for example, the first interlayer insulating layer 20.

The second portion 14b of the oxide semiconductor layer 14 is provided between the gate insulating layer 18 and the upper electrode 12 in the second direction. The second portion 14b is in contact with, for example, the second interlayer insulating layer 22.

The first interlayer insulating layer 20 is provided between the lower electrode 10 and the gate electrode 16. The first interlayer insulating layer 20 is provided around the oxide semiconductor layer 14.

The first interlayer insulating layer 20 is, for example, an oxide, a nitride, or an oxynitride. The first interlayer insulating layer 20 is, for example, a silicon oxide.

The second interlayer insulating layer 22 is provided between the upper electrode 12 and the gate electrode 16. The second interlayer insulating layer 22 is provided around the oxide semiconductor layer 14.

The second interlayer insulating layer 22 is, for example, an oxide, a nitride, or an oxynitride. The second interlayer insulating layer 22 is, for example, a silicon oxide.

Next, an example of a semiconductor device manufacturing method according to the first embodiment will be described.

FIGS. 6 to 11 are schematic cross-sectional views showing a semiconductor device manufacturing method according to the first embodiment. FIGS. 6 to 11 are cross sections corresponding to FIG. 1.

Figure 6:
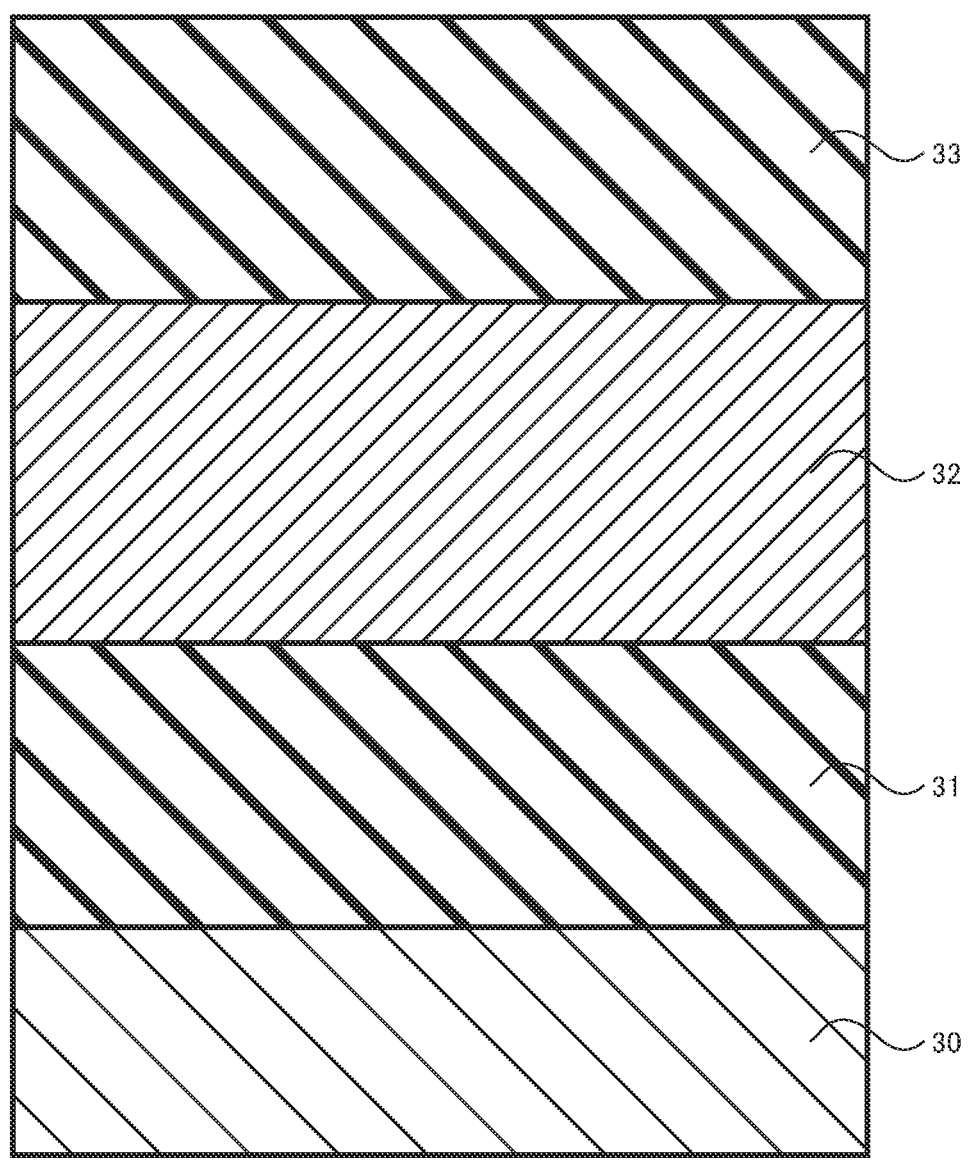
FIG. 6 is a schematic cross-sectional view showing a semiconductor device manufacturing method according to the first embodiment.

First, a first indium tin oxide film 30, a first silicon oxide film 31, a tungsten film 32, and a second silicon oxide film 33 are formed in this order (FIG. 6). The first indium tin oxide film 30, the first silicon oxide film 31, the tungsten film 32, and the second silicon oxide film 33 are formed by using, for example, a chemical vapor deposition method (CVD method).

Figure 7:
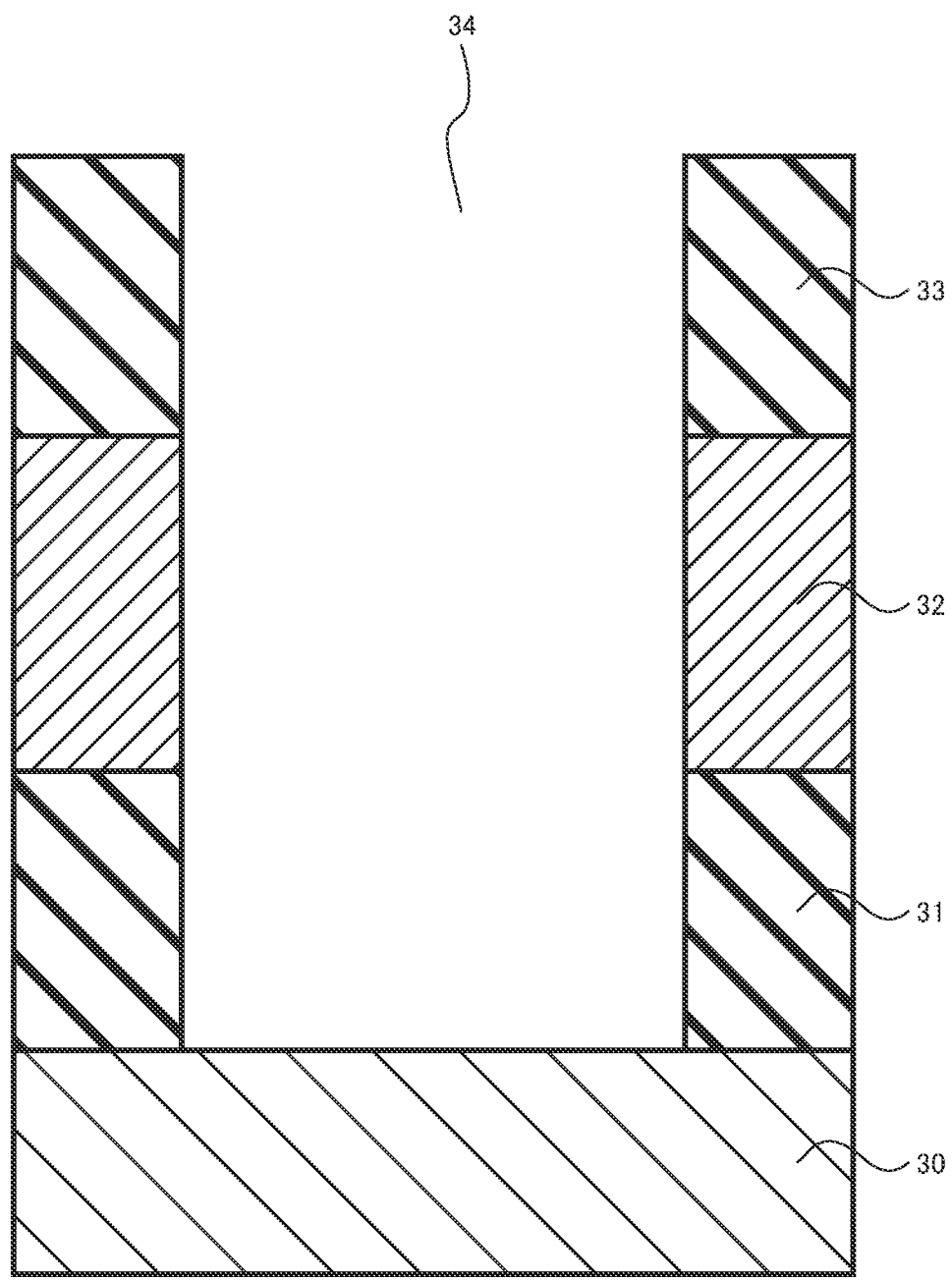
FIG. 7 is a schematic cross-sectional view showing the semiconductor device manufacturing method according to the first embodiment.

Then, an opening 34 reaching the first indium tin oxide film 30 is formed from the surface of the second silicon oxide film 33 (FIG. 7). The opening 34 is formed by using, for example, a lithography method and a reactive ion etching method (RIE method).

Figure 8:
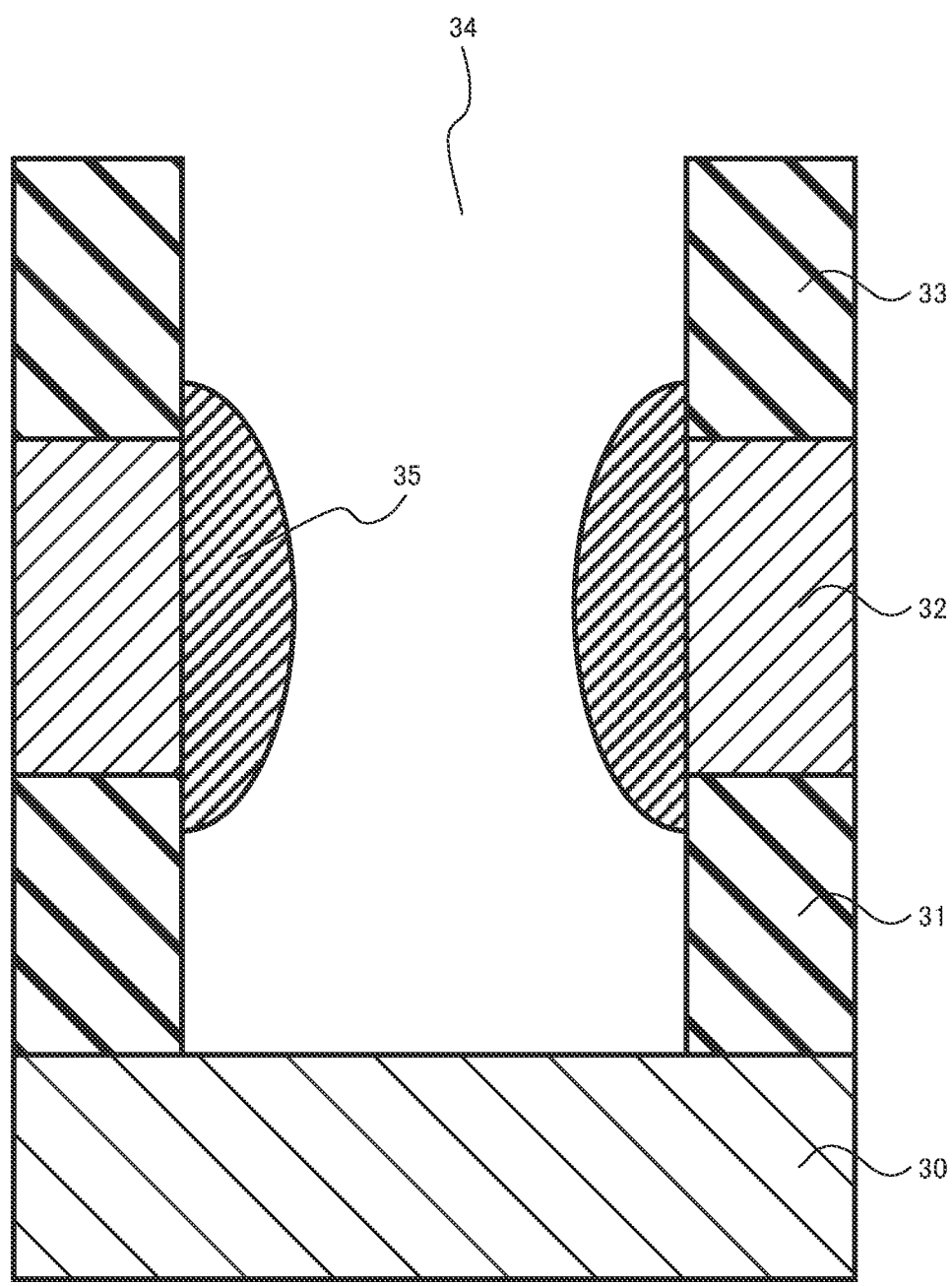
FIG. 8 is a schematic cross-sectional view showing the semiconductor device manufacturing method according to the first embodiment.

Then, a silicon nitride film 35 is selectively formed on the surface of the tungsten film 32 exposed on the inner surface of the opening 34 (FIG. 8).

Figure 9:
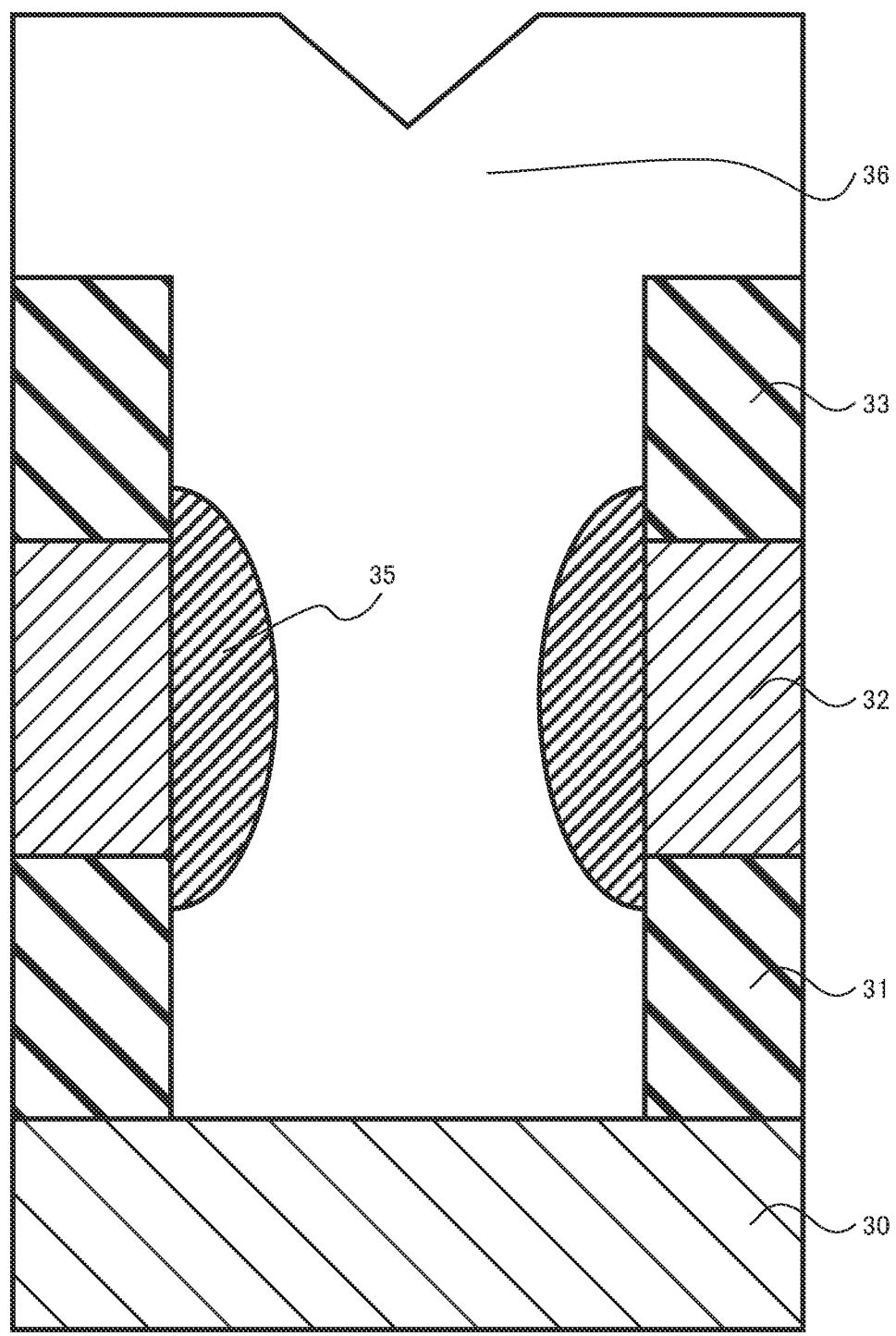
FIG. 9 is a schematic cross-sectional view showing the semiconductor device manufacturing method according to the first embodiment.

Then, the opening 34 is buried with the oxide semiconductor film 36 (FIG. 9). The oxide semiconductor film 36 contains, for example, indium (In), gallium (Ga), and zinc (Zn). The oxide semiconductor film 36 is formed by using, for example, a CVD method.

Figure 10:
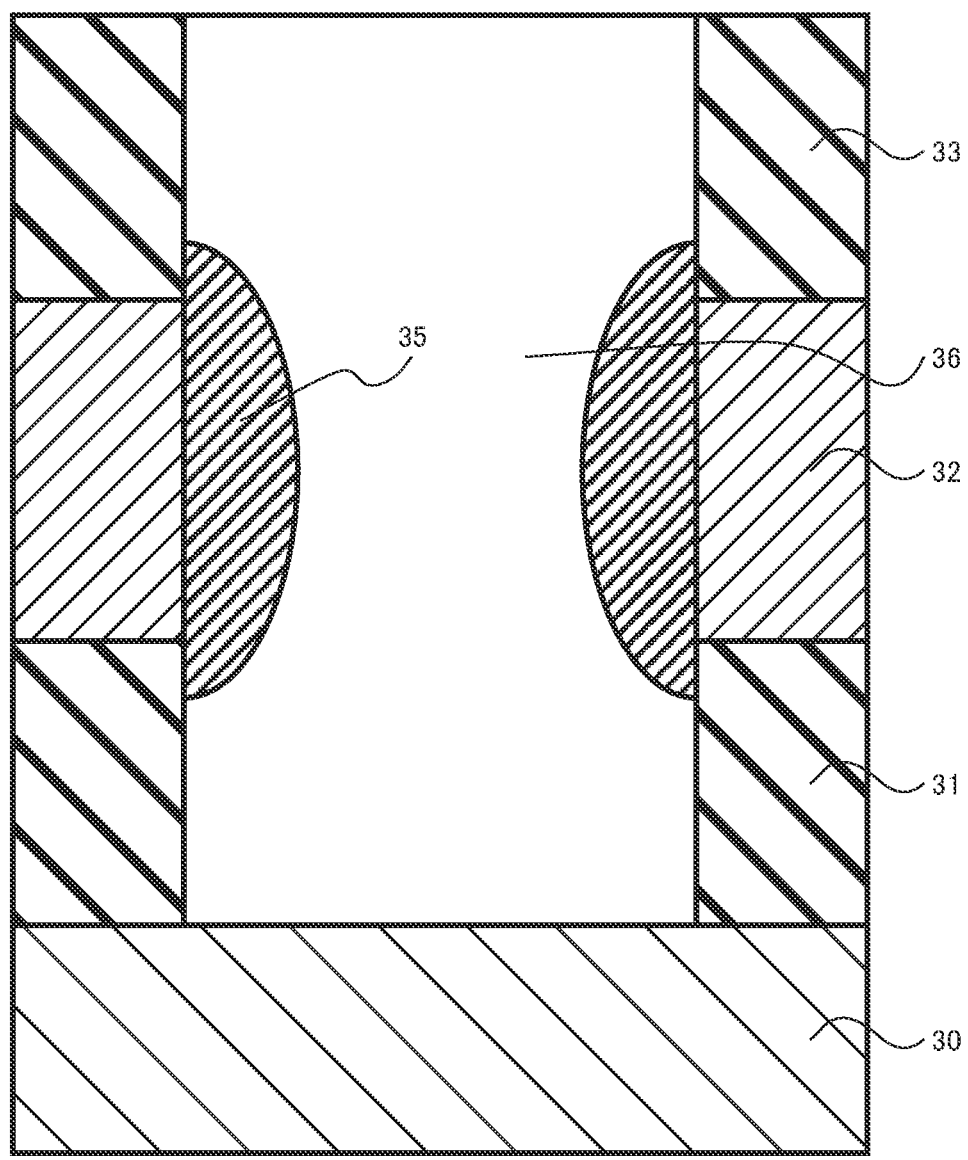
FIG. 10 is a schematic cross-sectional view showing the semiconductor device manufacturing method according to the first embodiment.

Then, an upper portion of the oxide semiconductor film 36 is removed to expose the surface of the second silicon oxide film 33 (FIG. 10). For example, the oxide semiconductor film 36 is removed by etching using an RIE method.

Figure 11:
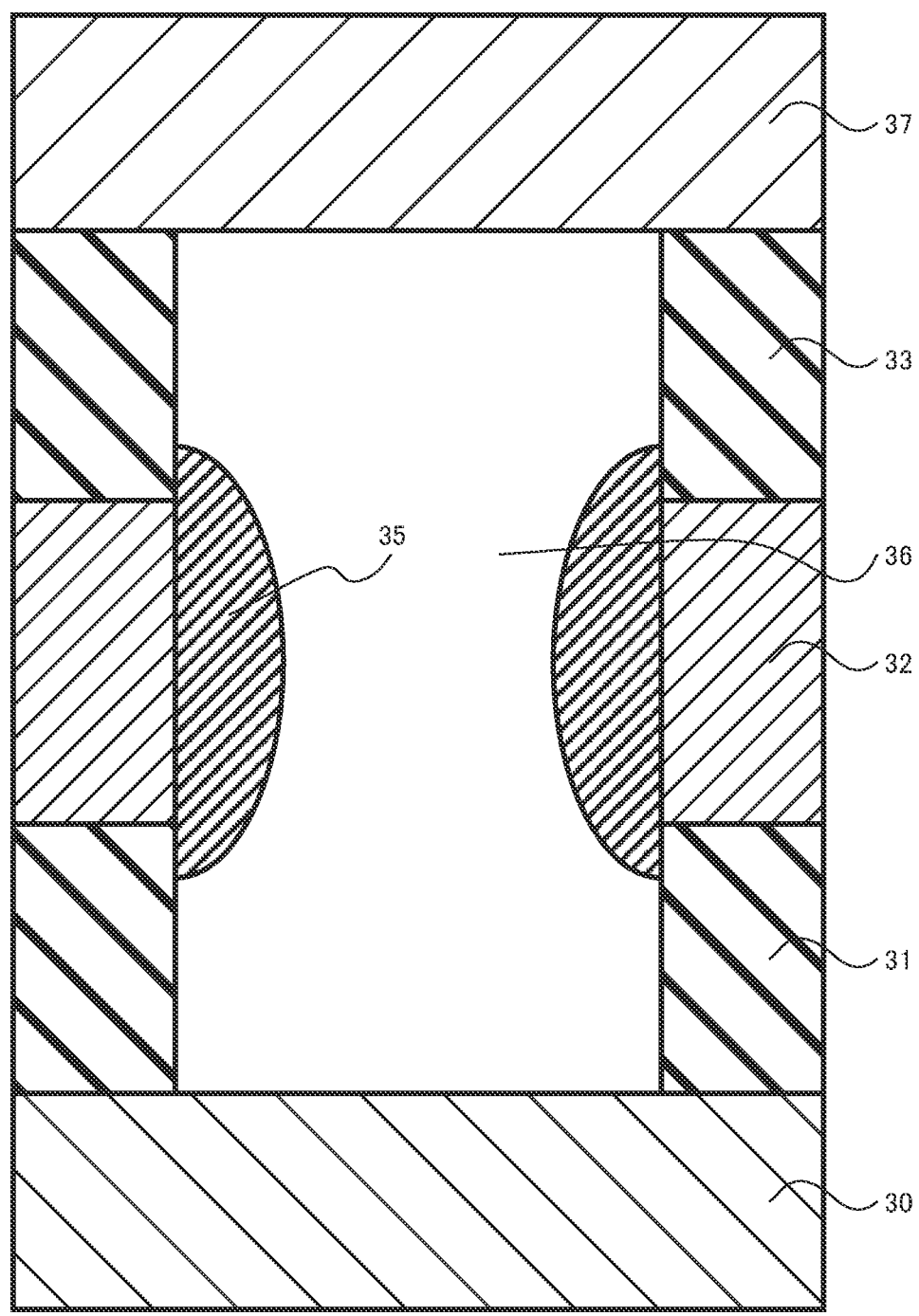
FIG. 11 is a schematic cross-sectional view showing the semiconductor device manufacturing method according to the first embodiment.

Then, a second indium tin oxide film 37 is formed (FIG. 11). The second indium tin oxide film 37 is formed by using, for example, a CVD method.

By the manufacturing method as described above, the transistor 100 shown in FIG. 1 is formed.

Next, the function and effect of the semiconductor device according to the first embodiment will be described.

Figure 12:
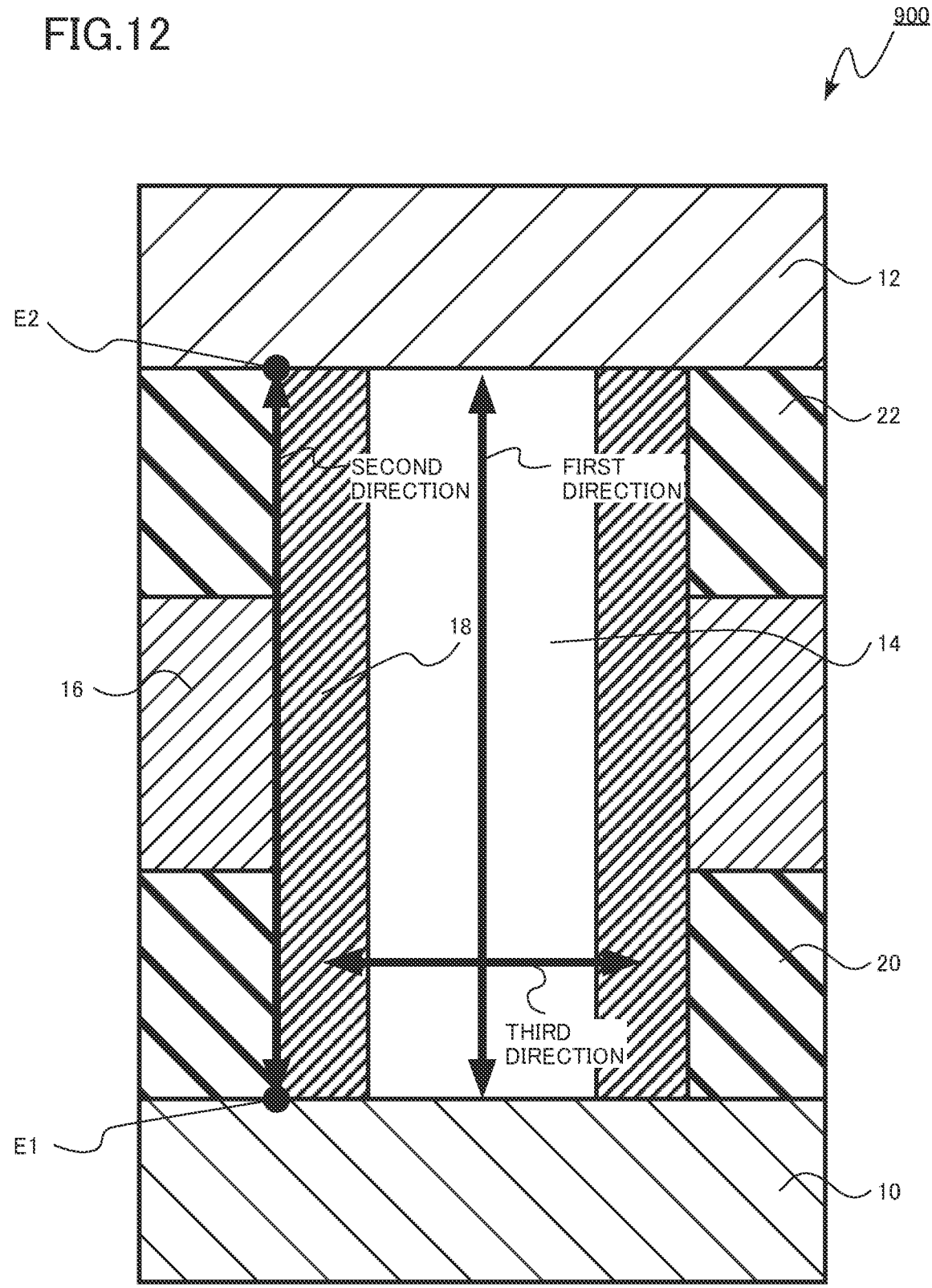
FIG. 12 is a schematic cross-sectional view of a semiconductor device of a comparative example.

FIG. 12 is a schematic cross-sectional view of a semiconductor device of a comparative example. The semiconductor device of the comparative example is a transistor 900. The transistor 900 is an oxide semiconductor transistor in which a channel is formed in the oxide semiconductor. The gate electrode of the transistor 900 is provided so as to surround the oxide semiconductor in which the channel is formed. The transistor 900 is a so-called SGT. The transistor 900 is a so-called vertical transistor.

The transistor 900 is different from the transistor 100 according to the first embodiment in that a part of the oxide semiconductor layer 14 is not provided between the gate insulating layer 18 and the lower electrode 10 in the second direction. In addition, the transistor 900 is different from the transistor 100 in that a part of the oxide semiconductor layer 14 is not provided between the gate insulating layer 18 and the upper electrode 12 in the second direction.

The transistor 100 has the first portion 14a of the oxide semiconductor layer 14 between the gate insulating layer 18 and the lower electrode 10. For this reason, the contact area between the oxide semiconductor layer 14 and the lower electrode 10 of the transistor 100 is larger than the contact area between the oxide semiconductor layer 14 and the lower electrode 10 of the transistor 900. Therefore, the contact resistance between the oxide semiconductor layer 14 and the lower electrode 10 of the transistor 100 is smaller than the contact resistance between the oxide semiconductor layer 14 and the lower electrode 10 of the transistor 900.

Similarly, the transistor 100 has the second portion 14b of the oxide semiconductor layer 14 between the gate insulating layer 18 and the upper electrode 12. For this reason, the contact area between the oxide semiconductor layer 14 and the upper electrode 12 of the transistor 100 is larger than the contact area between the oxide semiconductor layer 14 and the upper electrode 12 of the transistor 900. Therefore, the contact resistance between the oxide semiconductor layer 14 and the upper electrode 12 of the transistor 100 is smaller than the contact resistance between the oxide semiconductor layer 14 and the upper electrode 12 of the transistor 900.

By reducing the contact resistance between the oxide semiconductor layer 14 and the lower electrode 10 and the contact resistance between the oxide semiconductor layer 14 and the upper electrode 12, the parasitic resistance of the transistor 100 is reduced and accordingly, the on-resistance of the transistor 100 is reduced.

For example, in the transistor 900, it is conceivable to increase the contact area between the oxide semiconductor layer 14 and the lower electrode 10 and the contact area between the oxide semiconductor layer 14 and the upper electrode 12 and reduce the contact resistance between the oxide semiconductor layer 14 and the lower electrode 10 and the contact resistance between the oxide semiconductor layer 14 and the upper electrode 12 by reducing the thickness of the gate insulating layer 18.

In this case, the diffusion of oxygen from the oxide semiconductor layer 14 to the gate electrode 16 through the gate insulating layer 18 is promoted by making the gate insulating layer 18 thin. When oxygen diffuses to increase the number of oxygen vacancies of the oxide semiconductor layer 14, for example, the threshold voltage of the transistor decreases, which causes a problem.

In the transistor 100 according to the first embodiment, the thickness of the gate insulating layer 18 between the gate electrode 16 and the oxide semiconductor layer 14 is larger than that in the transistor 900 of the comparative example. Therefore, a decrease in the threshold voltage of the transistor due to the increase in the number of oxygen vacancies of the oxide semiconductor layer 14 does not occur.

In addition, since the transistor 100 according to the first embodiment has the first portion 14a, the distance between the side surface of the gate electrode 16 and the oxide semiconductor layer 14 facing the first interlayer insulating layer 20 is shorter than that in the transistor 900. Therefore, by the fringe electric field of the gate electrode 16, the storage or inversion of electrons in the oxide semiconductor layer 14 facing the first interlayer insulating layer 20 is promoted as compared with the transistor 900. As a result, the resistance of the oxide semiconductor layer 14 facing the first interlayer insulating layer 20 is lower than that in the transistor 900.

Similarly, since the transistor 100 according to the first embodiment has the second portion 14b, the distance between the side surface of the gate electrode 16 and the oxide semiconductor layer 14 facing the second interlayer insulating layer 22 is shorter than that in the transistor 900. Therefore, by the fringe electric field of the gate electrode 16, the storage or inversion of electrons in the oxide semiconductor layer 14 facing the second interlayer insulating layer 22 is promoted as compared with the transistor 900. As a result, the resistance of the oxide semiconductor layer 14 facing the second interlayer insulating layer 22 is lower than that in the transistor 900.

By reducing the resistance of the oxide semiconductor layer 14 facing the first interlayer insulating layer 20 and the resistance of the oxide semiconductor layer 14 facing the second interlayer insulating layer 22, the parasitic resistance of the transistor 100 is reduced and accordingly, the on-resistance of the transistor 100 is reduced.

As described above, in the transistor 100 according to the first embodiment, the parasitic resistance is reduced and accordingly, the on-resistance is reduced.

It is preferable that the gate insulating layer 18 has a plano-convex shape in a cross section parallel to the first direction and including the oxide semiconductor layer 14. Since the interface between the oxide semiconductor layer 14 and the gate insulating layer 18 has a curved shape without corners, the resistance uniformity in the channel region formed in the oxide semiconductor layer 14 is increased when the transistor 100 is turned on. Therefore, for example, the variation in the on-resistance of the transistor 100 is reduced.

First Modification Example

Figure 13:
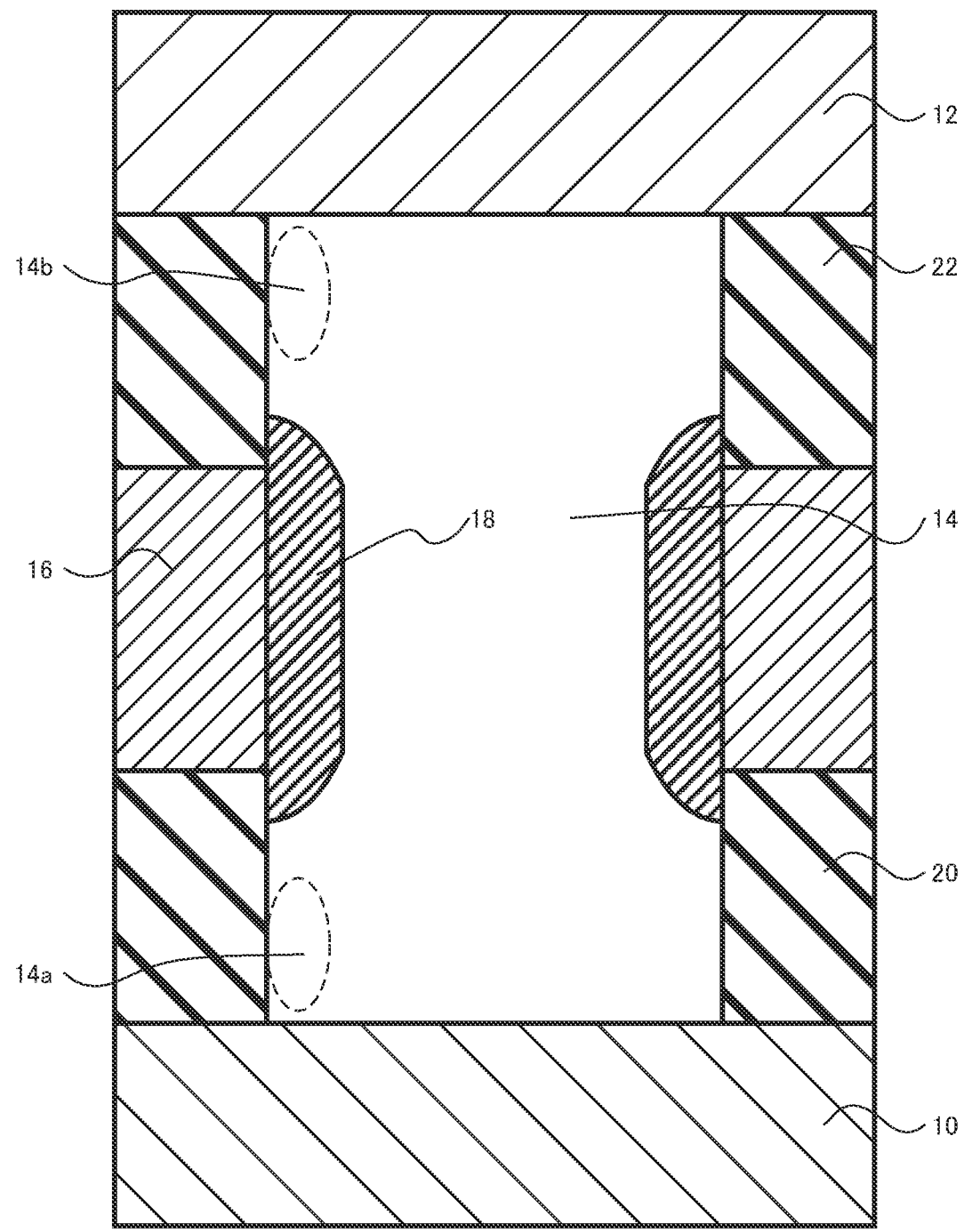
FIG. 13 is a schematic cross-sectional view of a semiconductor device of a first modification example of the first embodiment.

FIG. 13 is a schematic cross-sectional view of a semiconductor device of a first modification example of the first embodiment. FIG. 13 is a diagram corresponding to FIG. 1 of the first embodiment.

The transistor of the first modification example of the first embodiment is different from the transistor 100 according to the first embodiment in that the central portion of the interface between the gate insulating layer 18 and the oxide semiconductor layer 14 has a linear shape in a cross section parallel to the first direction and including the oxide semiconductor layer 14.

According to the transistor of the first modification example, for example, the variation in the threshold voltage of the transistor is reduced by increasing the region where the thickness of the gate insulating layer 18 is constant.

Second Modification Example

Figure 14:
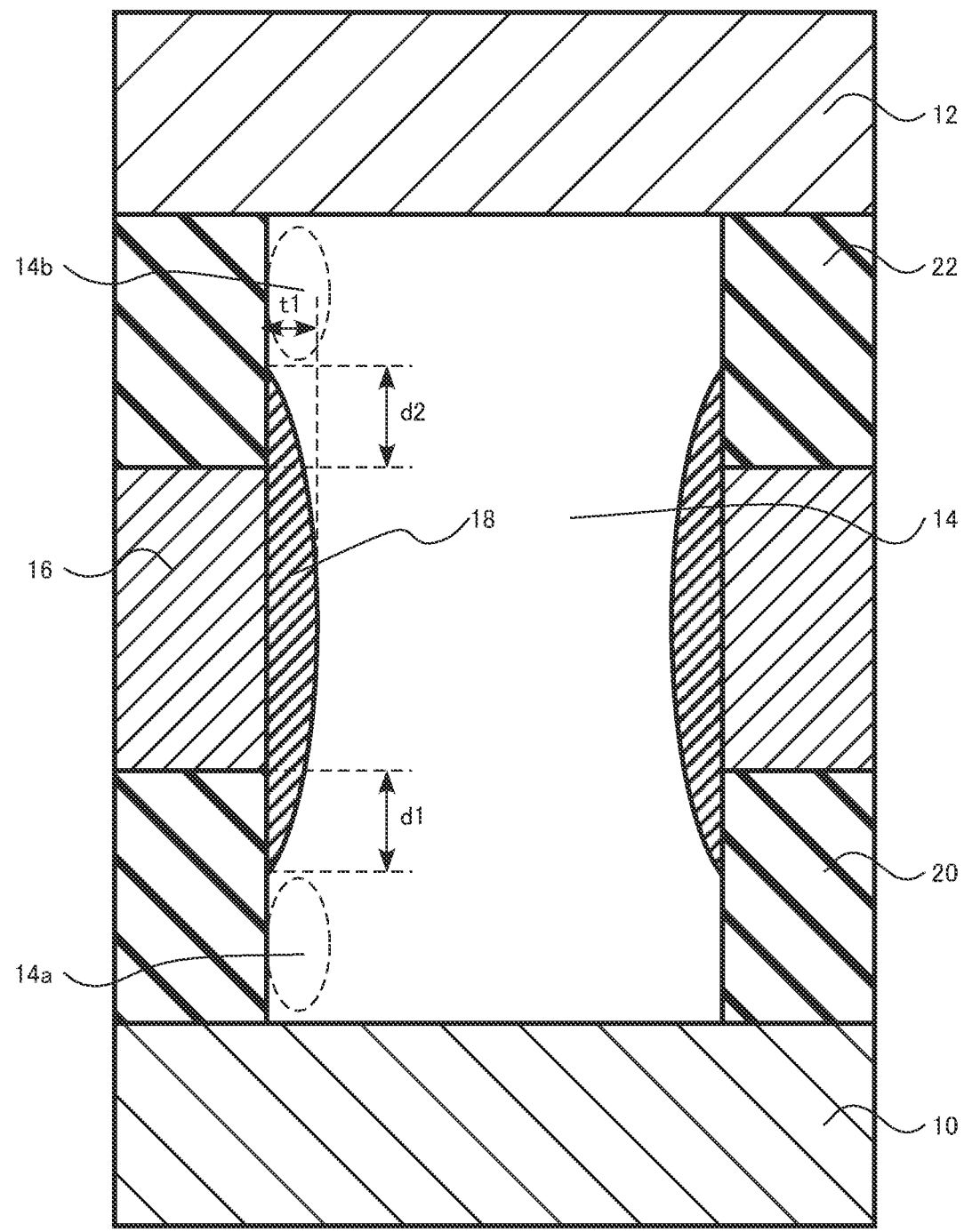
FIG. 14 is a schematic cross-sectional view of a semiconductor device of a second modification example of the first embodiment.

FIG. 14 is a schematic cross-sectional view of a semiconductor device of a second modification example of the first embodiment. FIG. 14 is a diagram corresponding to FIG. 1 of the first embodiment.

The transistor of the second modification example of the first embodiment is different from the transistor 100 according to the first embodiment in that the length (d1 in FIG. 14) of the interface between the gate insulating layer 18 and the first interlayer insulating layer 20 in the second direction is larger than the thickness (t1 in FIG. 14) of the gate insulating layer 18 in the direction perpendicular to the second direction. In addition, the transistor of the second modification example of the first embodiment is different from the transistor 100 according to the first embodiment in that the length (d2 in FIG. 14) of the interface between the gate insulating layer 18 and the second interlayer insulating layer 22 in the second direction is larger than the thickness (t1 in FIG. 14) of the gate insulating layer 18 in the direction perpendicular to the second direction. Here, the thickness (t1 in FIG. 14) of the gate insulating layer 18 in the direction perpendicular to the second direction is, for example, a maximum thickness in the direction perpendicular to the second direction.

According to the transistor of the second modification example, for example, the effective gate length increases. Therefore, the short channel effect of the transistor can be suppressed.

Third Modification Example

Figure 15:
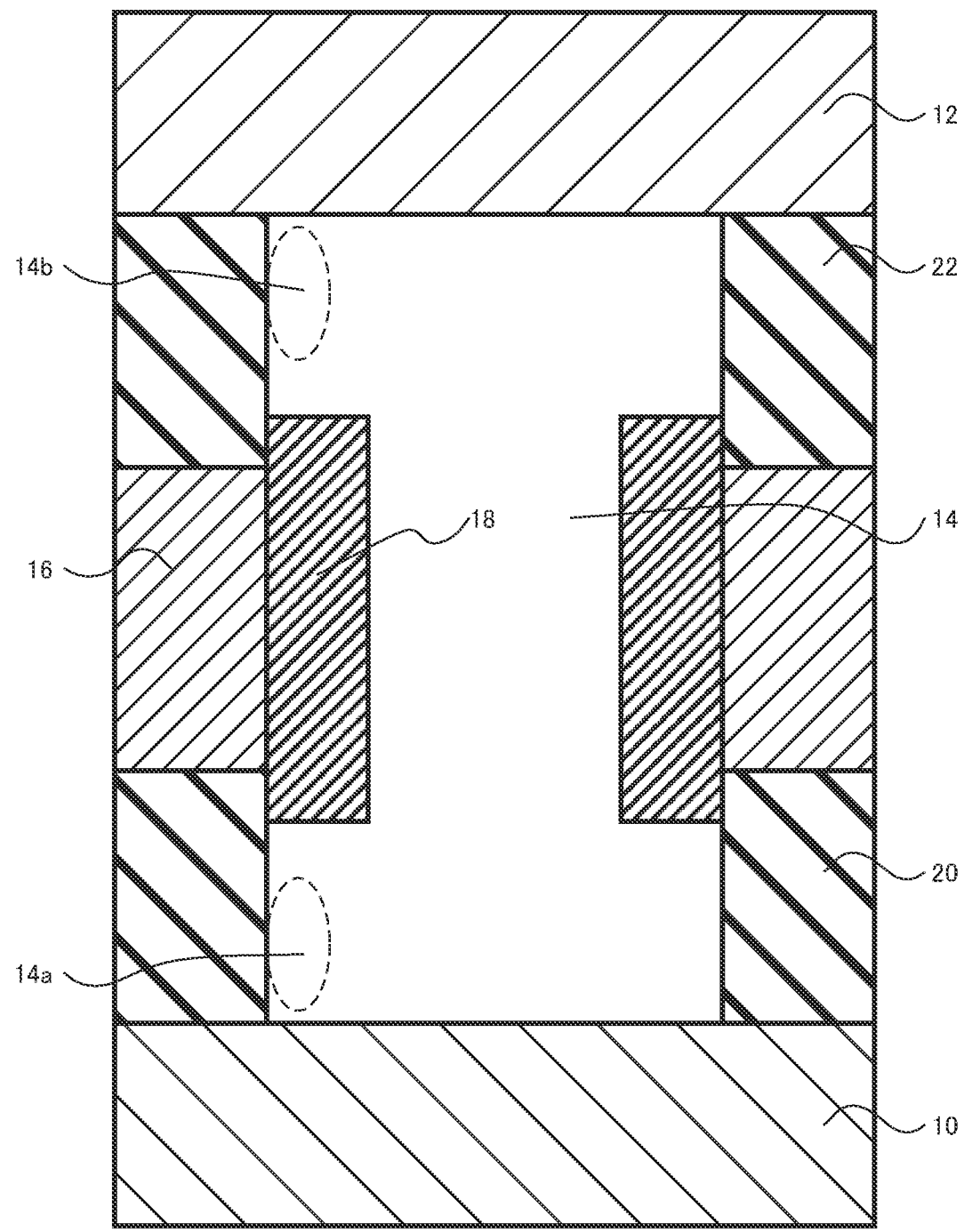
FIG. 15 is a schematic cross-sectional view of a semiconductor device of a third modification example of the first embodiment.

FIG. 15 is a schematic cross-sectional view of a semiconductor device of a third modification example of the first embodiment. FIG. 15 is a diagram corresponding to FIG. 1 of the first embodiment.

The transistor of the third modification example of the first embodiment is different from the transistor 100 according to the first embodiment in that the gate insulating layer 18 is rectangular in a cross section parallel to the first direction and including the oxide semiconductor layer 14.

According to the transistor of the third modification example, for example, the variation in the threshold voltage of the transistor is reduced by increasing the region where the thickness of the gate insulating layer 18 is constant.

Fourth Modification Example

Figure 16:
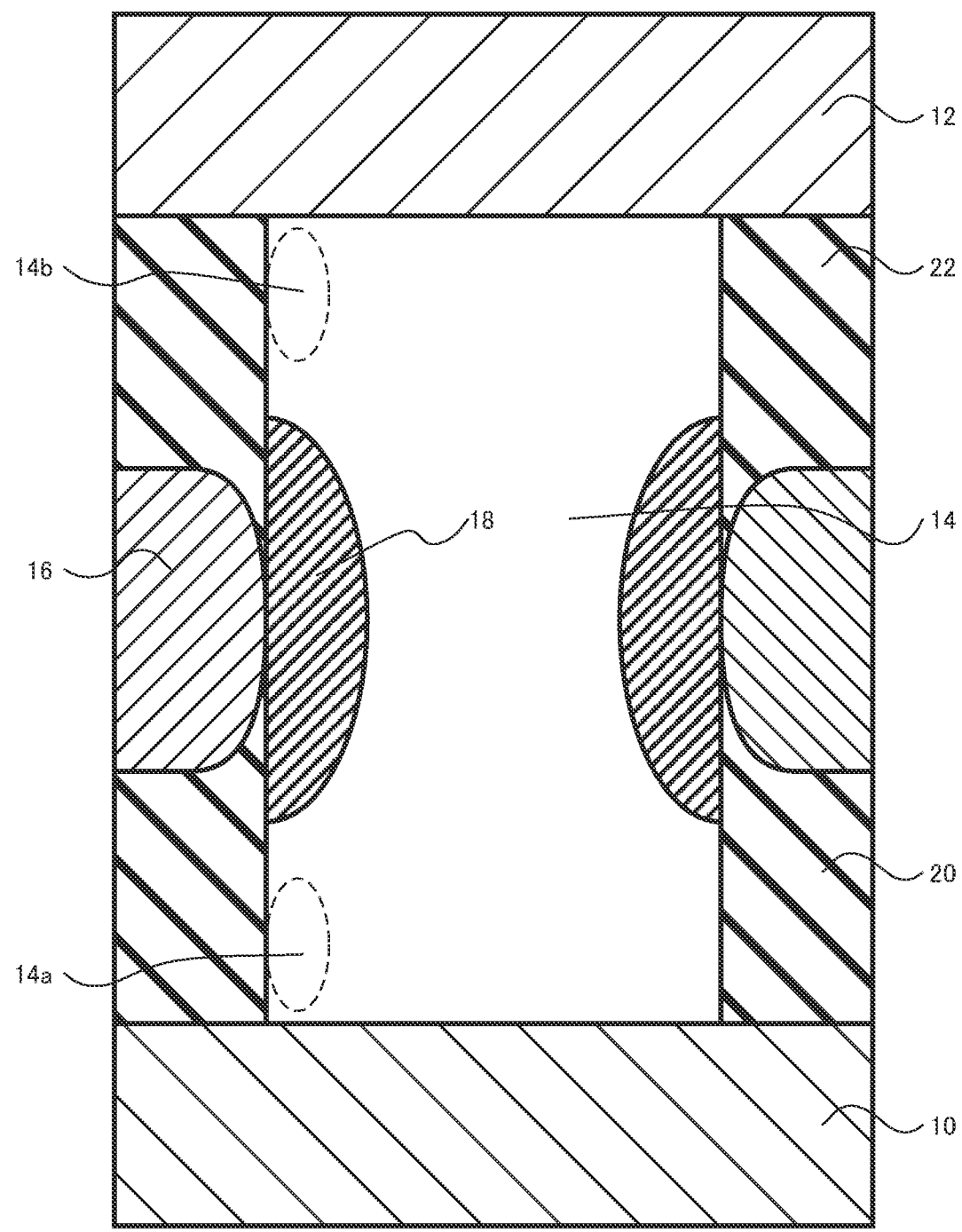
FIG. 16 is a schematic cross-sectional view of a semiconductor device of a fourth modification example of the first embodiment.

FIG. 16 is a schematic cross-sectional view of a semiconductor device of a fourth modification example of the first embodiment. FIG. 16 is a diagram corresponding to FIG. 1 of the first embodiment.

The transistor of the fourth modification example of the first embodiment is different from the transistor 100 according to the first embodiment in that the gate electrode 16 has an undercut shape in a cross section parallel to the first direction and including the oxide semiconductor layer 14. The length of the gate electrode 16 in the first direction is, for example, the shortest at the interface with the gate insulating layer 18. The length of the gate electrode 16 in the first direction becomes smaller as the gate electrode 16 becomes closer to the gate insulating layer 18, for example.

According to the transistor of the fourth modification example, since the gate electrode 16 has an undercut shape, electric field concentration at the end of the gate electrode 16 is reduced. Therefore, for example, the leakage current of the gate insulating layer 18 is suppressed.

Fifth Modification Example

Figure 17:
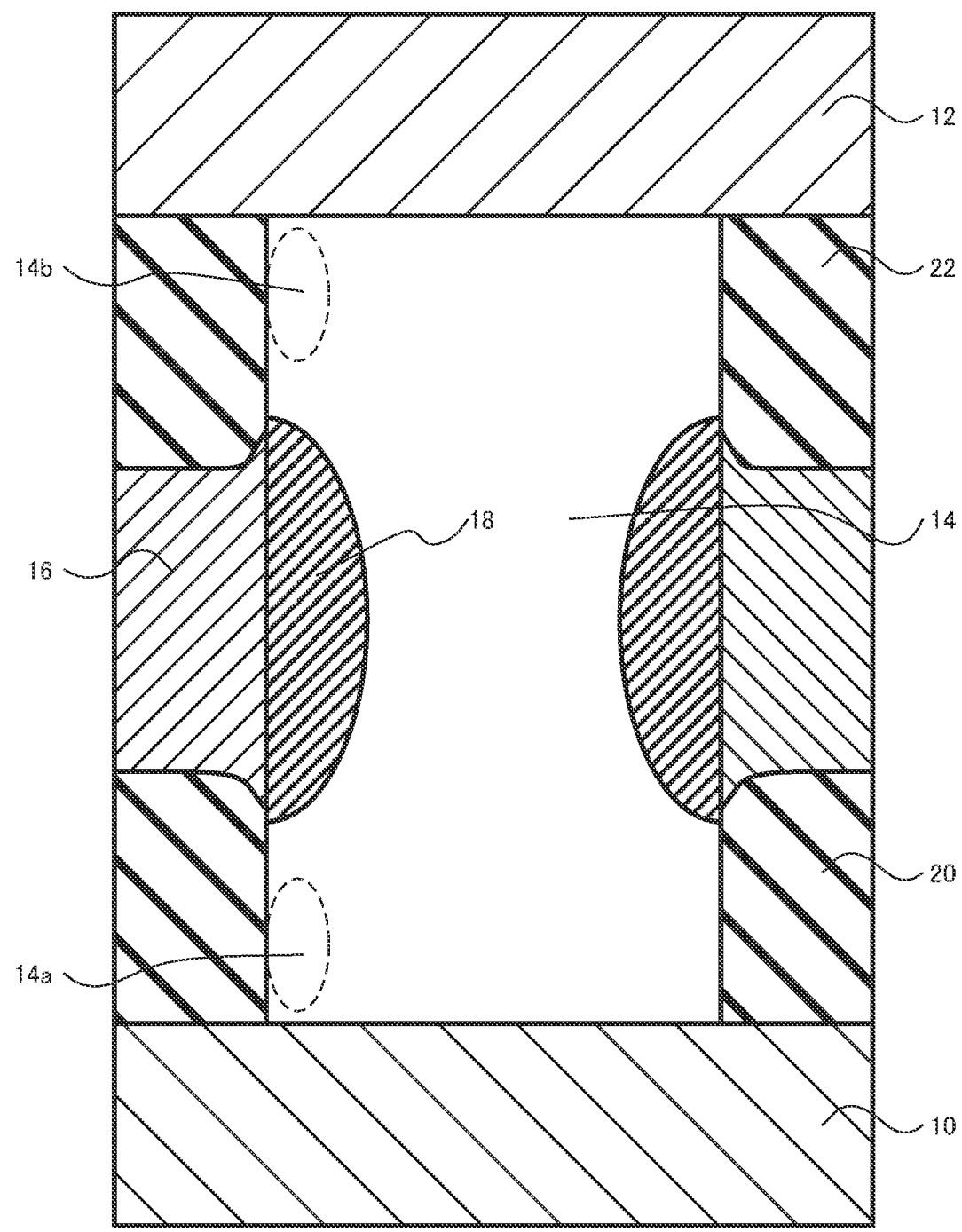
FIG. 17 is a schematic cross-sectional view of a semiconductor device of a fifth modification example of the first embodiment.

FIG. 17 is a schematic cross-sectional view of a semiconductor device of a fifth modification example of the first embodiment. FIG. 17 is a diagram corresponding to FIG. 1 of the first embodiment.

The transistor of the fifth modification example of the first embodiment is different from the transistor 100 according to the first embodiment in that the gate electrode 16 has a tailed shape in a cross section parallel to the first direction and including the oxide semiconductor layer 14. The length of the gate electrode 16 in the first direction is, for example, the longest at the interface with the gate insulating layer 18. The length of the gate electrode 16 in the first direction becomes larger as the gate electrode 16 becomes closer to the gate insulating layer 18, for example.

According to the transistor of the fifth modification example, since the gate electrode 16 has a tailed shape, the storage or inversion of electrons in the oxide semiconductor layer 14 facing the first interlayer insulating layer 20 is promoted by the fringe electric field of the gate electrode 16. In addition, the storage or inversion of electrons in the oxide semiconductor layer 14 facing the second interlayer insulating layer 22 is promoted by the fringe electric field of the gate electrode 16. Therefore, for example, the on-resistance of the transistor is further reduced.

As described above, according to the first embodiment and its modification examples, it is possible to realize a transistor whose on-resistance can be reduced.

Second Embodiment

A semiconductor device according to a second embodiment is different from the semiconductor device according to the first embodiment in that the second direction crosses the first direction. Hereinafter, the description of a part of the content overlapping the first embodiment may be omitted.

Figure 18:
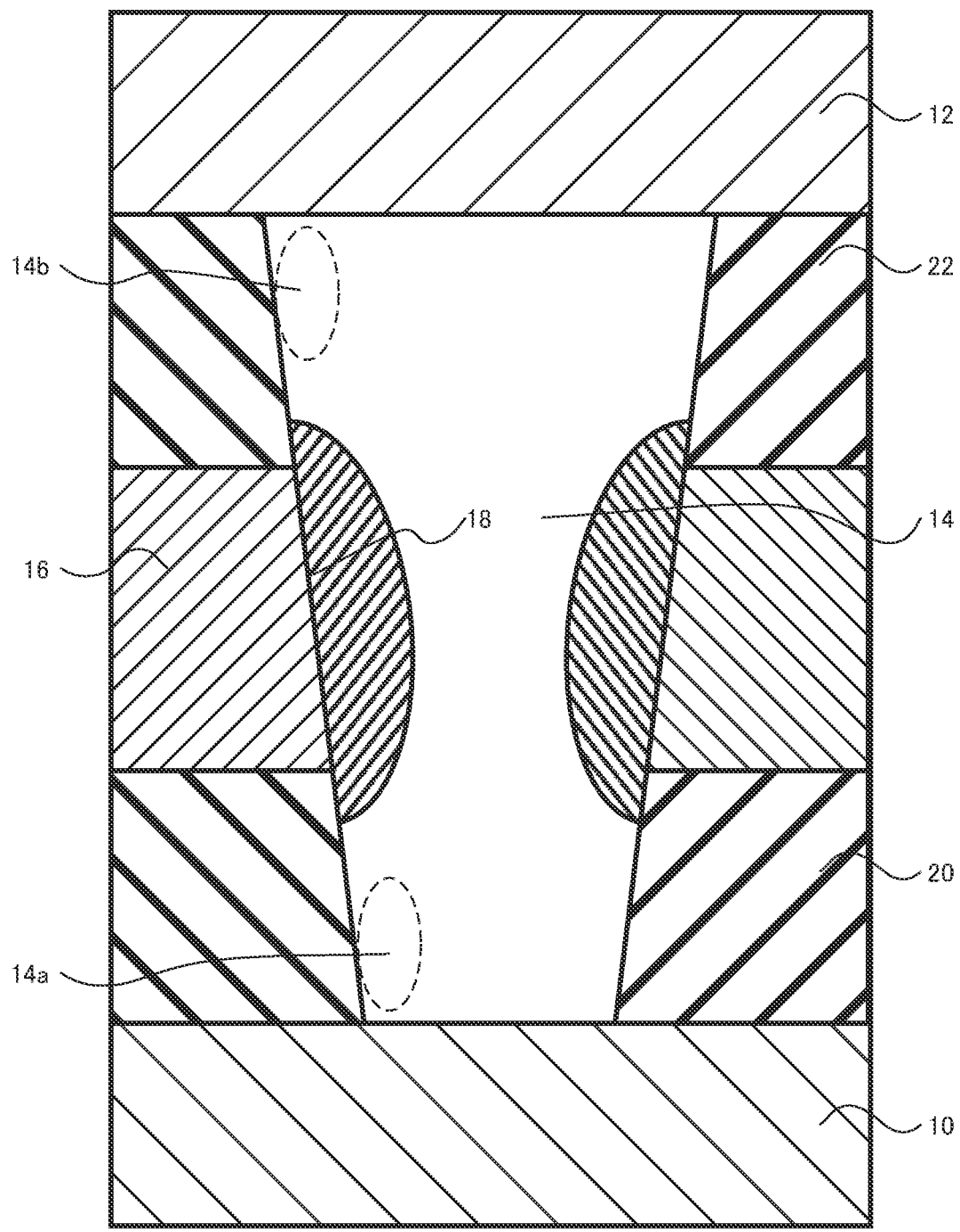
FIG. 18 is a schematic cross-sectional view of a semiconductor device according to a second embodiment.
Figure 19:
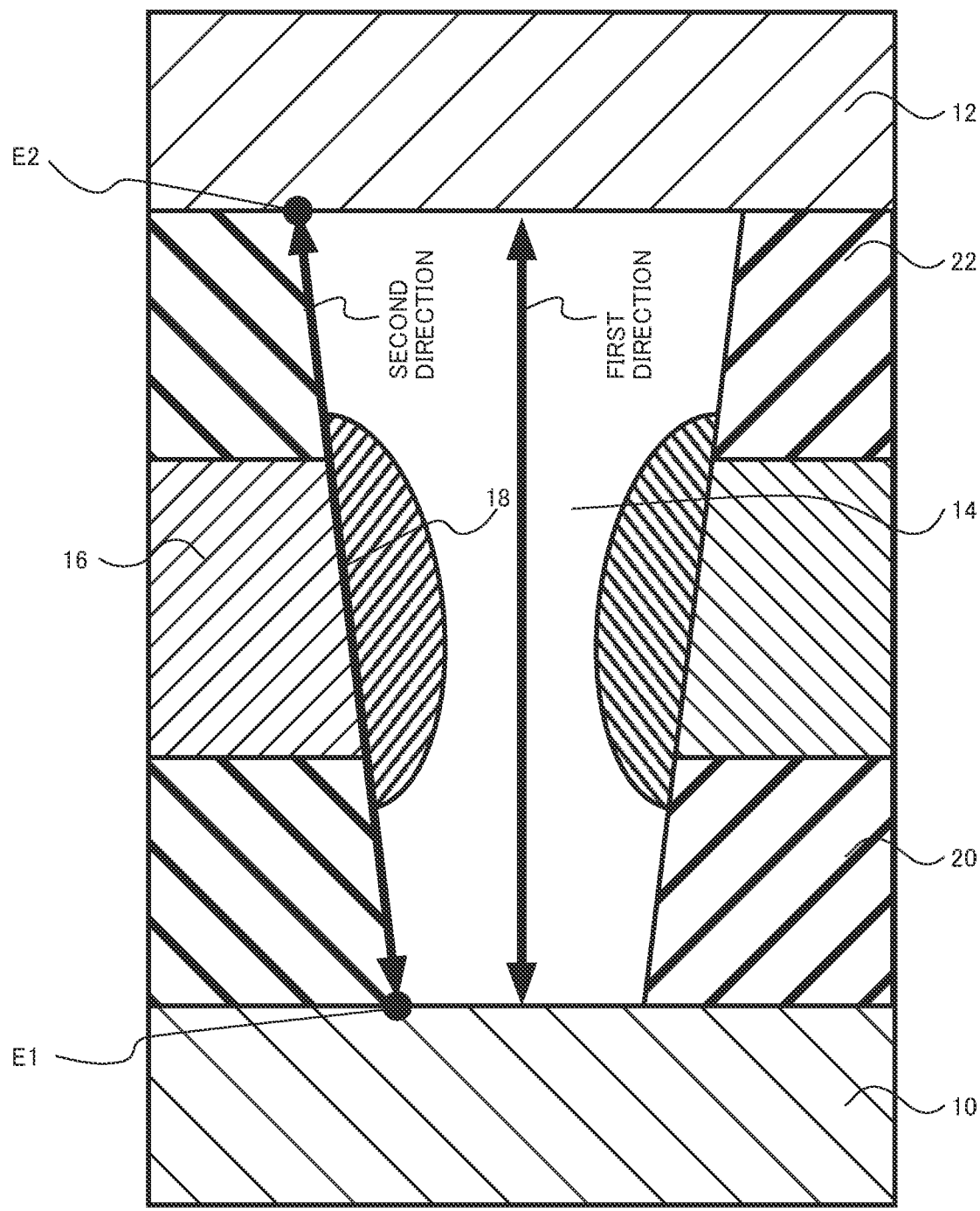
FIG. 19 is a schematic cross-sectional view of the semiconductor device according to the second embodiment.

FIGS. 18 and 19 are schematic cross-sectional views of the semiconductor device according to the second embodiment. FIG. 19 is an explanatory diagram of a first direction and a second direction. FIG. 18 is a diagram corresponding to FIG. 1 of the first embodiment. FIG. 19 is a diagram corresponding to FIG. 2 of the first embodiment.

As shown in FIG. 19, a direction from the lower electrode 10 to the upper electrode 12 is defined as the first direction. In addition, in a cross section parallel to the first direction and including the oxide semiconductor layer 14, a direction connecting a first end (E1 in FIG. 19) of the interface between the lower electrode 10 and the first interlayer insulating layer 20 on the oxide semiconductor layer 14 side and a second end (E2 in FIG. 19) of the interface between the upper electrode 12 and the second interlayer insulating layer 22 on the oxide semiconductor layer 14 side is defined as the second direction. In addition, in the cross section parallel to the first direction and including the oxide semiconductor layer 14, a direction perpendicular to the first direction is defined as a third direction.

In FIG. 19, the second direction crosses the first direction.

In the cross section parallel to the first direction and including the oxide semiconductor layer 14, the oxide semiconductor layer 14 has a forward tapered shape. In the cross section parallel to the first direction and including the oxide semiconductor layer 14, the length of the interface between the lower electrode 10 and the oxide semiconductor layer 14 is smaller than the length of the interface between the upper electrode 12 and the oxide semiconductor layer 14.

Modification Example

Figure 20:
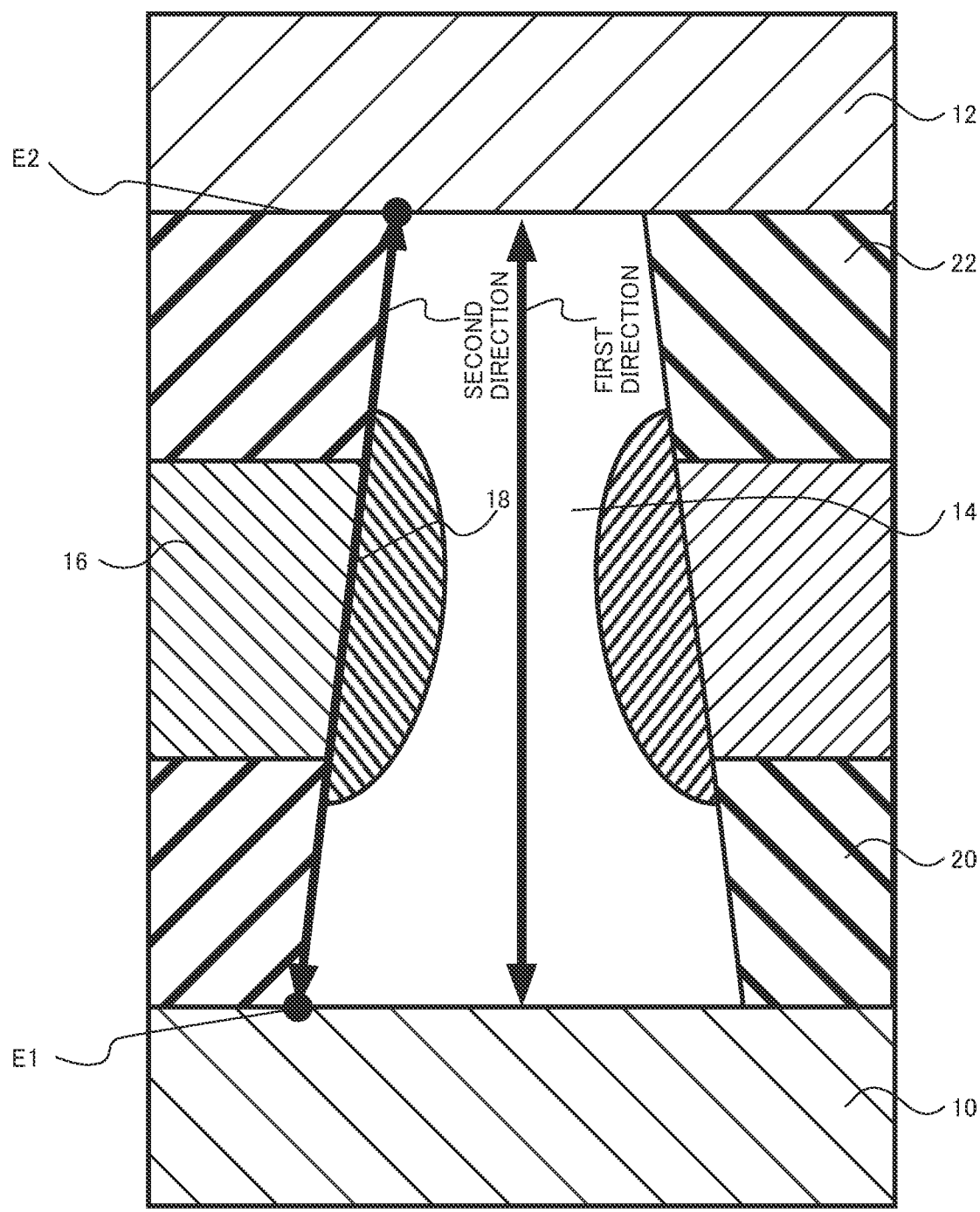
FIG. 20 is a schematic cross-sectional view of a semiconductor device of a modification example of the second embodiment.

FIG. 20 is a schematic cross-sectional view of a semiconductor device of a modification example of the second embodiment. FIG. 20 is a diagram corresponding to FIG. 19 of the second embodiment.

The transistor of the modification example of the second embodiment is different from the transistor according to the second embodiment in that the oxide semiconductor layer 14 has a reverse tapered shape in a cross section parallel to the first direction and including the oxide semiconductor layer 14. In the cross section parallel to the first direction and including the oxide semiconductor layer 14, the length of the interface between the lower electrode 10 and the oxide semiconductor layer 14 is larger than the length of the interface between the upper electrode 12 and the oxide semiconductor layer 14.

As described above, according to the second embodiment and its modification example, it is possible to realize a transistor whose on-resistance can be reduced as in the first embodiment.

Third Embodiment

A semiconductor device according to a third embodiment is different from the semiconductor device according to the first embodiment in that a first region of a gate insulating layer is provided between a first insulating layer and a first portion and a second region of the gate insulating layer is provided between a second insulating layer and a second portion. Hereinafter, the description of a part of the content overlapping the first embodiment may be omitted.

Figure 21:
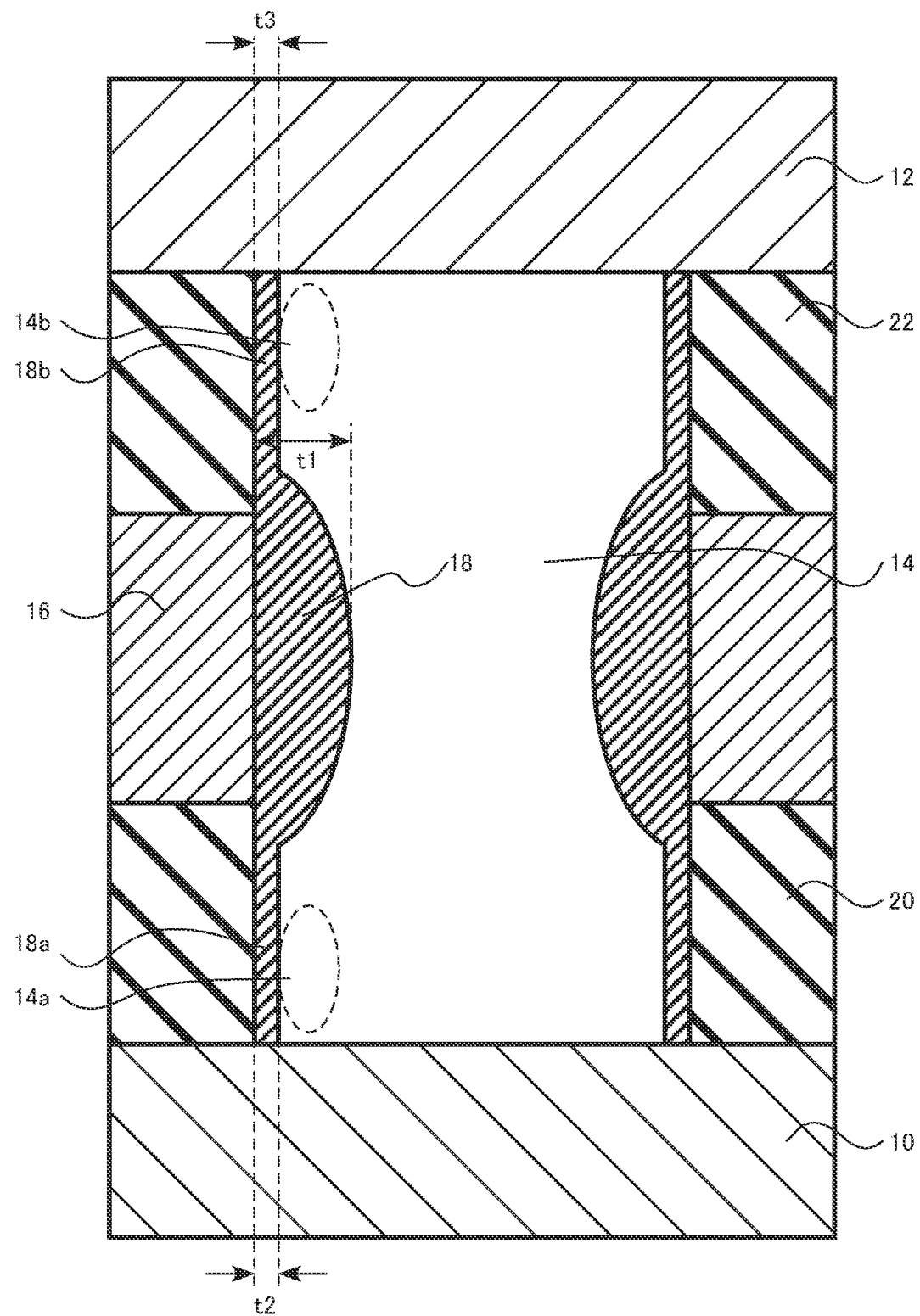
FIG. 21 is a schematic cross-sectional view of a semiconductor device according to a third embodiment.

FIG. 21 is a schematic cross-sectional view of the semiconductor device according to the third embodiment. FIG. 21 is a diagram corresponding to FIG. 1 of the first embodiment.

A transistor according to the third embodiment includes a lower electrode 10, an upper electrode 12, an oxide semiconductor layer 14, a gate electrode 16, a gate insulating layer 18, a first interlayer insulating layer 20, and a second interlayer insulating layer 22. The oxide semiconductor layer 14 includes a first portion 14a and a second portion 14b. The gate insulating layer 18 includes a first region 18a and a second region 18b.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

The first region 18a of the gate insulating layer 18 is provided between the first interlayer insulating layer 20 and the first portion 14a of the oxide semiconductor layer 14. The thickness (t2 in FIG. 21) of the first region 18a of the gate insulating layer 18 in a direction from the first interlayer insulating layer 20 to the first portion 14a is smaller than the thickness (t1 in FIG. 21) of the gate insulating layer 18 between the gate electrode 16 and the oxide semiconductor layer 14 in a direction from the gate electrode 16 to the oxide semiconductor layer 14. For example, the thickness (t2 in FIG. 21) of the first region 18a of the gate insulating layer 18 in the direction from the first interlayer insulating layer 20 to the first portion 14a is equal to or less than half the thickness (t1 in FIG. 21) of the gate insulating layer 18 between the gate electrode 16 and the oxide semiconductor layer 14 in the direction from the gate electrode 16 to the oxide semiconductor layer 14. Here, the thickness (t1 in FIG. 21) of the gate insulating layer 18 between the gate electrode 16 and the oxide semiconductor layer 14 in the direction from the gate electrode 16 to the oxide semiconductor layer 14 is, for example, a maximum thickness in the direction from the gate electrode 16 to the oxide semiconductor layer 14.

The second region 18b of the gate insulating layer 18 is provided between the second interlayer insulating layer 22 and the second portion 14b of the oxide semiconductor layer 14. The thickness (t3 in FIG. 21) of the second region 18b of the gate insulating layer 18 in a direction from the second interlayer insulating layer 22 to the second portion 14b is smaller than the thickness (t1 in FIG. 21) of the gate insulating layer 18 between the gate electrode 16 and the oxide semiconductor layer 14 in a direction from the gate electrode 16 to the oxide semiconductor layer 14. For example, the thickness (t3 in FIG. 21) of the second region 18b of the gate insulating layer 18 in the direction from the second interlayer insulating layer 22 to the second portion 14b is equal to or less than half the thickness (t1 in FIG. 21) of the gate insulating layer 18 between the gate electrode 16 and the oxide semiconductor layer 14 in the direction from the gate electrode 16 to the oxide semiconductor layer 14. Here, the thickness (t1 in FIG. 21) of the gate insulating layer 18 between the gate electrode 16 and the oxide semiconductor layer 14 in the direction from the gate electrode 16 to the oxide semiconductor layer 14 is, for example, a maximum thickness in the direction from the gate electrode 16 to the oxide semiconductor layer 14.

As described above, according to the third embodiment, it is possible to realize a transistor whose on-resistance can be reduced as in the first embodiment.

Fourth Embodiment

A semiconductor device according to a fourth embodiment is different from the semiconductor device according to the first embodiment in that the gate insulating layer includes a first layer and a second layer provided between the first layer and an oxide semiconductor layer and having a chemical composition different from that of the first layer. Hereinafter, the description of a part of the content overlapping the first embodiment may be omitted.

Figure 22:
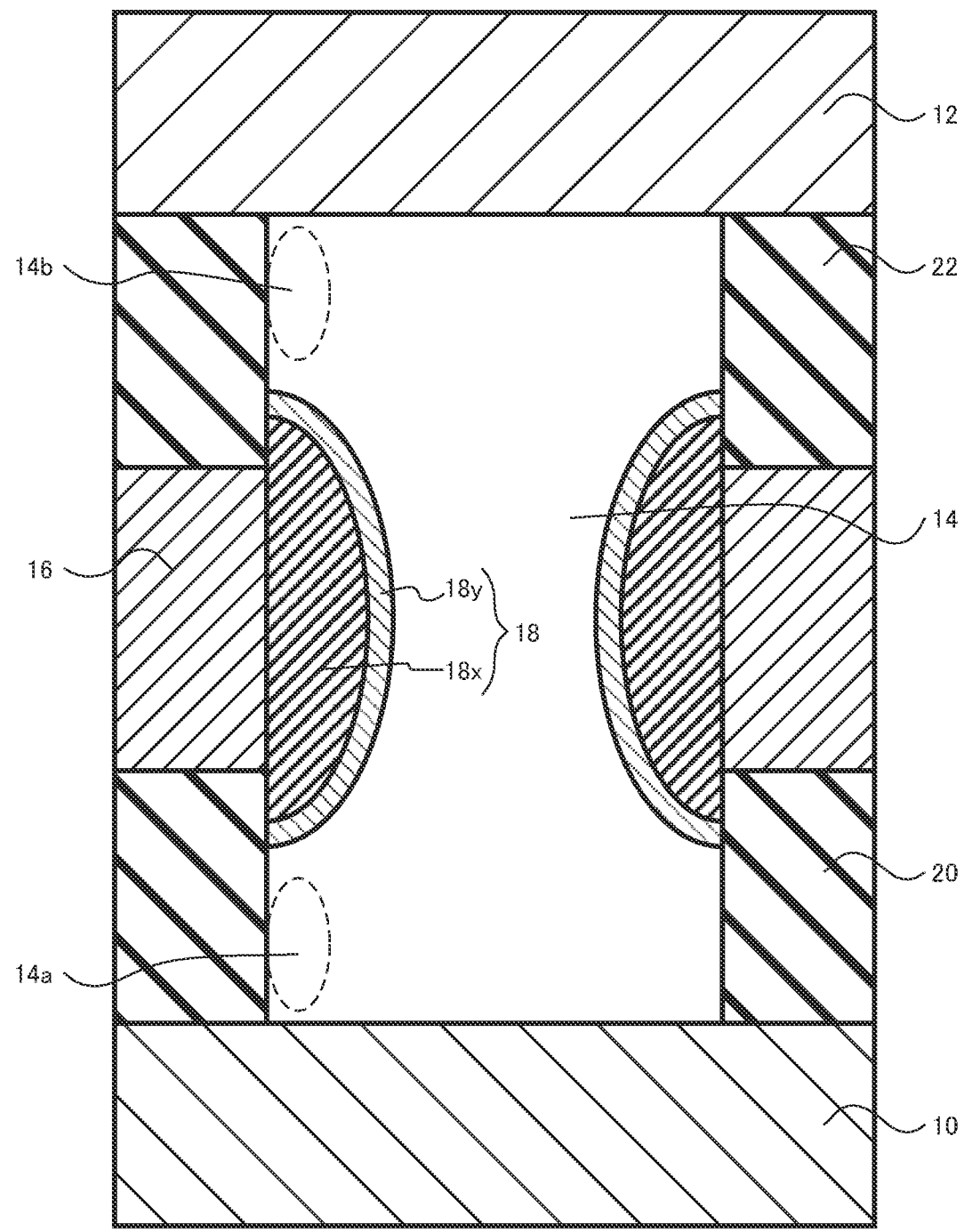
FIG. 22 is a schematic cross-sectional view of a semiconductor device according to a fourth embodiment.

FIG. 22 is a schematic cross-sectional view of the semiconductor device according to the fourth embodiment. FIG. 22 is a diagram corresponding to FIG. 1 of the first embodiment.

A transistor according to the fourth embodiment includes a lower electrode 10, an upper electrode 12, an oxide semiconductor layer 14, a gate electrode 16, a gate insulating layer 18, a first interlayer insulating layer 20, and a second interlayer insulating layer 22. The oxide semiconductor layer 14 includes a first portion 14a and a second portion 14b. The gate insulating layer 18 includes a first layer 18x and a second layer 18y.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

The gate insulating layer 18 is provided between the gate electrode 16 and the oxide semiconductor layer 14. The gate insulating layer 18 is not provided between the first interlayer insulating layer 20 and the oxide semiconductor layer 14. The gate insulating layer 18 is not provided between the second interlayer insulating layer 22 and the oxide semiconductor layer 14.

The second layer 18y of the gate insulating layer 18 is provided between the first layer 18x and the oxide semiconductor layer. The second layer 18y has a chemical composition different from that of the first layer 18x.

For example, the first layer 18x contains silicon (Si) and nitrogen (N), and the second layer 18y contains silicon (Si) and oxygen (O). For example, the first layer 18x contains silicon nitride, and the second layer 18y contains silicon oxide. For example, the first layer 18x is a silicon nitride layer, and the second layer 18y is a silicon oxide layer.

In the transistor according to the fourth embodiment, since the gate insulating layer 18 includes the first layer 18x and the second layer 18y, for example, it is possible to achieve both ease of manufacture and high transistor characteristics.

Modification Example

Figure 23:
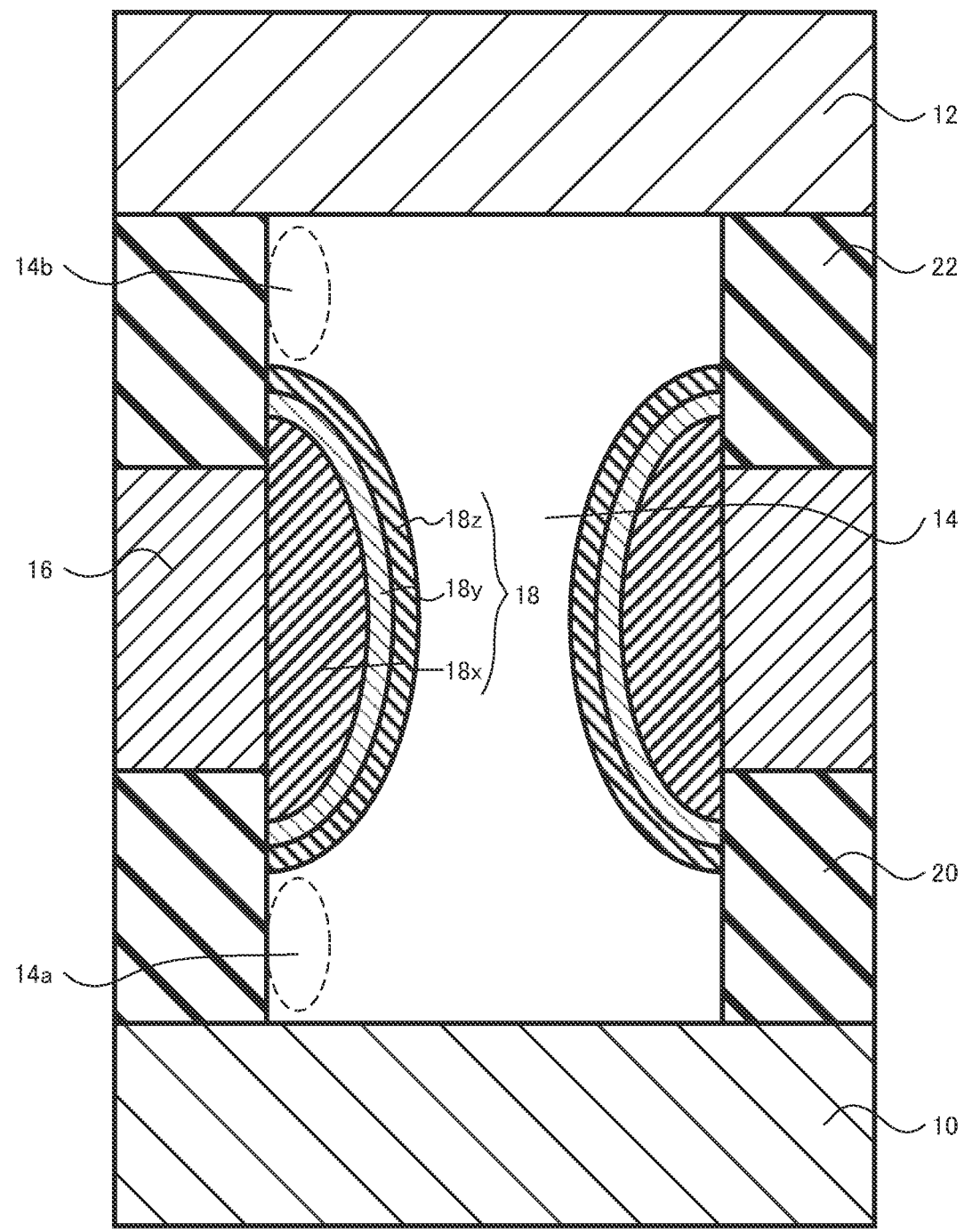
FIG. 23 is a schematic cross-sectional view of a semiconductor device of a modification example of the fourth embodiment.

FIG. 23 is a schematic cross-sectional view of a semiconductor device of a modification example of the fourth embodiment. FIG. 23 is a diagram corresponding to FIG. 22 of the fourth embodiment.

The transistor of the modification example of the fourth embodiment is different from the transistor according to the fourth embodiment in that the transistor of the modification example of the fourth embodiment includes a third layer provided between the second layer and the oxide semiconductor layer and having a chemical composition different from that of the second layer. For example, the chemical composition of the third layer is different from the chemical composition of the first layer.

For example, the first layer 18x contains silicon (Si) and nitrogen (N), the second layer 18y contains silicon (Si) and oxygen (O), and a third layer 18z contains aluminum (Al) and oxygen (O). For example, the first layer 18x contains silicon nitride, the second layer 18y contains silicon oxide, and the third layer 18z contains aluminum oxide. For example, the first layer 18x is a silicon nitride layer, the second layer 18y is a silicon oxide layer, and the third layer 18z is an aluminum oxide layer.

In the transistor of the modification example of the fourth embodiment, since the gate insulating layer 18 includes the first layer 18x, the second layer 18y, and the third layer 18z, for example, it is possible to achieve both ease of manufacture and high transistor characteristics.

As described above, according to the fourth embodiment, it is possible to realize a transistor whose on-resistance can be reduced as in the first embodiment.

Fifth Embodiment

A semiconductor device according to a fifth embodiment is different from the semiconductor device according to the fourth embodiment in that a first layer is provided between a gate electrode and an oxide semiconductor layer and a second layer is provided between a first insulating layer and a first portion and between a second insulating layer and a second portion. Hereinafter, the description of a part of the content overlapping the fourth embodiment may be omitted.

Figure 24:
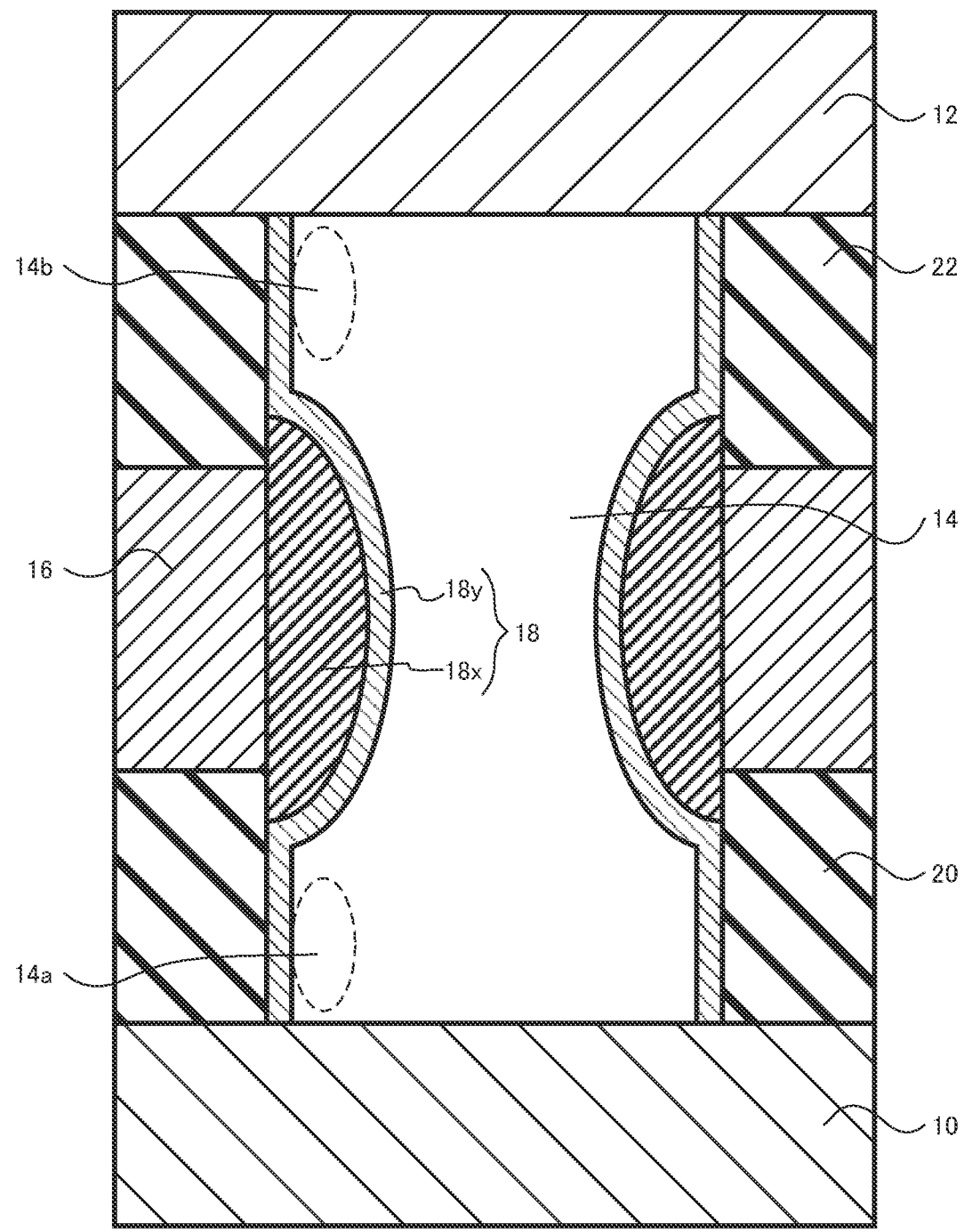
FIG. 24 is a schematic cross-sectional view of a semiconductor device according to a fifth embodiment.

FIG. 24 is a schematic cross-sectional view of the semiconductor device according to the fifth embodiment. FIG. 24 is a diagram corresponding to FIG. 1 of the first embodiment.

A transistor according to the fifth embodiment includes a lower electrode 10, an upper electrode 12, an oxide semiconductor layer 14, a gate electrode 16, a gate insulating layer 18, a first interlayer insulating layer 20, and a second interlayer insulating layer 22. The oxide semiconductor layer 14 includes a first portion 14a and a second portion 14b. The gate insulating layer 18 includes a first layer 18x and a second layer 18y.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

The first layer 18x of the gate insulating layer 18 is provided between the gate electrode 16 and the oxide semiconductor layer 14.

The second layer 18y of the gate insulating layer 18 is provided between the gate electrode 16 and the oxide semiconductor layer 14. The second layer 18y of the gate insulating layer 18 is provided between the first layer 18x and the oxide semiconductor layer. In addition, the second layer 18y is provided between the first interlayer insulating layer 20 and the first portion 14a of the oxide semiconductor layer 14. In addition, the second layer 18y is provided between the second interlayer insulating layer 22 and the second portion 14b of the oxide semiconductor layer 14. The second layer 18y has a chemical composition different from that of the first layer 18x.

For example, the first layer 18x contains silicon (Si) and nitrogen (N), and the second layer 18y contains silicon (Si) and oxygen (O). For example, the first layer 18x contains silicon nitride, and the second layer 18y contains silicon oxide. For example, the first layer 18x is a silicon nitride layer, and the second layer 18y is a silicon oxide layer.

In the transistor according to the fifth embodiment, since the gate insulating layer 18 includes the first layer 18x and the second layer 18y, for example, it is possible to achieve both ease of manufacture and high transistor characteristics.

Modification Example

Figure 25:
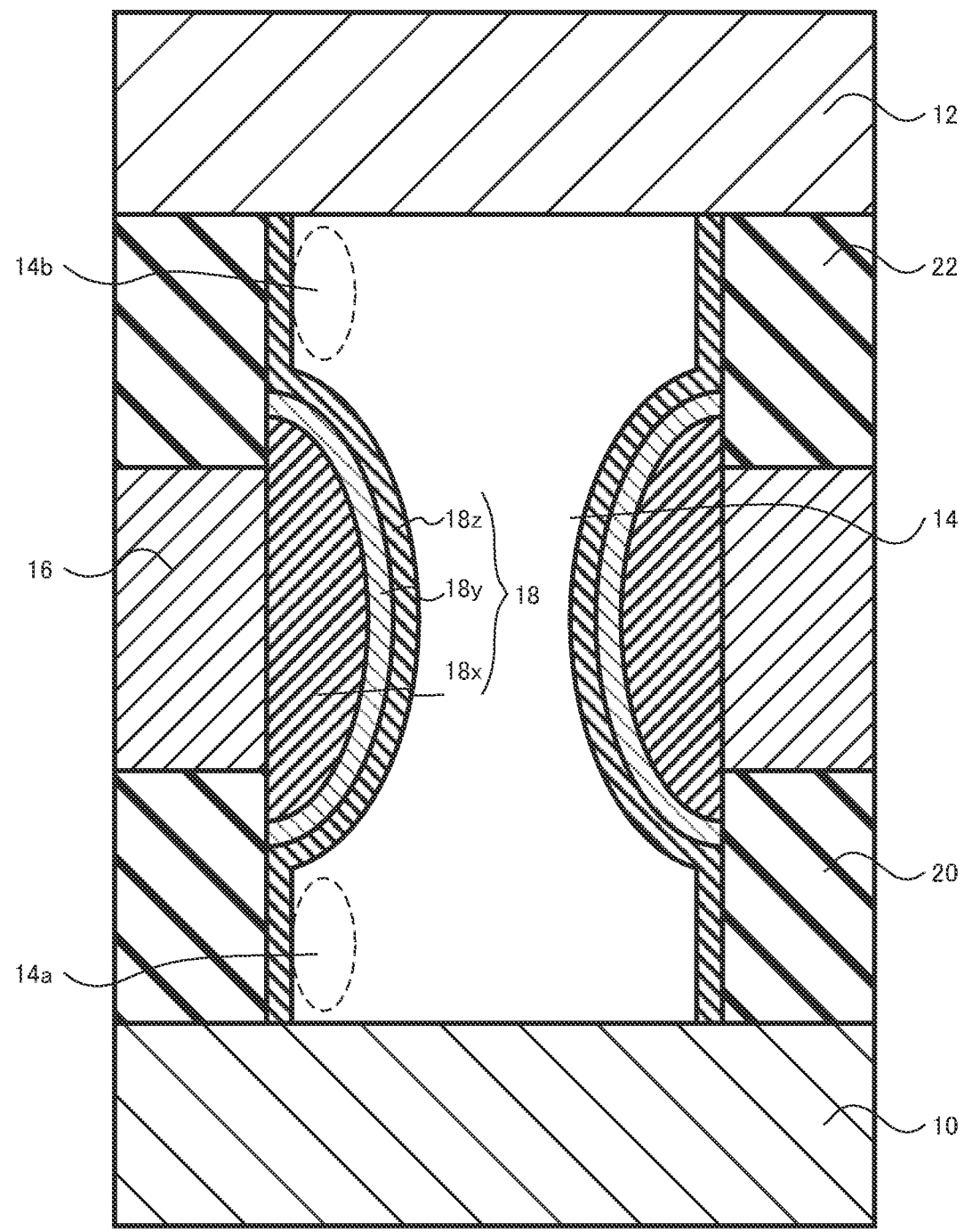
FIG. 25 is a schematic cross-sectional view of a semiconductor device of a modification example of the fifth embodiment.

FIG. 25 is a schematic cross-sectional view of a semiconductor device of a modification example of the fifth embodiment. FIG. 25 is a diagram corresponding to FIG. 24 of the fifth embodiment.

The transistor of the modification example of the fifth embodiment is different from the transistor according to the fifth embodiment in that the transistor of the modification example of the fifth embodiment includes a third layer provided between the second layer and the oxide semiconductor layer and having a chemical composition different from that of the second layer. For example, the chemical composition of the third layer is different from the chemical composition of the first layer.

For example, the first layer 18x contains silicon (Si) and nitrogen (N), the second layer 18y contains silicon (Si) and oxygen (O), and a third layer 18z contains aluminum (Al) and oxygen (O). For example, the first layer 18x contains silicon nitride, the second layer 18y contains silicon oxide, and the third layer 18z contains aluminum oxide. For example, the first layer 18x is a silicon nitride layer, the second layer 18y is a silicon oxide layer, and the third layer 18z is an aluminum oxide layer.

In the transistor of the modification example of the fifth embodiment, since the gate insulating layer 18 includes the first layer 18x, the second layer 18y, and the third layer 18z, for example, it is possible to achieve both ease of manufacture and high transistor characteristics.

As described above, according to the fifth embodiment, it is possible to realize a transistor whose on-resistance can be reduced as in the first embodiment.

Sixth Embodiment

A semiconductor memory device according to a sixth embodiment includes a capacitor electrically connected to the first electrode or the second electrode of the semiconductor device according to the first embodiment. Hereinafter, the description of a part of the content overlapping the first embodiment may be omitted.

The semiconductor memory device according to the sixth embodiment is a semiconductor memory 200. The semiconductor memory device according to the sixth embodiment is a Dynamic Random Access Memory (DRAM). In the semiconductor memory 200, the transistor 100 according to the first embodiment is used as a switching transistor of a memory cell of a DRAM.

Figure 26:
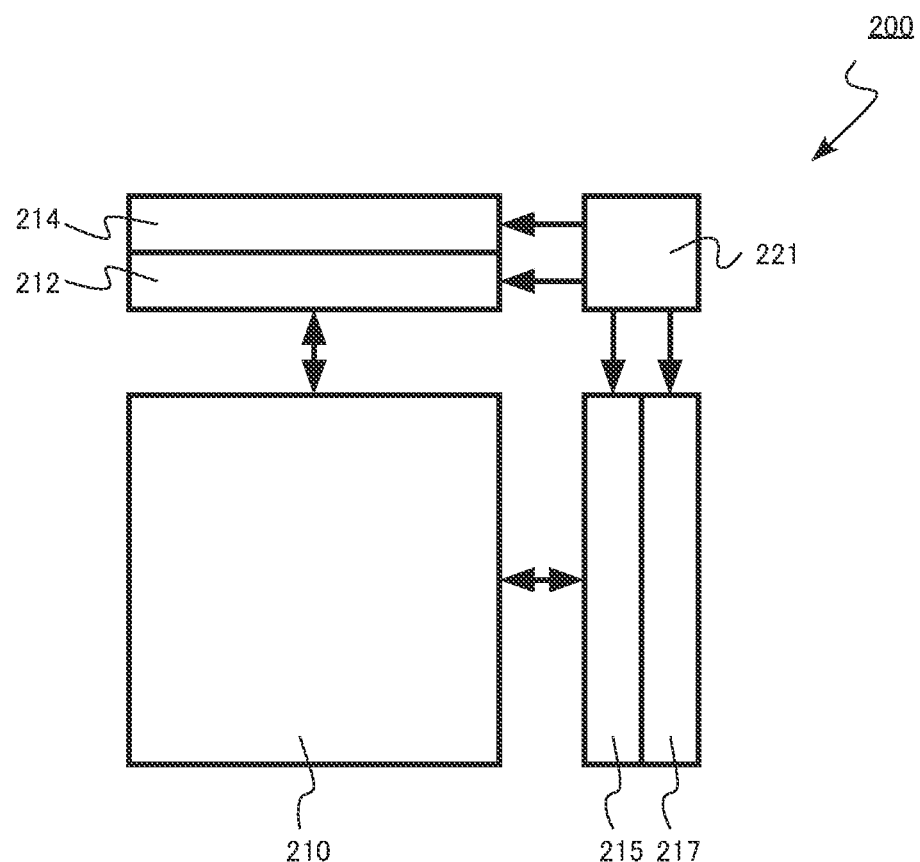
FIG. 26 is a block diagram of a semiconductor memory device according to a sixth embodiment.

FIG. 26 is a block diagram of the semiconductor memory device according to the sixth embodiment.

As shown in FIG. 26, the semiconductor memory 200 includes a memory cell array 210, a word line driver circuit 212, a low decoder circuit 214, a sense amplifier circuit 215, a column decoder circuit 217, and a control circuit 221.

Figure 27:
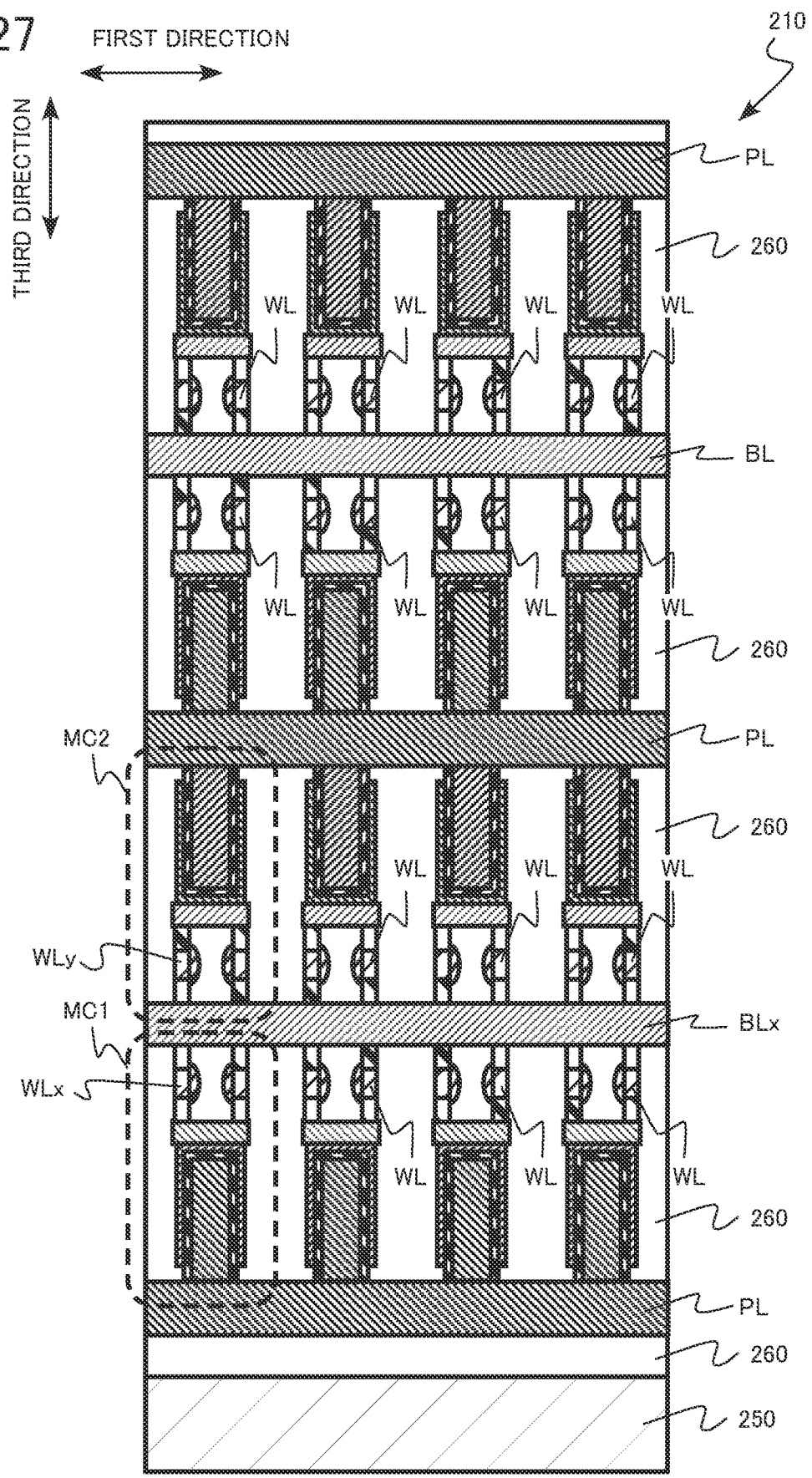
FIG. 27 is a schematic cross-sectional view of a memory cell array of the semiconductor memory device according to the sixth embodiment.
Figure 28:
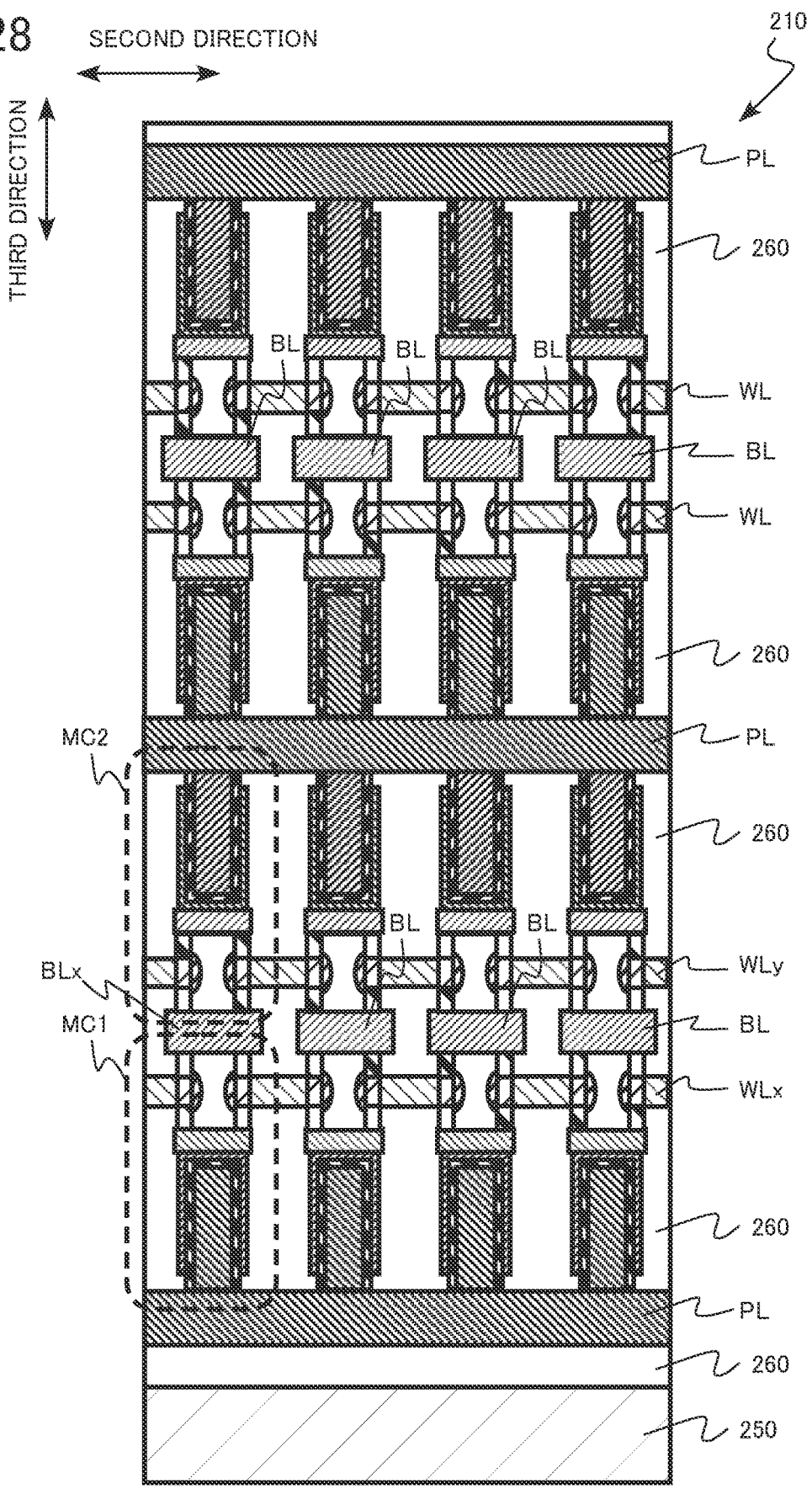
FIG. 28 is a schematic cross-sectional view of a memory cell array of the semiconductor memory device according to the sixth embodiment.

FIGS. 27 and 28 are schematic cross-sectional views of a memory cell array of the semiconductor memory device according to the sixth embodiment. FIG. 27 is a cross-sectional view of a surface including the first direction and the third direction, and FIG. 28 is a cross-sectional view of a surface including the second direction and the third direction. The first direction and the second direction cross each other. The first direction and the second direction are, for example, vertical. The third direction is a direction perpendicular to the first direction and the second direction. The third direction is, for example, a direction perpendicular to the substrate.

The memory cell array 210 of the sixth embodiment has a three-dimensional structure in which memory cells are arranged in a three-dimensional manner. In FIGS. 27 and 28, each region surrounded by the broken line represents one memory cell.

The memory cell array 210 includes a silicon substrate 250.

The memory cell array 210 includes, for example, a plurality of bit lines BL and a plurality of word lines WL on the silicon substrate 250. The bit line BL extends in the first direction. The word line WL extends in the second direction.

The bit line BL and the word line WL cross each other vertically, for example. A memory cell is arranged in a region where the bit line BL and the word line WL cross each other. The memory cells include a first memory cell MC1 and a second memory cell MC2.

The bit line BL connected to the first memory cell MC1 and the second memory cell MC2 is a bit line BLx. The word line WL connected to the first memory cell MC1 is a word line WLx.

The word line WL connected to the second memory cell MC2 is a word line WLy. The word line WLx is provided on one side of the bit line BLx. The word line WLy is provided on the other side of the bit line BLx.

The memory cell array 210 has a plurality of plate electrode lines PL. The plate electrode line PL is connected to a plate electrode 72 of each memory cell.

The memory cell array 210 includes an interlayer insulating layer 260 for electrical separation of each wiring and each electrode.

The plurality of word lines WL are electrically connected to the low decoder circuit 214. The plurality of bit lines BL are electrically connected to the sense amplifier circuit 215.

The low decoder circuit 214 has a function of selecting the word line WL according to an input low address signal. The word line driver circuit 212 has a function of applying a predetermined voltage to the word line WL selected by the low decoder circuit 214.

The column decoder circuit 217 has a function of selecting the bit line BL according to an input column address signal. The sense amplifier circuit 215 has a function of applying a predetermined voltage to the bit line BL selected by the column decoder circuit 217. In addition, there is also a function of detecting and amplifying the electric potential of the bit line BL.

The control circuit 221 has a function of controlling the word line driver circuit 212, the low decoder circuit 214, the sense amplifier circuit 215, the column decoder circuit 217, and other circuits (not shown).

Circuits such as the word line driver circuit 212, the low decoder circuit 214, the sense amplifier circuit 215, the column decoder circuit 217, and the control circuit 221 are formed by, for example, transistors or wiring layers (not shown). The transistors are formed by using, for example, the silicon substrate 250.

The bit line BL and the word line WL are, for example, metal. The bit line BL and the word line WL are, for example, titanium nitride, tungsten, or a stacked structure of titanium nitride and tungsten.

Figure 29:
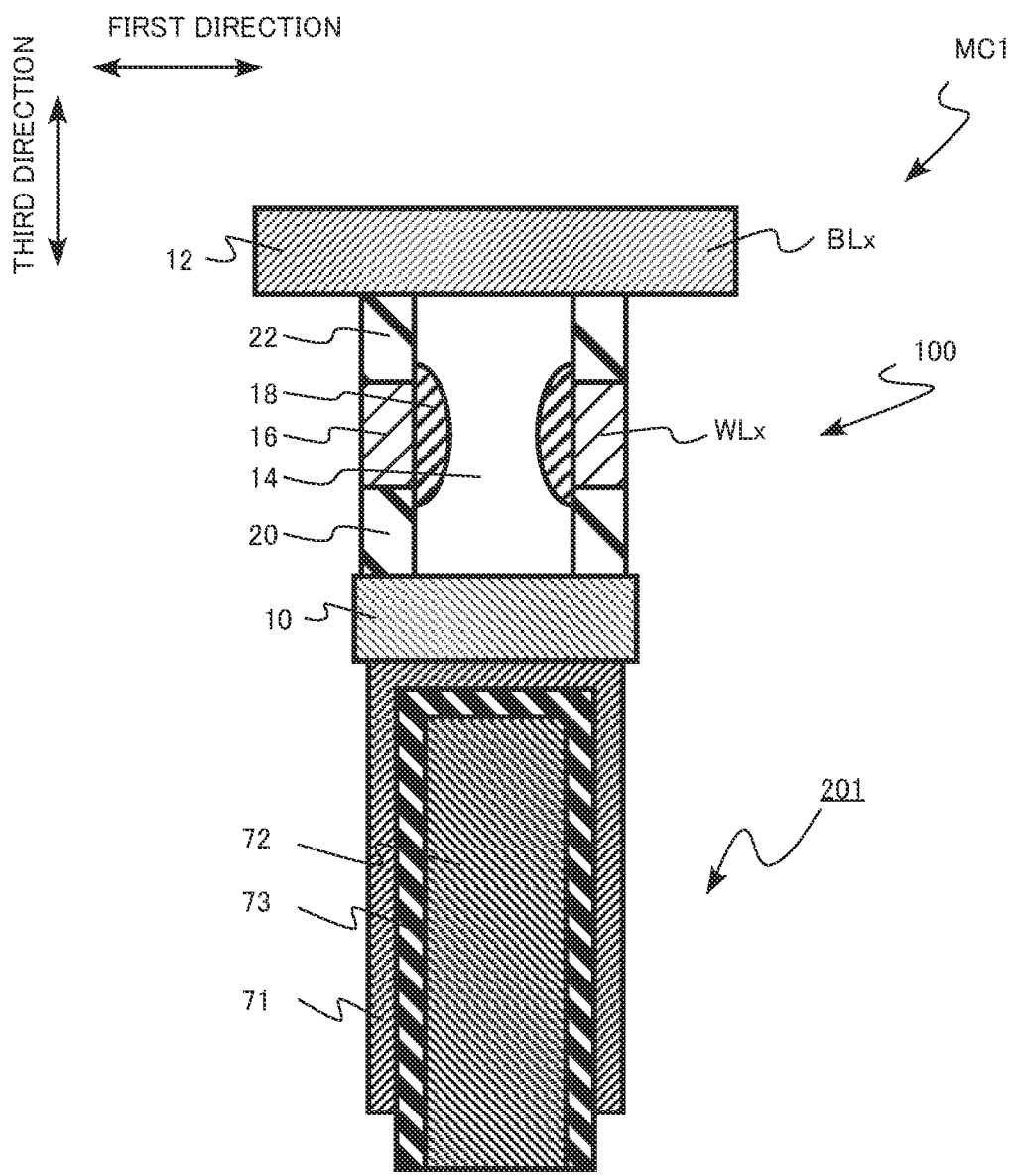
FIG. 29 is a schematic cross-sectional view of a first memory cell of the semiconductor memory device according to the sixth embodiment.
Figure 30:
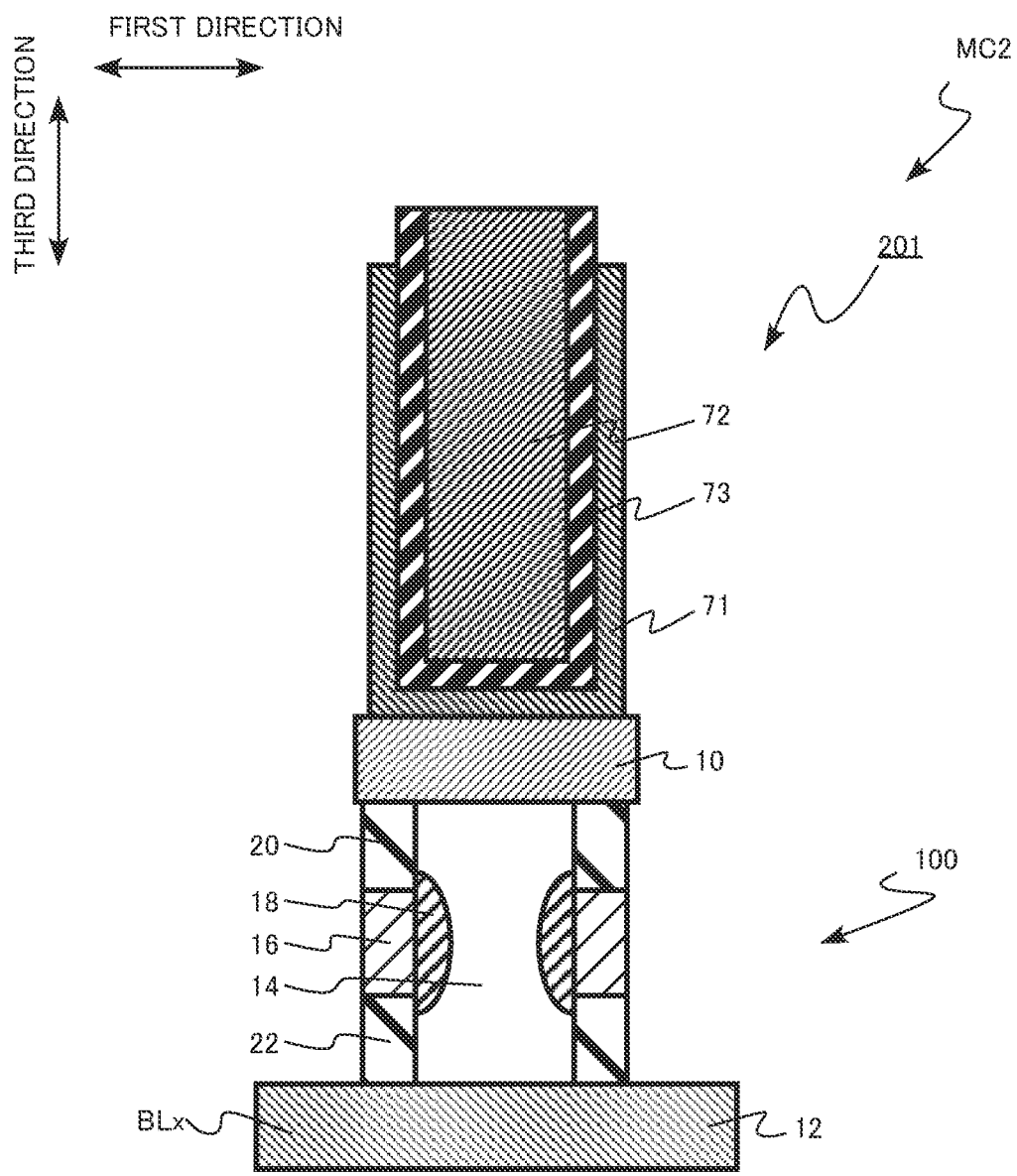
FIG. 30 is a schematic cross-sectional view of a second memory cell of the semiconductor memory device according to the sixth embodiment.

FIG. 29 is a schematic cross-sectional view of the first memory cell of the semiconductor memory device according to the sixth embodiment. FIG. 30 is a schematic cross-sectional view of the second memory cell of the semiconductor memory device according to the sixth embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a structure in which the first memory cell MC1 is turned upside down. Each of the first memory cell MC1 and the second memory cell MC2 includes the transistor 100 and a capacitor 201.

The transistor 100 includes a lower electrode 10, an upper electrode 12, an oxide semiconductor layer 14, a gate electrode 16, a gate insulating layer 18, a first interlayer insulating layer 20, and a second interlayer insulating layer 22. The first interlayer insulating layer 20 and the second interlayer insulating layer 22 are a part of the interlayer insulating layer 260.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

The transistor 100 has the same configuration as the transistor 100 according to the first embodiment.

The capacitor 201 includes a cell electrode 71, a plate electrode 72, and a capacitor insulating film 73. The cell electrode 71 and the plate electrode 72 are, for example, titanium nitride. In addition, the capacitor insulating film 73 has, for example, a stacked structure of zirconium oxide, aluminum oxide, and zirconium oxide.

The cell electrode 71 of the capacitor 201 is connected to, for example, the lower electrode 10. The plate electrode 72 is connected to the plate electrode line PL.

The upper electrode 12 is connected to the bit line BL. The gate electrode 16 is connected to the word line WL.

In addition, in FIGS. 27 to 30, the case where the bit line BL and the upper electrode 12 are simultaneously formed of the same material and the word line WL and the gate electrode 16 are simultaneously formed of the same material is shown as an example. The bit line BL and the upper electrode 12 may be separately formed of different materials, and the word line WL and the gate electrode 16 may be separately formed of different materials.

The word line WLx is electrically connected to the gate electrode 16 of the first memory cell MC1. In addition, the word line WLy is electrically connected to the gate electrode 16 of the second memory cell MC2.

According to the sixth embodiment, by using the transistor 100 according to the first embodiment as a switching transistor of a DRAM, a semiconductor memory having improved memory characteristics is realized.

Seventh Embodiment

A semiconductor device according to a seventh embodiment includes: a first electrode; a second electrode; an oxide semiconductor layer provided between the first electrode and the second electrode; a gate electrode surrounding at least a part of the oxide semiconductor layer; and a gate insulating layer at least a part of which is provided between the gate electrode and the oxide semiconductor layer. In a cross section perpendicular to a first direction from the first electrode to the second electrode, the first electrode surrounds the oxide semiconductor layer and the second electrode surrounds the oxide semiconductor layer.

Figure 31:
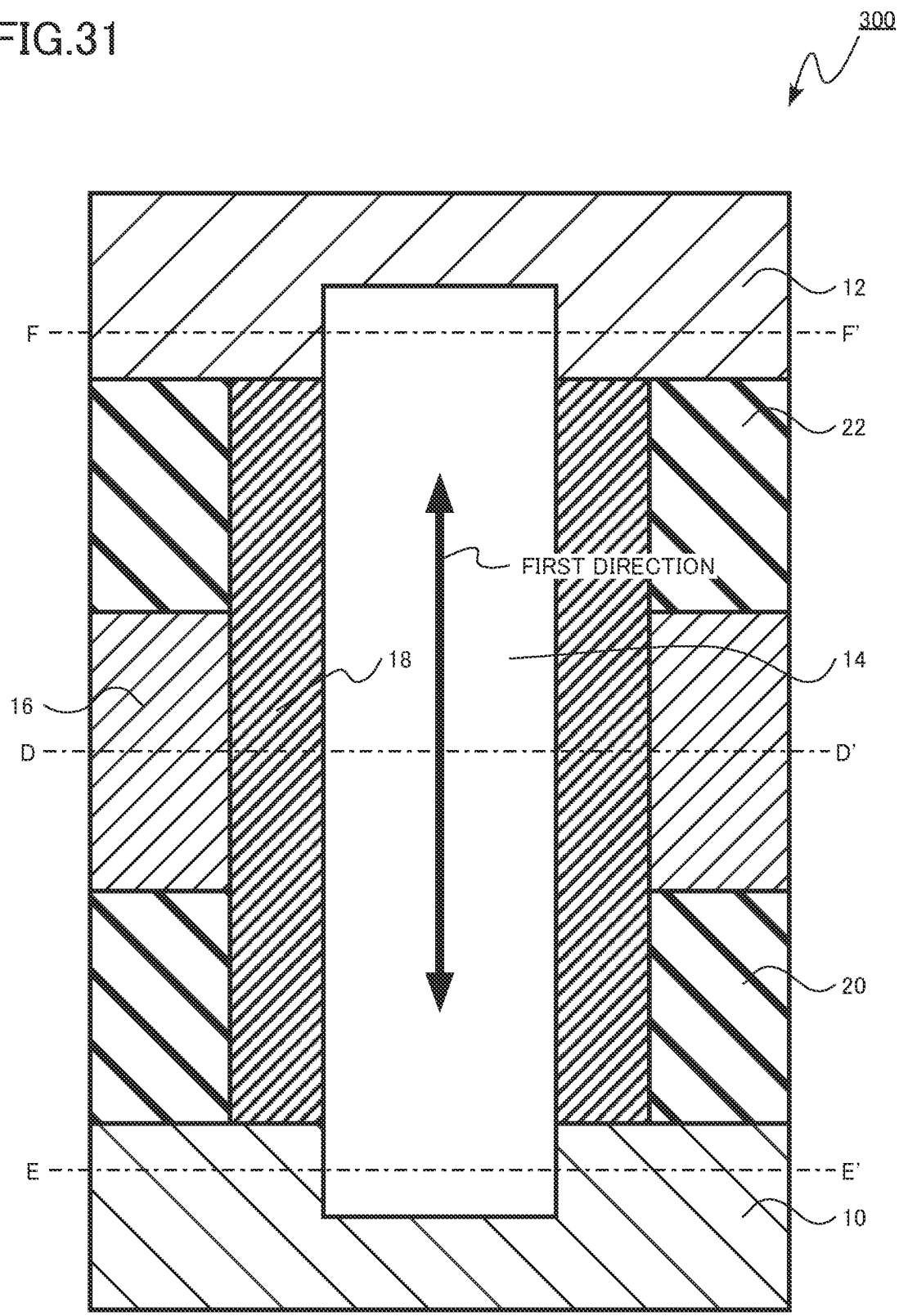
FIG. 31 is a schematic cross-sectional view of a semiconductor device according to a seventh embodiment.
Figure 32:
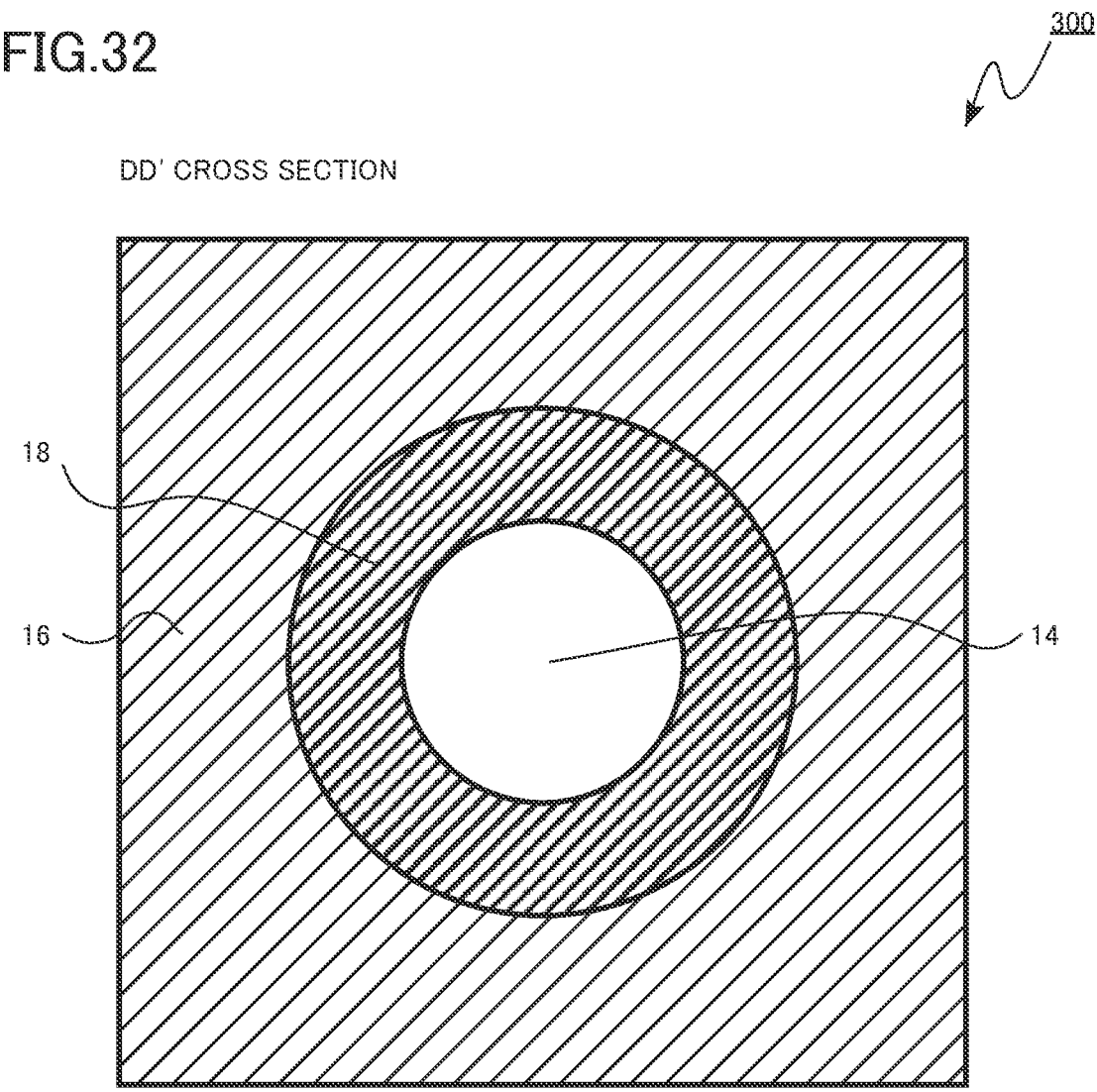
FIG. 32 is a schematic cross-sectional view of the semiconductor device according to the seventh embodiment.
Figure 33:
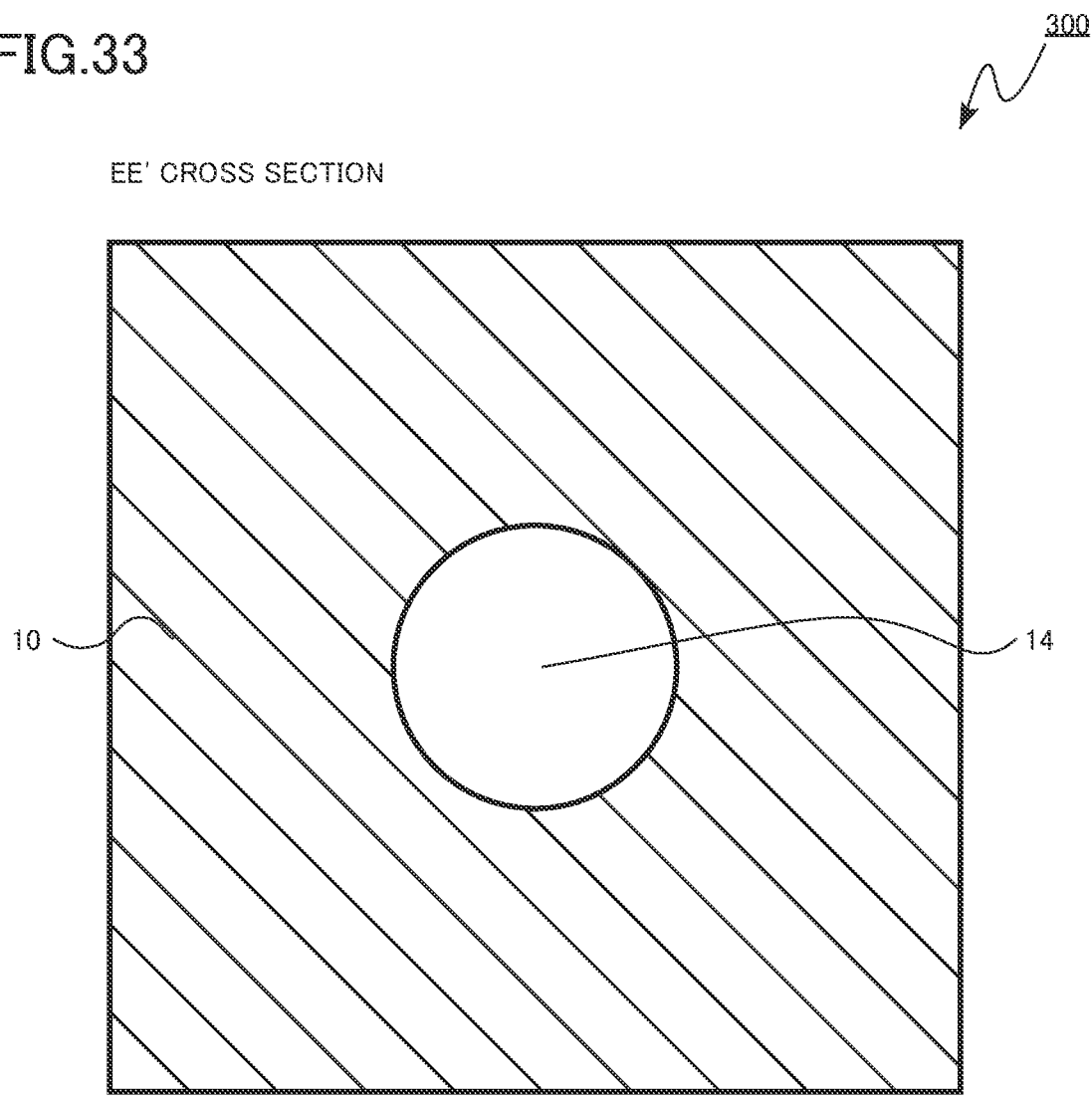
FIG. 33 is a schematic cross-sectional view of the semiconductor device according to the seventh embodiment.
Figure 34:
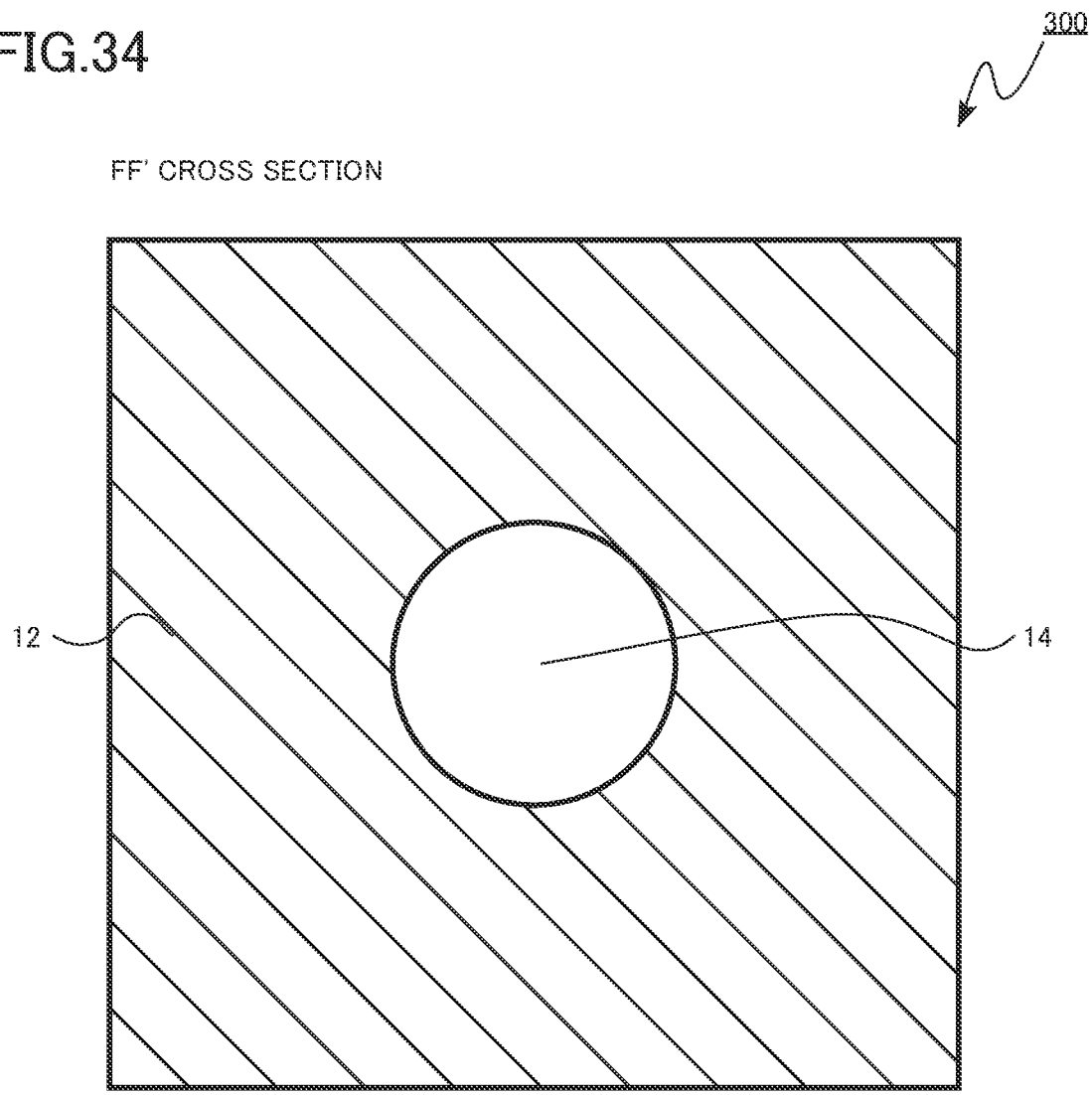
FIG. 34 is a schematic cross-sectional view of the semiconductor device according to the seventh embodiment.

FIGS. 31 to 34 are schematic cross-sectional views of the semiconductor device according to the seventh embodiment. FIG. 32 is a cross-sectional view taken along the line DD' of FIG. 31. FIG. 33 is a cross-sectional view taken along the line EE' of FIG. 31. FIG. 34 is a cross-sectional view taken along the line FF' of FIG. 31.

The semiconductor device according to the seventh embodiment is a transistor 300. The transistor 300 is an oxide semiconductor transistor in which a channel is formed in the oxide semiconductor. The gate electrode of the transistor 300 is provided so as to surround the oxide semiconductor in which the channel is formed. The transistor 300 is a so-called SGT. The transistor 300 is a so-called vertical transistor.

The transistor 300 includes a lower electrode 10, an upper electrode 12, an oxide semiconductor layer 14, a gate electrode 16, a gate insulating layer 18, a first interlayer insulating layer 20, and a second interlayer insulating layer 22. The lower electrode 10 is an example of the first electrode. The upper electrode 12 is an example of the second electrode.

As shown in FIG. 31, a direction from the lower electrode 10 to the upper electrode 12 is defined as the first direction.

The lower electrode 10 functions as a source electrode or a drain electrode of the transistor 300.

The lower electrode 10 is a conductor. The lower electrode 10 contains, for example, an oxide conductor or a metal. The lower electrode 10 is, for example, a metal, a metal nitride, or a metal oxide.

The lower electrode 10 is, for example, an oxide conductor containing oxygen (O) and at least one element selected from the group consisting of indium (In), tin (Sn), zinc (Zn), and titanium (Ti). For example, the lower electrode 10 is an oxide conductor containing indium (In), tin (Sn), and oxygen (O). The lower electrode 10 is, for example, an indium tin oxide. For example, the lower electrode 10 is a metal containing tungsten (W), molybdenum (Mo), copper (Cu), aluminum (Al), titanium (Ti), or tantalum (Ta).

The lower electrode 10 may have, for example, a stacked structure of a plurality of conductors.

The upper electrode 12 functions as a source electrode or a drain electrode of the transistor 300.

The upper electrode 12 is a conductor. The upper electrode 12 contains, for example, an oxide conductor or a metal. The upper electrode 12 is, for example, a metal, a metal nitride, or a metal oxide.

The upper electrode 12 is, for example, an oxide conductor containing oxygen (O) and at least one element selected from the group consisting of indium (In), tin (Sn), zinc (Zn), and titanium (Ti). For example, the upper electrode 12 is an oxide conductor containing indium (In), tin (Sn), and oxygen (O). The upper electrode 12 is, for example, an indium tin oxide. For example, the upper electrode 12 is a metal containing tungsten (W), molybdenum (Mo), copper (Cu), aluminum (Al), titanium (Ti), or tantalum (Ta).

The upper electrode 12 may have, for example, a stacked structure of a plurality of conductors.

For example, the lower electrode 10 and the upper electrode 12 are formed of the same material. For example, the lower electrode 10 and the upper electrode 12 are oxide conductors containing oxygen (O) and at least one element selected from the group consisting of indium (In), tin (Sn), zinc (Zn), and titanium (Ti). For example, the lower electrode 10 and the upper electrode 12 are oxide conductors containing indium (In), tin (Sn), and oxygen (O).

The oxide semiconductor layer 14 is provided between the lower electrode 10 and the upper electrode 12. The oxide semiconductor layer 14 is in contact with, for example, the lower electrode 10. The oxide semiconductor layer 14 is in contact with, for example, the upper electrode 12.

A channel serving as a current path is formed in the oxide semiconductor layer 14 when the transistor 300 is turned on.

The oxide semiconductor layer 14 is an oxide semiconductor. The oxide semiconductor layer 14 is, for example, amorphous.

The oxide semiconductor layer 14 contains, for example, zinc (Zn) and at least one element selected from the group consisting of indium (In), gallium (Ga), and aluminum (Al).

The oxide semiconductor layer 14 includes, for example, oxygen vacancies. The oxygen vacancies in the oxide semiconductor layer 14 function as donors.

The length of the oxide semiconductor layer 14 in the first direction is, for example, equal to or more than 80 nm and equal to or less than 200 nm. The width of the oxide semiconductor layer 14 in the direction perpendicular to the first direction is, for example, equal to or more than 20 nm and equal to or less than 100 nm.

As shown in FIG. 32, the gate electrode 16 is provided so as to surround the oxide semiconductor layer 14. The gate electrode 16 surrounds at least a part of the oxide semiconductor layer 14. The gate electrode 16 is provided around the oxide semiconductor layer 14.

The gate electrode 16 includes, for example, a metal, a metal compound, or a semiconductor. The gate electrode 16 includes, for example, tungsten (W). The length of the gate electrode 16 in the first direction is, for example, equal to or more than 20 nm and equal to or less than 100 nm. The length of the gate electrode 16 in the first direction is the gate length of the transistor 300.

The gate electrode 16 is, for example, a metal, a metal compound, or a semiconductor. The gate electrode 16 is, for example, tungsten (W).

The gate insulating layer 18 is provided between the gate electrode 16 and the oxide semiconductor layer 14. At least a part of the gate insulating layer 18 is provided between the gate electrode 16 and the oxide semiconductor layer 14. The gate insulating layer 18 is provided so as to surround the oxide semiconductor layer 14.

The gate insulating layer 18 contains, for example, oxide, nitride, or oxynitride. The gate insulating layer 18 contains, for example, silicon oxide, silicon nitride, silicon oxynitride, or aluminum oxide. The gate insulating layer 18 is, for example, a silicon oxide layer, a silicon nitride layer, a silicon oxynitride layer, or an aluminum oxide layer. The thickness of the gate insulating layer 18 is, for example, equal to or more than 3 nm and equal to or less than 10 nm.

The first interlayer insulating layer 20 is provided between the lower electrode 10 and the gate electrode 16. The first interlayer insulating layer 20 is provided around the oxide semiconductor layer 14.

The first interlayer insulating layer 20 is, for example, an oxide, a nitride, or an oxynitride. The first interlayer insulating layer 20 is, for example, a silicon oxide.

The second interlayer insulating layer 22 is provided between the upper electrode 12 and the gate electrode 16. The second interlayer insulating layer 22 is provided around the oxide semiconductor layer 14.

The second interlayer insulating layer 22 is, for example, an oxide, a nitride, or an oxynitride. The second interlayer insulating layer 22 is, for example, a silicon oxide.

As shown in FIG. 33, the lower electrode 10 surrounds the oxide semiconductor layer 14 in a cross section perpendicular to the first direction from the lower electrode 10 to the upper electrode 12. In addition, as shown in FIG. 34, the upper electrode 12 surrounds the oxide semiconductor layer 14 in a cross section perpendicular to the first direction.

Next, the function and effect of the semiconductor device according to the seventh embodiment will be described.

Figure 35:
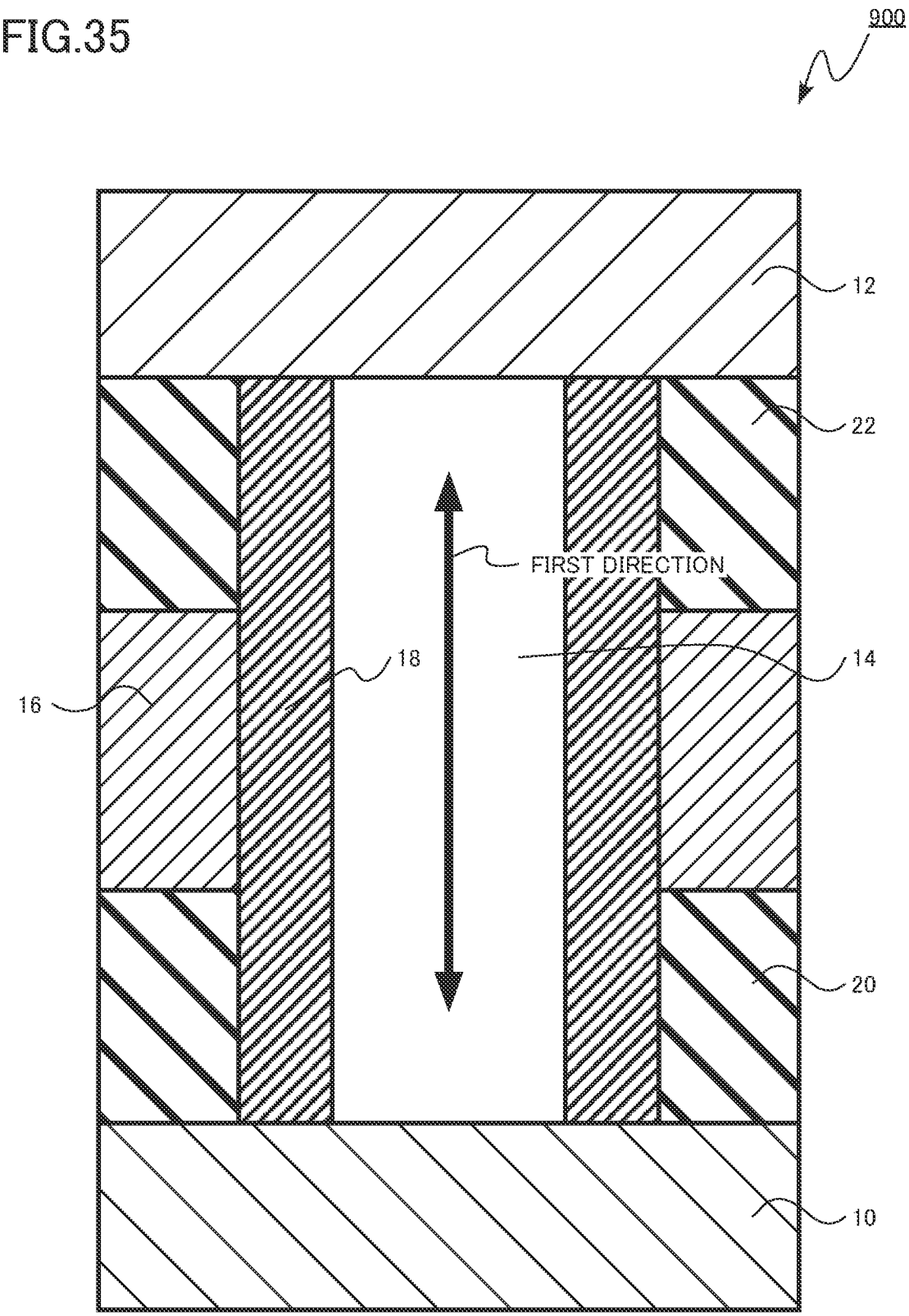
FIG. 35 is a schematic cross-sectional view of a semiconductor device of a comparative example.

FIG. 35 is a schematic cross-sectional view of the semiconductor device of the comparative example. The semiconductor device of the comparative example is a transistor 900. The transistor 900 is an oxide semiconductor transistor in which a channel is formed in the oxide semiconductor. The gate electrode of the transistor 900 is provided so as to surround the oxide semiconductor in which the channel is formed. The transistor 900 is a so-called SGT. The transistor 900 is a so-called vertical transistor.

The transistor 900 is different from the transistor 300 according to the seventh embodiment in that the lower electrode 10 does not surround the oxide semiconductor layer 14 and the upper electrode 12 does not surround the oxide semiconductor layer 14 in a cross section perpendicular to the first direction from the lower electrode 10 to the upper electrode 12.

In the transistor 300, the lower electrode 10 surrounds the oxide semiconductor layer 14. For this reason, the contact area between the oxide semiconductor layer 14 and the lower electrode 10 of the transistor 300 is larger than the contact area between the oxide semiconductor layer 14 and the lower electrode 10 of the transistor 900. Therefore, the contact resistance between the oxide semiconductor layer 14 and the lower electrode 10 of the transistor 300 is smaller than the contact resistance between the oxide semiconductor layer 14 and the lower electrode 10 of the transistor 900.

Similarly, in the transistor 300, the upper electrode 12 surrounds the oxide semiconductor layer 14. For this reason, the contact area between the oxide semiconductor layer 14 and the upper electrode 12 of the transistor 300 is larger than the contact area between the oxide semiconductor layer 14 and the upper electrode 12 of the transistor 900. Therefore, the contact resistance between the oxide semiconductor layer 14 and the upper electrode 12 of the transistor 300 is smaller than the contact resistance between the oxide semiconductor layer 14 and the upper electrode 12 of the transistor 900.

By reducing the contact resistance between the oxide semiconductor layer 14 and the lower electrode 10 and the contact resistance between the oxide semiconductor layer 14 and the upper electrode 12, the parasitic resistance of the transistor 300 is reduced and accordingly, the on-resistance of the transistor 300 is reduced.

As described above, in the transistor 300 according to the seventh embodiment, the parasitic resistance is reduced and accordingly, the on-resistance is reduced.

From the viewpoint of improving the symmetry of the transistor characteristics, it is preferable that the lower electrode 10 and the upper electrode 12 are formed of the same material.

First Modification Example

Figure 36:
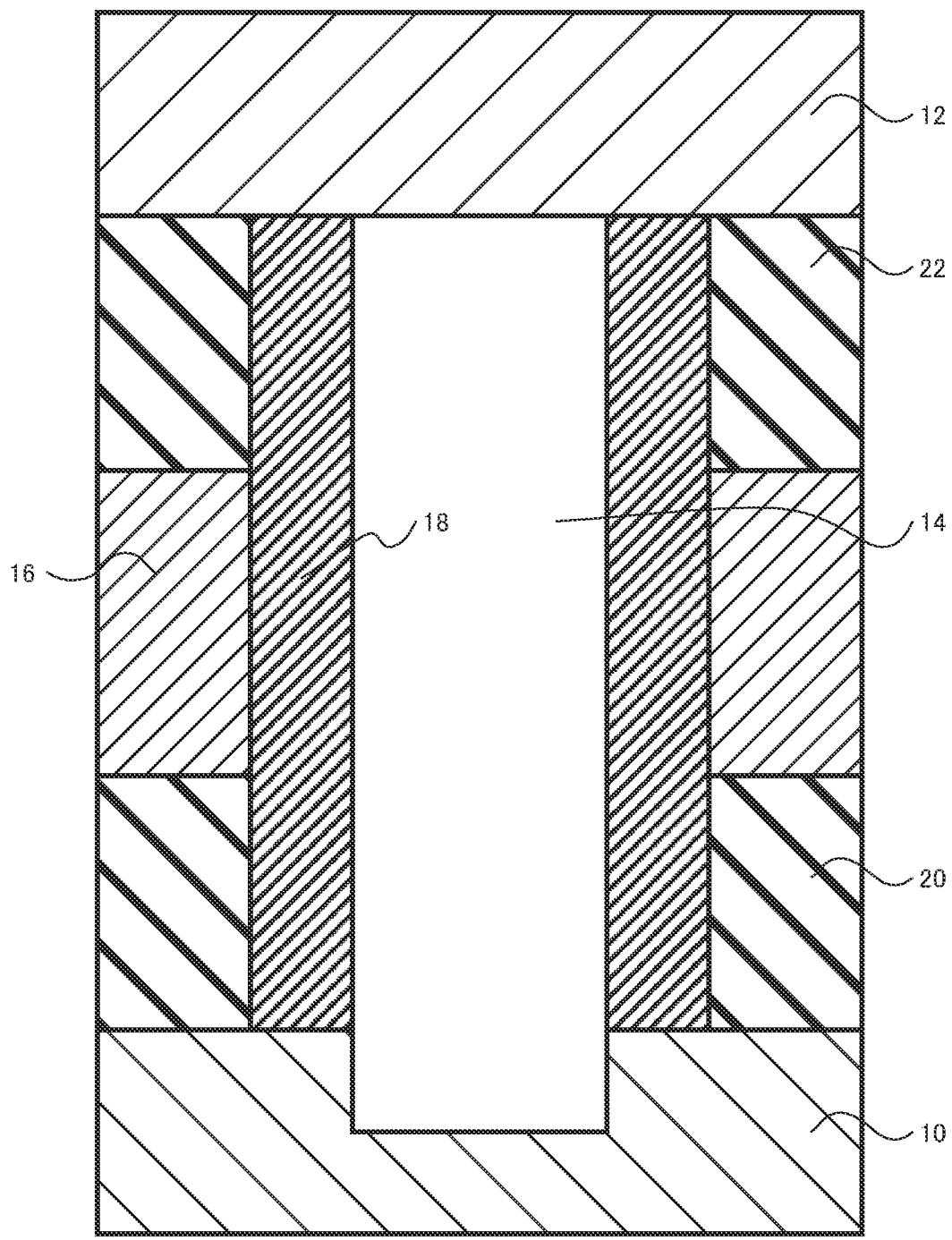
FIG. 36 is a schematic cross-sectional view of a semiconductor device of a first modification example of the seventh embodiment.

FIG. 36 is a schematic cross-sectional view of a semiconductor device of a first modification example of the seventh embodiment. FIG. 36 is a diagram corresponding to FIG. 31 of the seventh embodiment.

The transistor of the first modification example of the seventh embodiment is different from the transistor 300 according to the seventh embodiment in that the upper electrode 12 does not surround the oxide semiconductor layer 14 in a cross section perpendicular to the first direction from the lower electrode 10 to the upper electrode 12.

Second Modification Example

Figure 37:
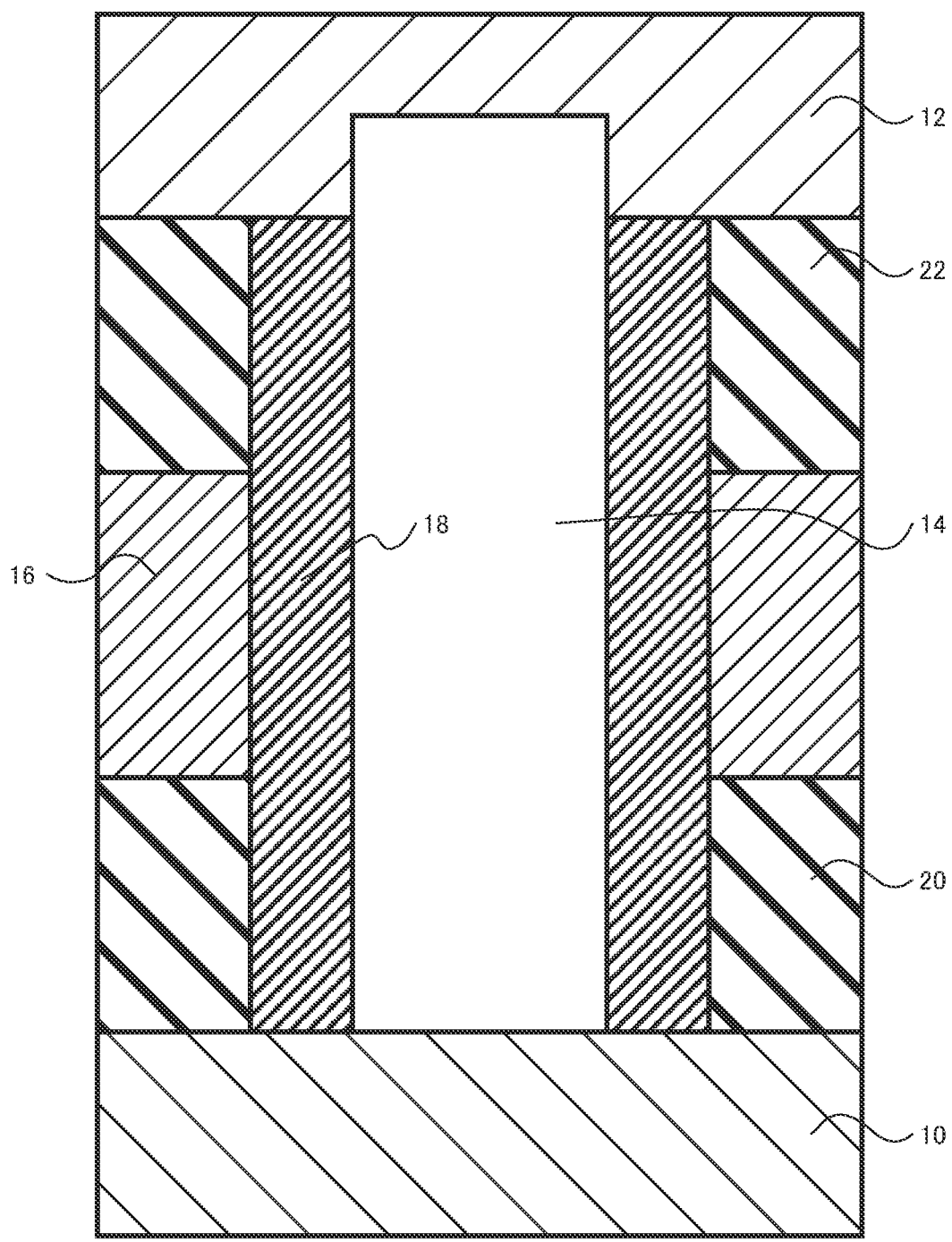
FIG. 37 is a schematic cross-sectional view of a semiconductor device of a second modification example of the seventh embodiment.

FIG. 37 is a schematic cross-sectional view of a semiconductor device of a second modification example of the seventh embodiment. FIG. 37 is a diagram corresponding to FIG. 31 of the seventh embodiment.

The transistor of the second modification example of the seventh embodiment is different from the transistor 300 according to the seventh embodiment in that the lower electrode 10 does not surround the oxide semiconductor layer 14 in a cross section perpendicular to the first direction from the lower electrode 10 to the upper electrode 12.

Third Modification Example

Figure 38:
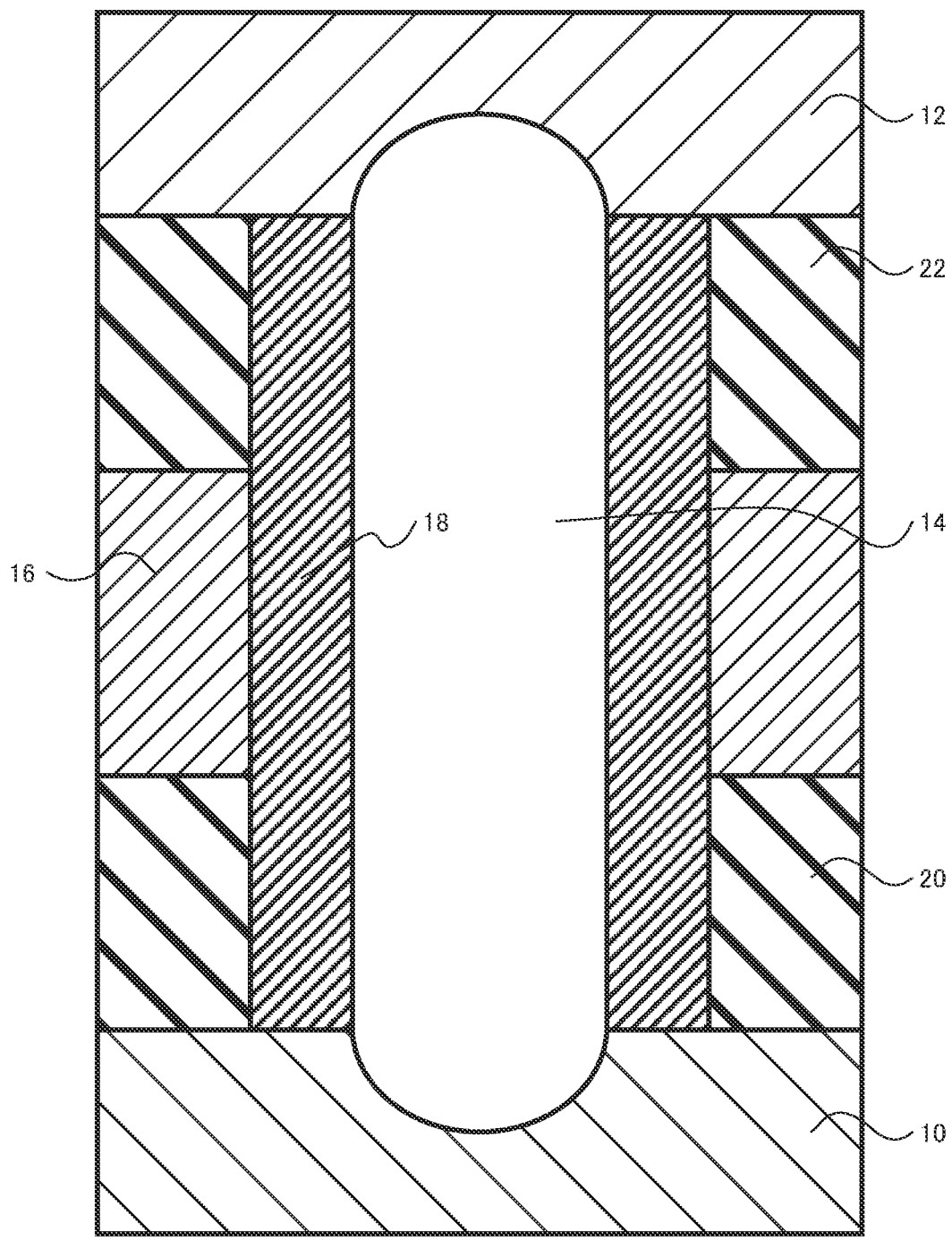
FIG. 38 is a schematic cross-sectional view of a semiconductor device of a third modification example of the seventh embodiment.

FIG. 38 is a schematic cross-sectional view of a semiconductor device of a third modification example of the seventh embodiment. FIG. 38 is a diagram corresponding to FIG. 31 of the seventh embodiment.

The transistor of the third modification example of the seventh embodiment is different from the transistor 300 according to the seventh embodiment in that the interface between the lower electrode 10 and the oxide semiconductor layer 14 and the interface between the upper electrode 12 and the oxide semiconductor layer 14 are curved surfaces.

Fourth Modification Example

Figure 39:
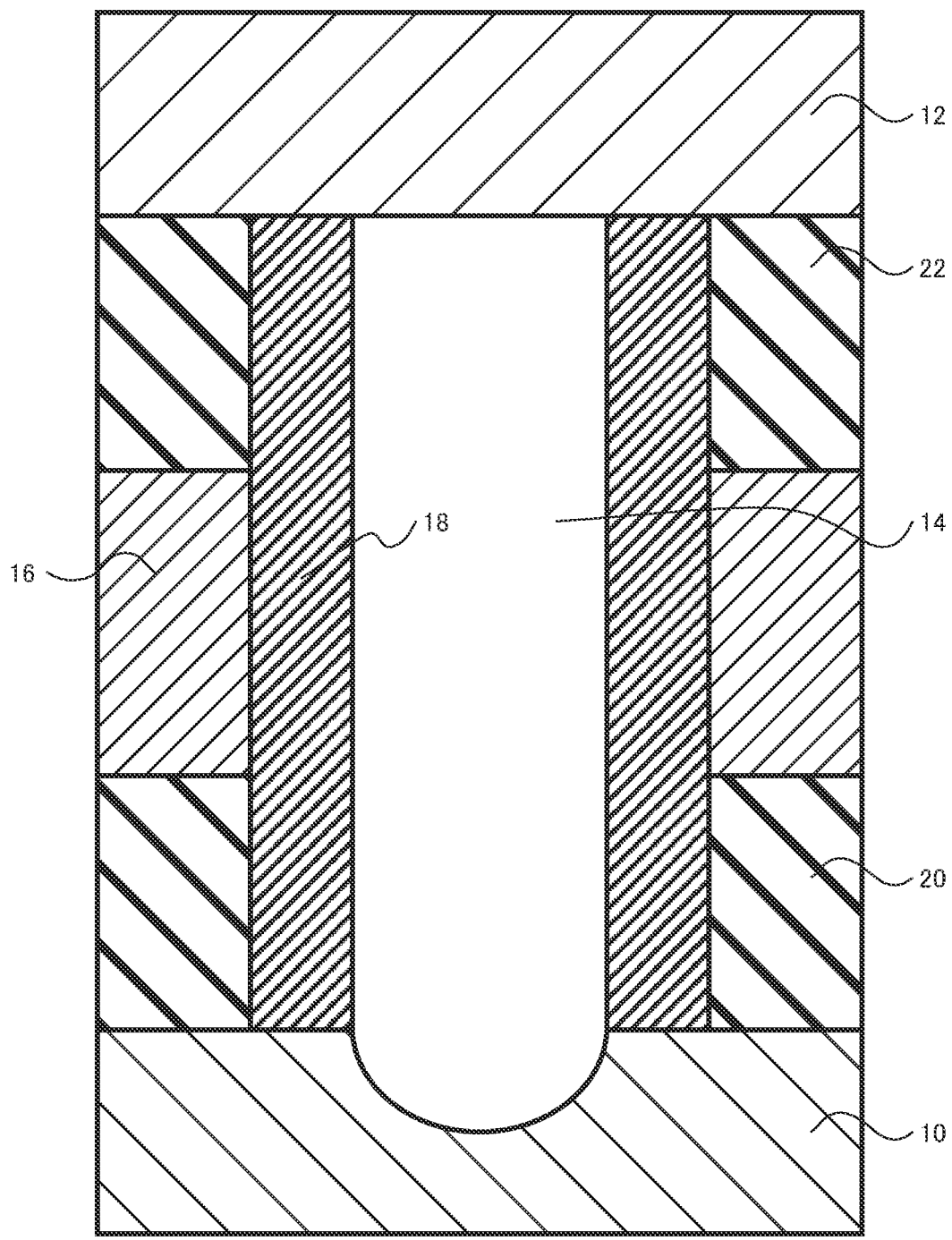
FIG. 39 is a schematic cross-sectional view of a semiconductor device of a fourth modification example of the seventh embodiment.

FIG. 39 is a schematic cross-sectional view of a semiconductor device of a fourth modification example of the seventh embodiment. FIG. 39 is a diagram corresponding to FIG. 31 of the seventh embodiment.

The transistor of the fourth modification example of the seventh embodiment is different from the transistor of the third modification example of the seventh embodiment in that the upper electrode 12 does not surround the oxide semiconductor layer 14 in a cross section perpendicular to the first direction from the lower electrode 10 to the upper electrode 12.

Fifth Modification Example

Figure 40:
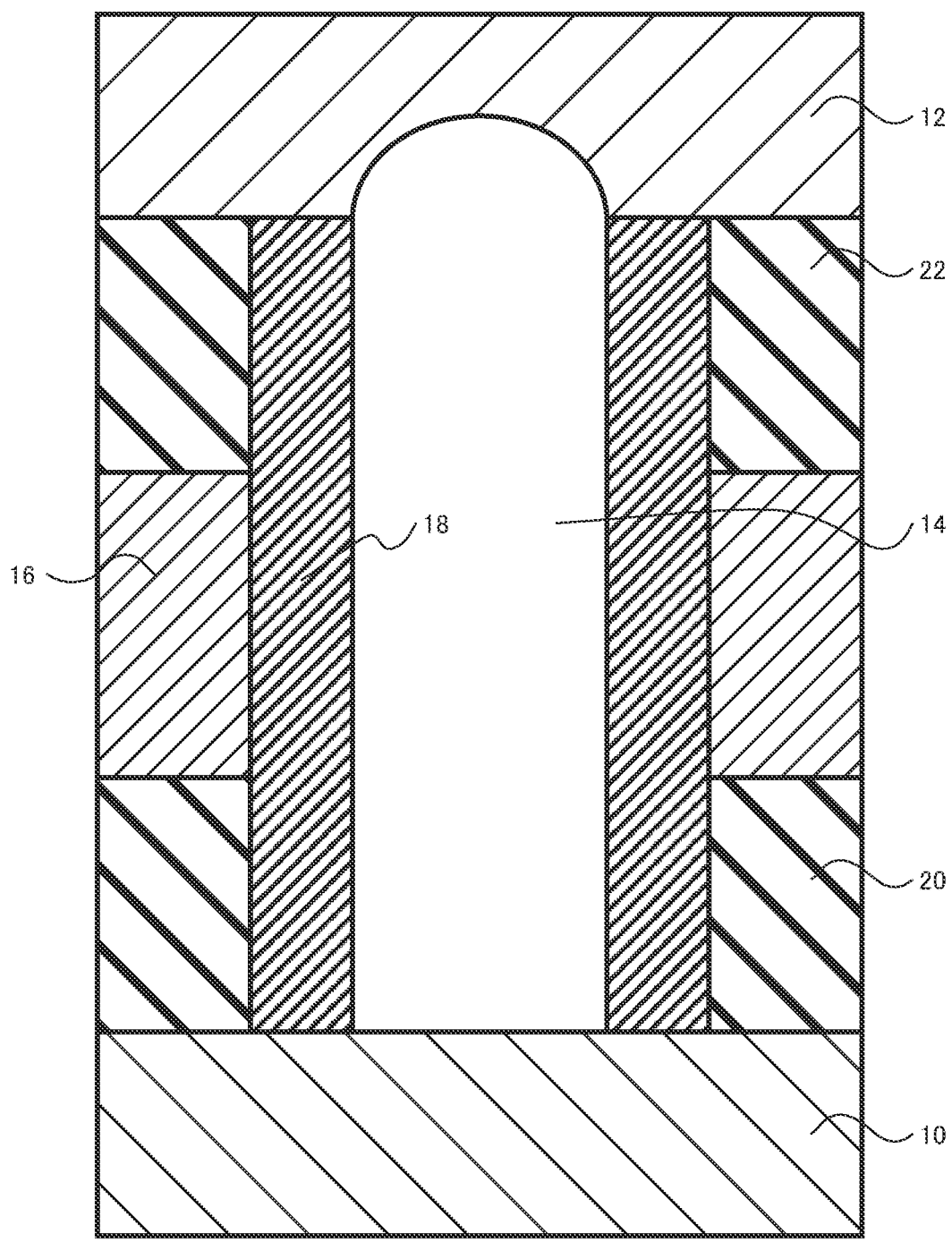
FIG. 40 is a schematic cross-sectional view of a semiconductor device of a fifth modification example of the seventh embodiment.

FIG. 40 is a schematic cross-sectional view of a semiconductor device of a fifth modification example of the seventh embodiment. FIG. 40 is a diagram corresponding to FIG. 31 of the seventh embodiment.

The transistor of the fifth modification example of the seventh embodiment is different from the transistor of the third modification example of the seventh embodiment in that the lower electrode 10 does not surround the oxide semiconductor layer 14 in a cross section perpendicular to the first direction from the lower electrode 10 to the upper electrode 12.

As described above, according to the seventh embodiment and its modification examples, it is possible to realize a transistor whose on-resistance can be reduced.

Eighth Embodiment

A semiconductor device according to an eighth embodiment is different from the semiconductor device according to the seventh embodiment in that the first electrode is surrounded by the oxide semiconductor layer and the second electrode is surrounded by the oxide semiconductor layer. Hereinafter, the description of a part of the content overlapping the seventh embodiment may be omitted.

Figure 41:
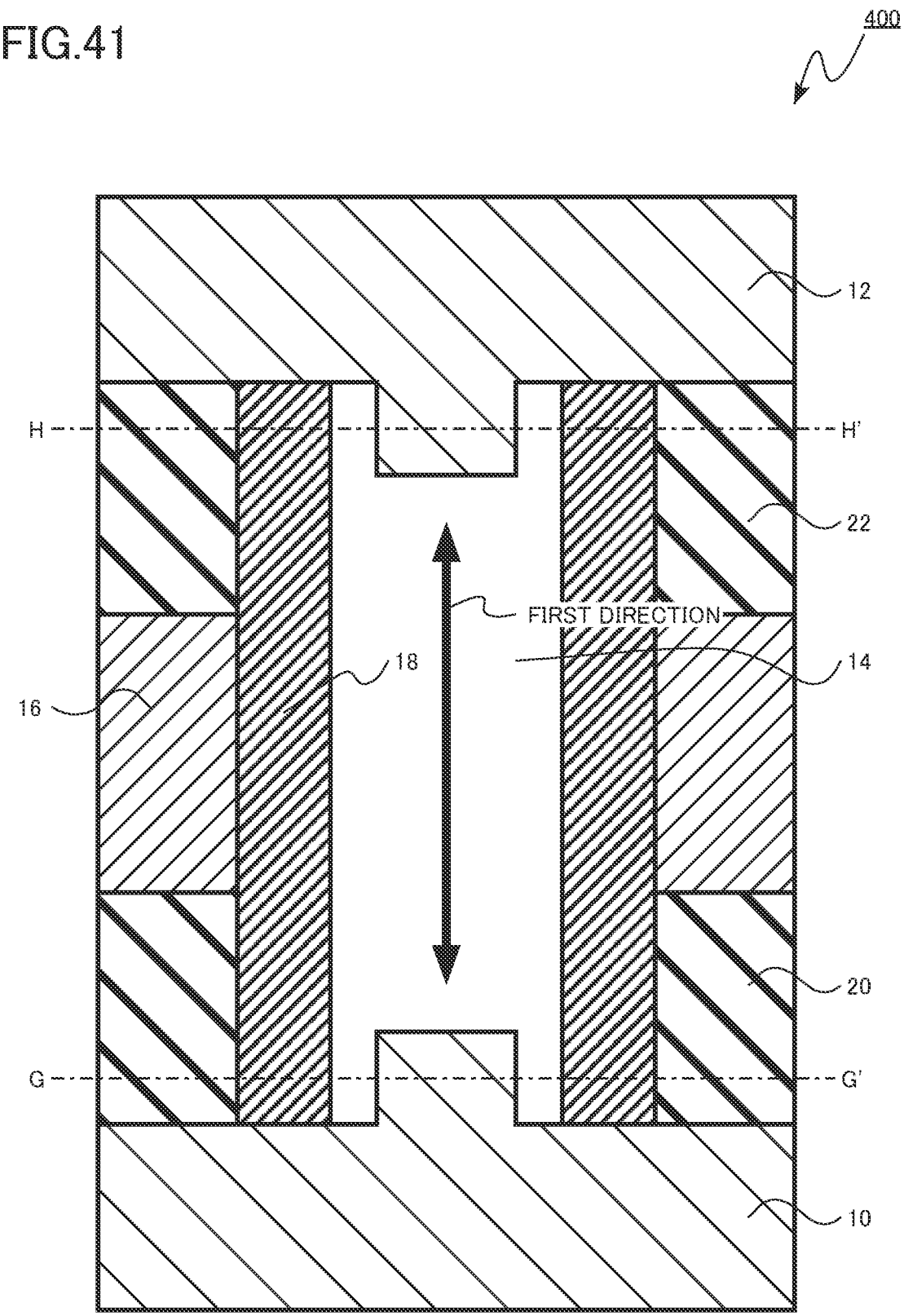
FIG. 41 is a schematic cross-sectional view of a semiconductor device according to an eighth embodiment.
Figure 42:
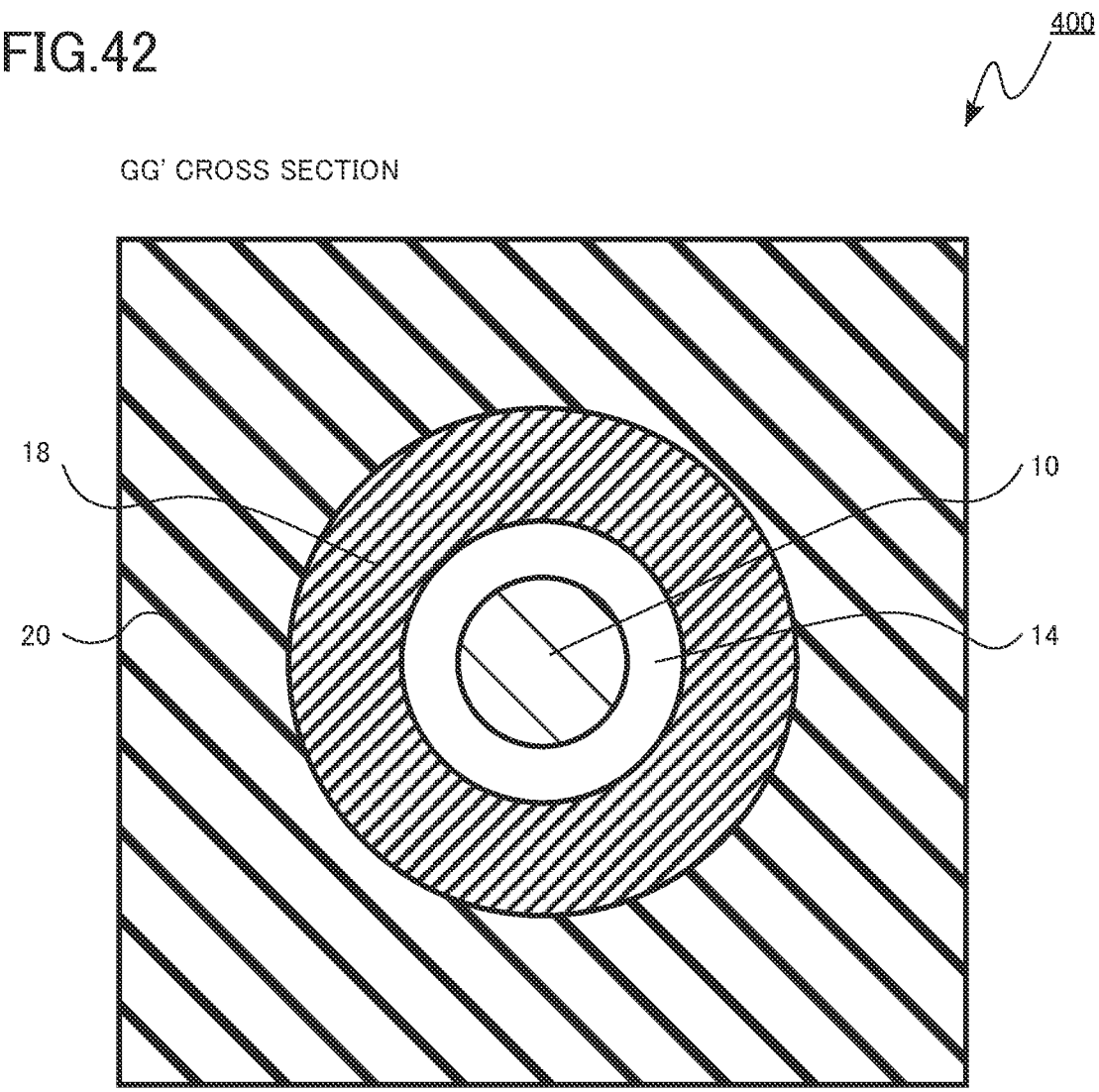
FIG. 42 is a schematic cross-sectional view of a semiconductor device according to an eighth embodiment.
Figure 43:
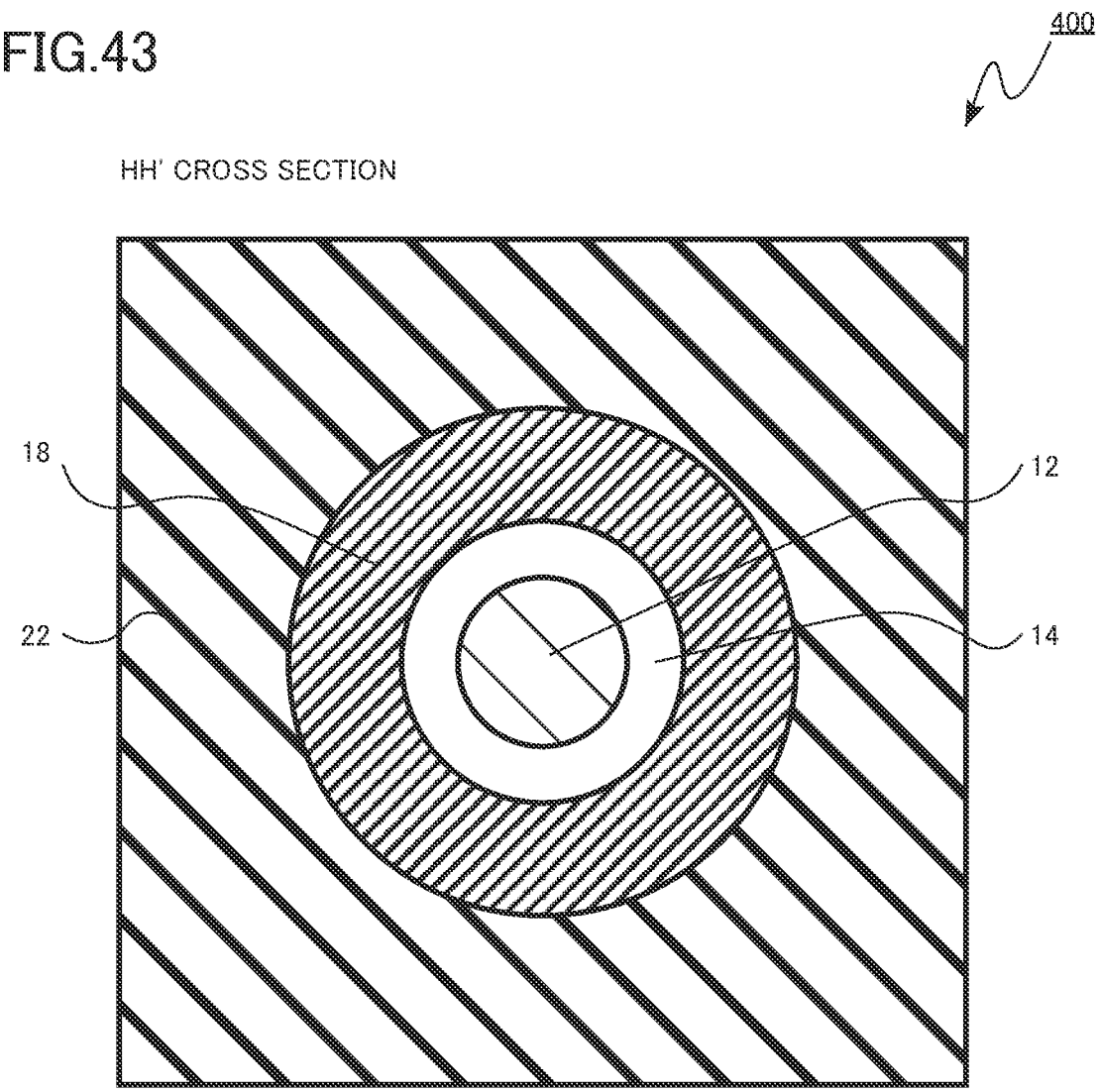
FIG. 43 is a schematic cross-sectional view of the semiconductor device according to the eighth embodiment.

FIGS. 41, 42, and 43 are schematic cross-sectional views of the semiconductor device according to the eighth embodiment. FIG. 42 is a cross-sectional view taken along the line GG' of FIG. 41. FIG. 43 is a cross-sectional view taken along the line HH' of FIG. 41.

The semiconductor device according to the eighth embodiment is a transistor 400. The transistor 400 is an oxide semiconductor transistor in which a channel is formed in the oxide semiconductor. The gate electrode of the transistor 400 is provided so as to surround the oxide semiconductor in which the channel is formed. The transistor 400 is a so-called SGT. The transistor 400 is a so-called vertical transistor.

The transistor 400 includes a lower electrode 10, an upper electrode 12, an oxide semiconductor layer 14, a gate electrode 16, a gate insulating layer 18, a first interlayer insulating layer 20, and a second interlayer insulating layer 22. The lower electrode 10 is an example of the first electrode. The upper electrode 12 is an example of the second electrode.

As shown in FIG. 41, a direction from the lower electrode 10 to the upper electrode 12 is defined as the first direction.

As shown in FIG. 42, the oxide semiconductor layer 14 surrounds the lower electrode 10 in a cross section perpendicular to the first direction from the lower electrode 10 to the upper electrode 12. In addition, as shown in FIG. 43, the oxide semiconductor layer 14 surrounds the upper electrode 12 in a cross section perpendicular to the first direction.

Next, the function and effect of the semiconductor device according to the eighth embodiment will be described.

The transistor 900 according to the seventh embodiment shown in FIG. 35 is used as a comparative example.

The transistor 900 is different from the transistor 400 according to the eighth embodiment in that the lower electrode 10 is not surrounded by the oxide semiconductor layer 14 and the upper electrode 12 is not surrounded by the oxide semiconductor layer 14 in a cross section perpendicular to the first direction from the lower electrode 10 to the upper electrode 12.

In the transistor 400, the lower electrode 10 is surrounded by the oxide semiconductor layer 14. For this reason, the contact area between the oxide semiconductor layer 14 and the lower electrode 10 of the transistor 400 is larger than the contact area between the oxide semiconductor layer 14 and the lower electrode 10 of the transistor 900. Therefore, the contact resistance between the oxide semiconductor layer 14 and the lower electrode 10 of the transistor 400 is smaller than the contact resistance between the oxide semiconductor layer 14 and the lower electrode 10 of the transistor 900.

Similarly, in the transistor 400, the oxide semiconductor layer 14 surrounds the upper electrode 12. For this reason, the contact area between the oxide semiconductor layer 14 and the upper electrode 12 of the transistor 400 is larger than the contact area between the oxide semiconductor layer 14 and the upper electrode 12 of the transistor 900. Therefore, the contact resistance between the oxide semiconductor layer 14 and the upper electrode 12 of the transistor 400 is smaller than the contact resistance between the oxide semiconductor layer 14 and the upper electrode 12 of the transistor 900.

By reducing the contact resistance between the oxide semiconductor layer 14 and the lower electrode 10 and the contact resistance between the oxide semiconductor layer 14 and the upper electrode 12, the parasitic resistance of the transistor 400 is reduced and accordingly, the on-resistance of the transistor 400 is reduced.

As described above, in the transistor 400 according to the eighth embodiment, the parasitic resistance is reduced and accordingly, the on-resistance is reduced.

From the viewpoint of improving the symmetry of the transistor characteristics, it is preferable that the lower electrode 10 and the upper electrode 12 are formed of the same material.

First Modification Example

Figure 44:
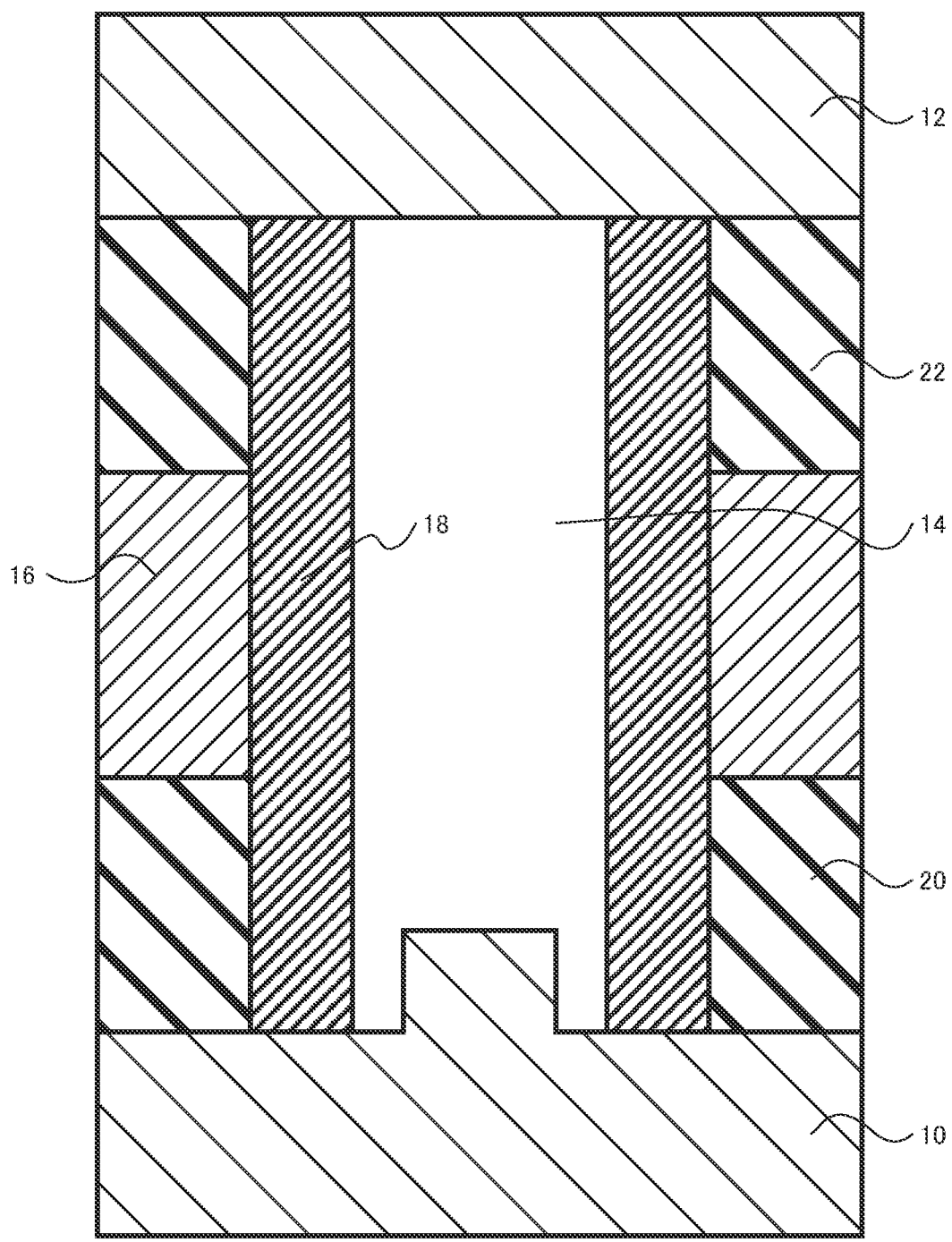
FIG. 44 is a schematic cross-sectional view of a semiconductor device of a first modification example of the eighth embodiment.

FIG. 44 is a schematic cross-sectional view of a semiconductor device of a first modification example of the eighth embodiment. FIG. 44 is a diagram corresponding to FIG. 41 of the eighth embodiment.

The transistor of the first modification example of the eighth embodiment is different from the transistor 400 according to the eighth embodiment in that the upper electrode 12 is not surrounded by the oxide semiconductor layer 14 in a cross section perpendicular to the first direction from the lower electrode 10 to the upper electrode 12.

Second Modification Example

Figure 45:
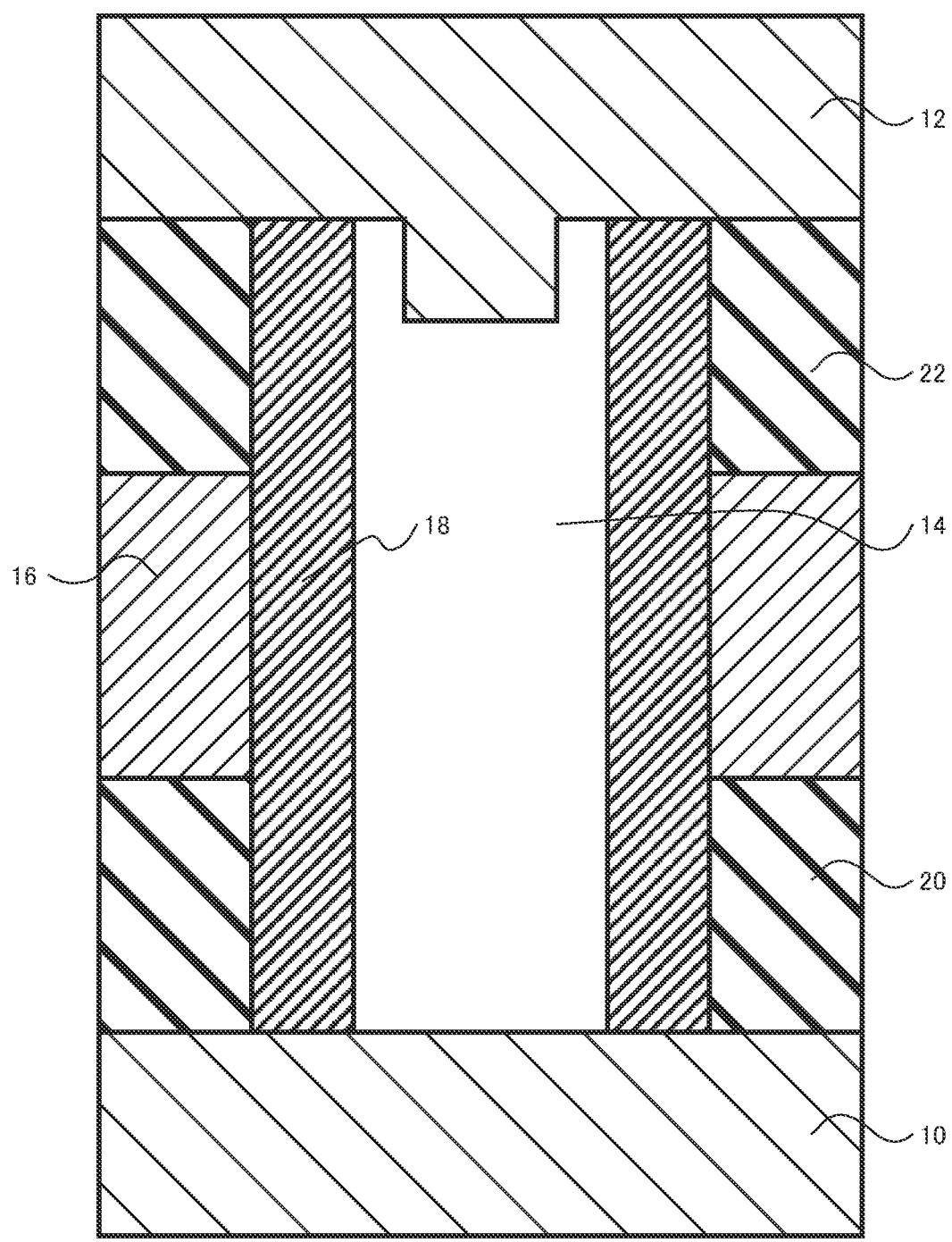
FIG. 45 is a schematic cross-sectional view of a semiconductor device of a second modification example of the eighth embodiment.

FIG. 45 is a schematic cross-sectional view of a semiconductor device of a second modification example of the eighth embodiment. FIG. 45 is a diagram corresponding to FIG. 41 of the eighth embodiment.

The transistor of the second modification example of the eighth embodiment is different from the transistor 400 according to the eighth embodiment in that the lower electrode 10 is not surrounded by the oxide semiconductor layer 14 in a cross section perpendicular to the first direction from the lower electrode 10 to the upper electrode 12.

Third Modification Example

Figure 46:
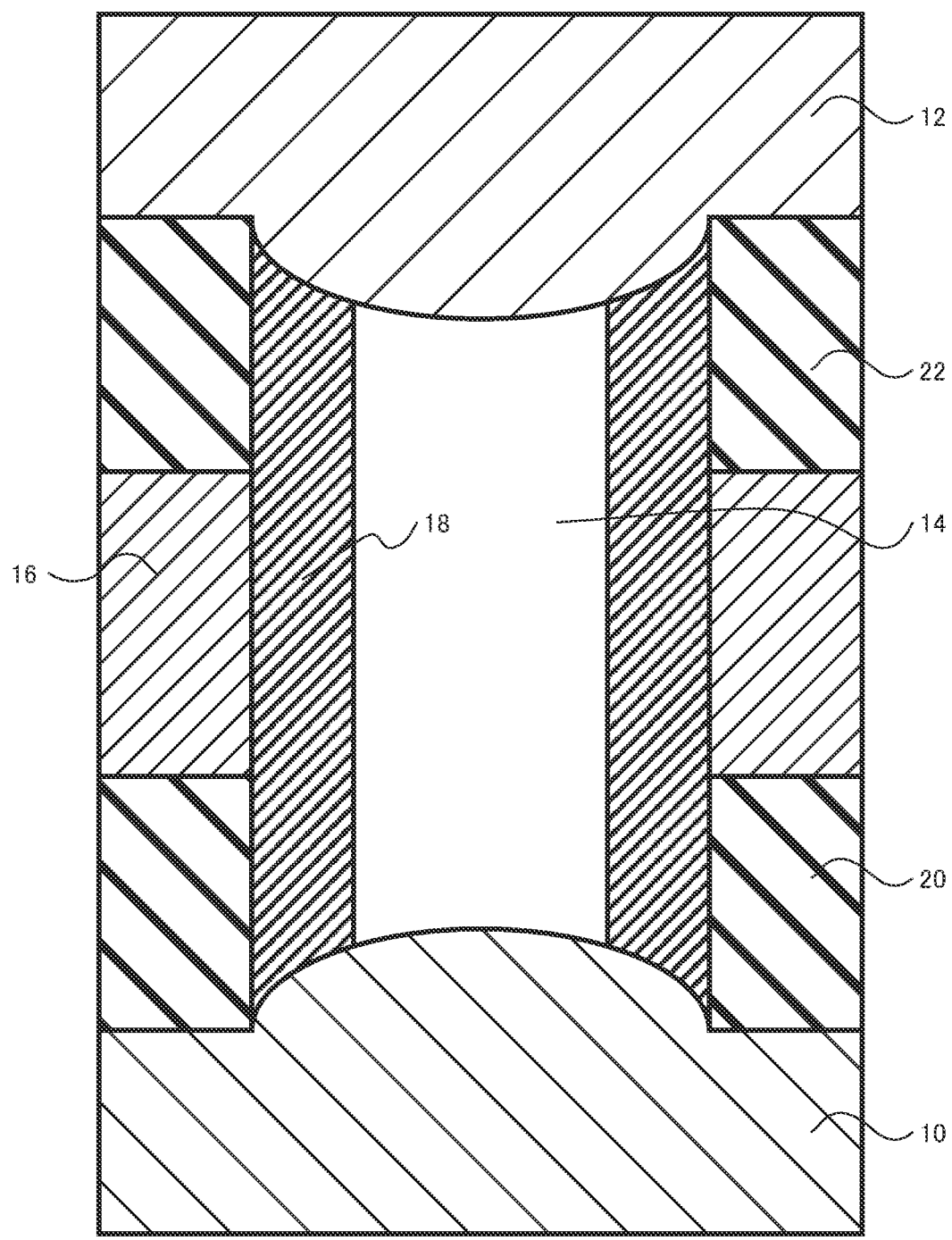
FIG. 46 is a schematic cross-sectional view of a semiconductor device of a third modification example of the eighth embodiment.

FIG. 46 is a schematic cross-sectional view of a semiconductor device of a third modification example of the eighth embodiment. FIG. 46 is a diagram corresponding to FIG. 41 of the eighth embodiment.

The transistor of the third modification example of the eighth embodiment is different from the transistor 400 according to the eighth embodiment in that the interface between the lower electrode 10 and the oxide semiconductor layer 14 and the interface between the upper electrode 12 and the oxide semiconductor layer 14 are curved surfaces.

Fourth Modification Example

Figure 47:
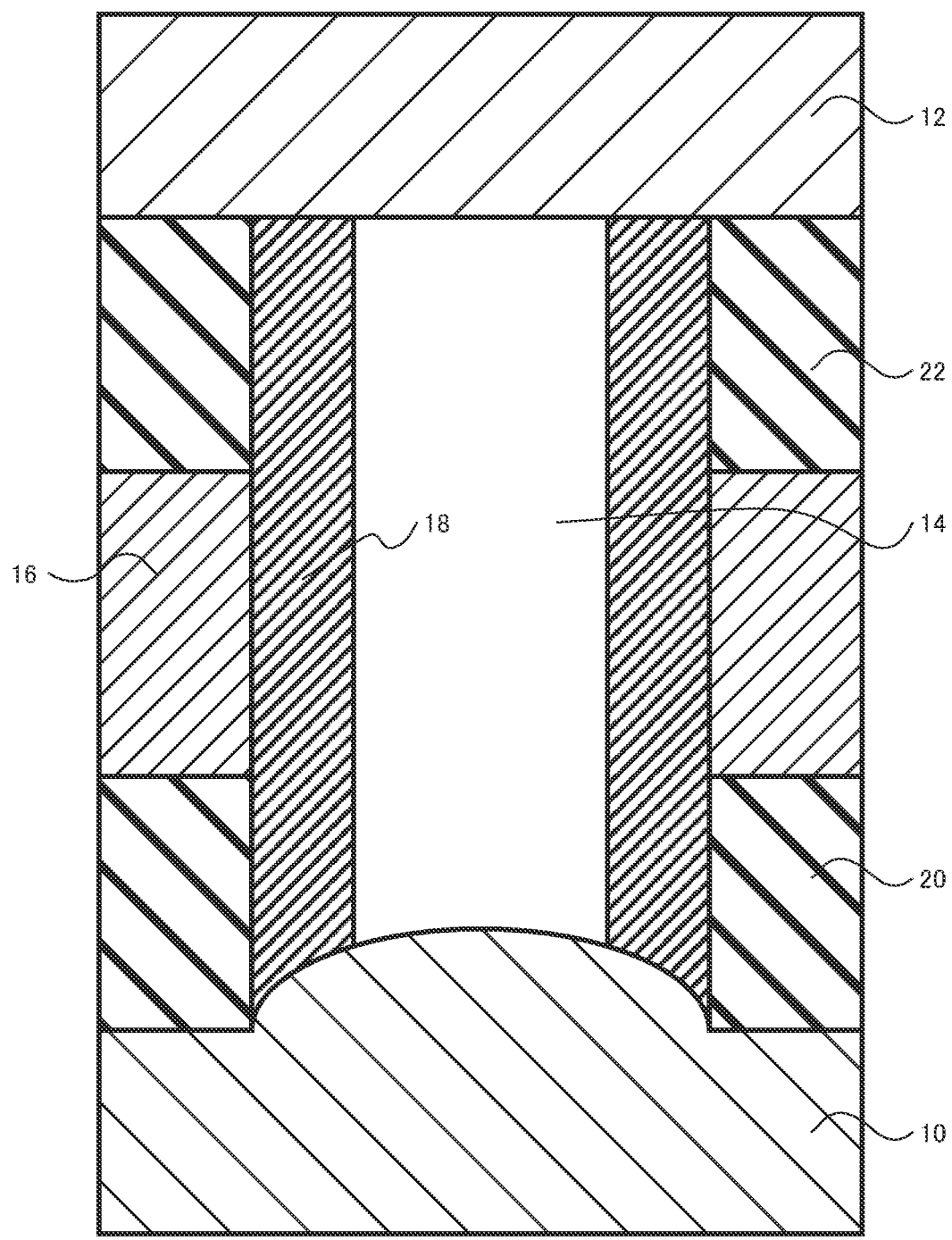
FIG. 47 is a schematic cross-sectional view of a semiconductor device of a fourth modification example of the eighth embodiment.

FIG. 47 is a schematic cross-sectional view of a semiconductor device of a fourth modification example of the eighth embodiment. FIG. 47 is a diagram corresponding to FIG. 41 of the eighth embodiment.

The transistor of the fourth modification example of the eighth embodiment is different from the transistor of the third modification example of the eighth embodiment in that the upper electrode 12 is not surrounded by the oxide semiconductor layer 14 in a cross section perpendicular to the first direction from the lower electrode 10 to the upper electrode 12.

Fifth Modification Example

Figure 48:
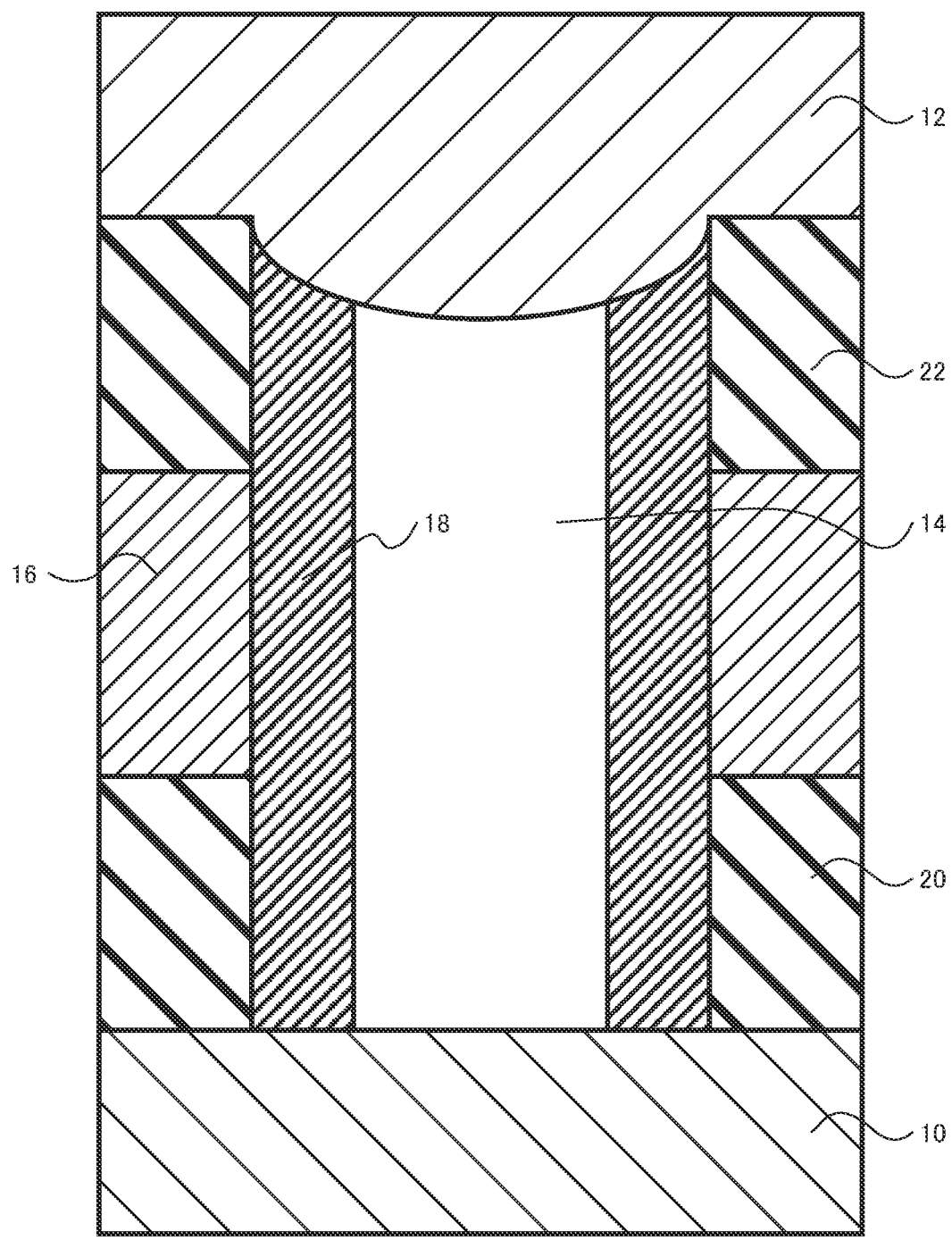
FIG. 48 is a schematic cross-sectional view of a semiconductor device of a fifth modification example of the eighth embodiment.

FIG. 48 is a schematic cross-sectional view of a semiconductor device of a fifth modification example of the eighth embodiment. FIG. 48 is a diagram corresponding to FIG. 41 of the eighth embodiment.

The transistor of the fifth modification example of the eighth embodiment is different from the transistor of the third modification example of the eighth embodiment in that the lower electrode 10 is not surrounded by the oxide semiconductor layer 14 in a cross section perpendicular to the first direction from the lower electrode 10 to the upper electrode 12.

As described above, according to the eighth embodiment and its modification examples, it is possible to realize a transistor whose on-resistance can be reduced.

Ninth Embodiment

A semiconductor memory device according to a ninth embodiment is different from the semiconductor memory device according to the sixth embodiment in that the semiconductor memory device according to the ninth embodiment includes a capacitor electrically connected to the first electrode or the second electrode of the semiconductor device according to the seventh embodiment. Hereinafter, the description of a part of the content overlapping the sixth and seventh embodiments may be omitted.

Figure 49:
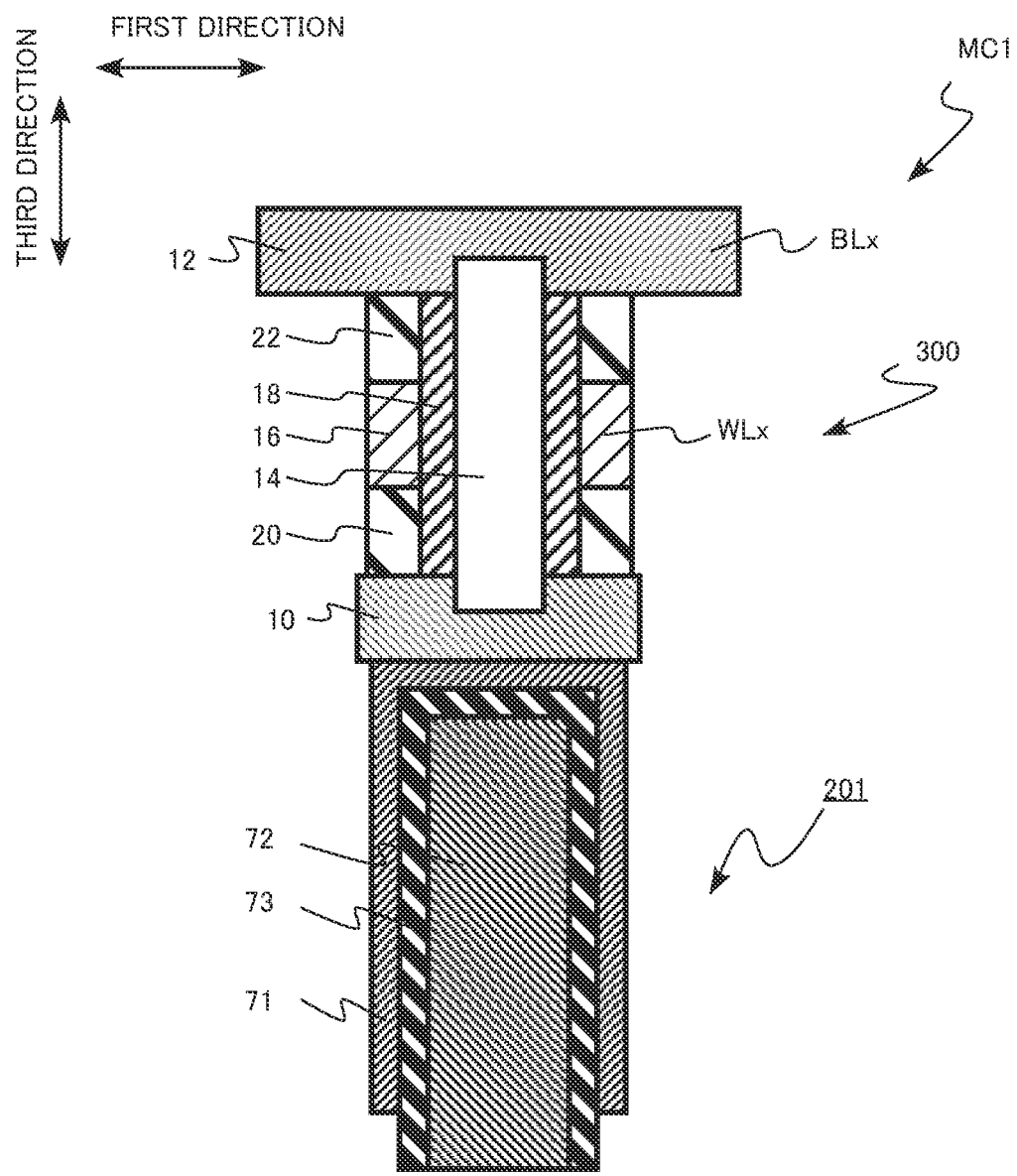
FIG. 49 is a schematic cross-sectional view of a first memory cell of a semiconductor memory device according to a ninth embodiment.
Figure 50:
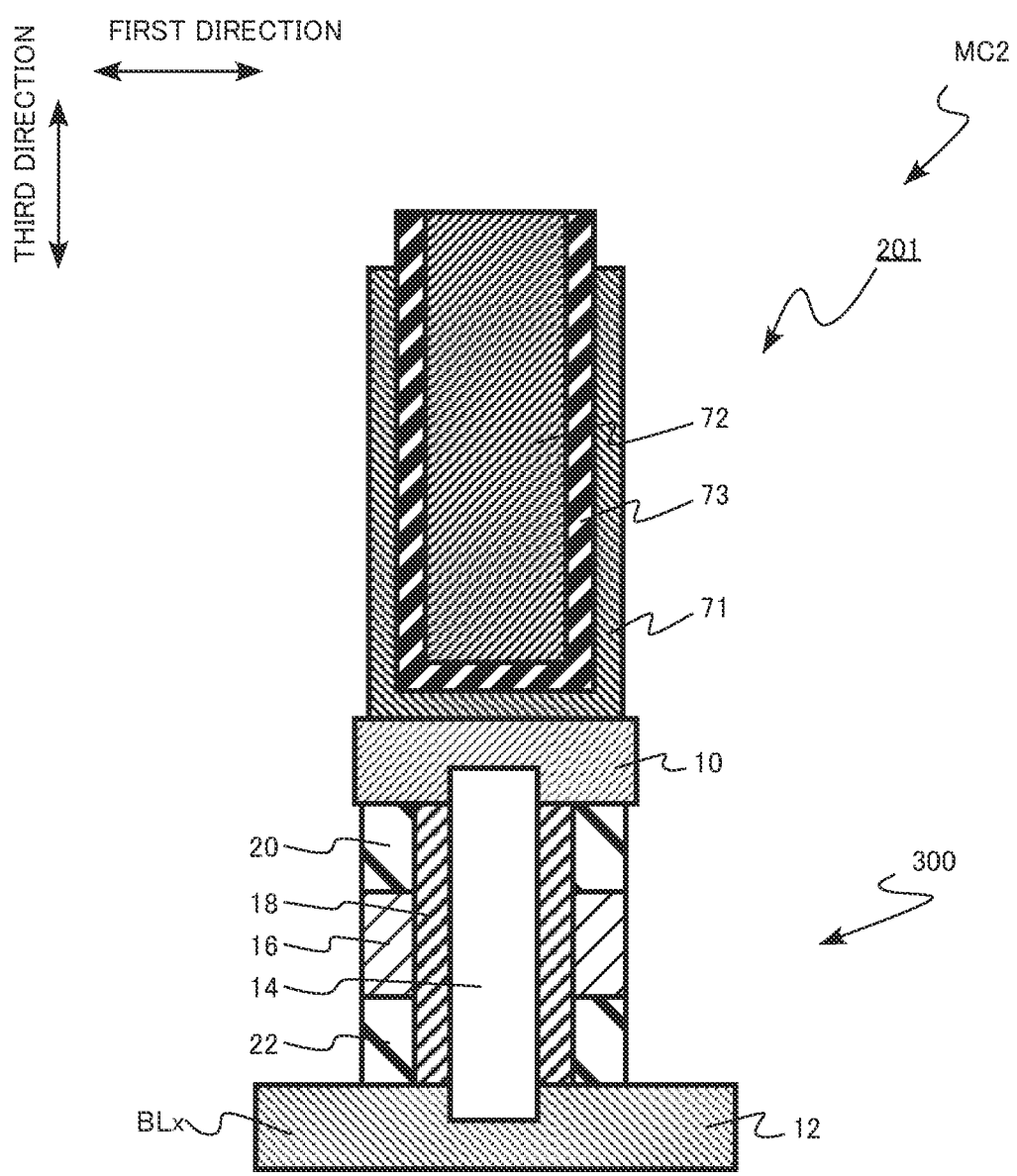
FIG. 50 is a schematic cross-sectional view of a second memory cell of the semiconductor memory device according to the ninth embodiment.

FIG. 49 is a schematic cross-sectional view of a first memory cell of the semiconductor memory device according to the ninth embodiment. FIG. 50 is a schematic cross-sectional view of a second memory cell of the semiconductor memory device according to the ninth embodiment.

A second memory cell MC2 has a structure in which a first memory cell MC1 is turned upside down. Each of the first memory cell MC1 and the second memory cell MC2 includes a transistor 300 and a capacitor 201.

The transistor 300 includes a lower electrode 10, an upper electrode 12, an oxide semiconductor layer 14, a gate electrode 16, a gate insulating layer 18, a first interlayer insulating layer 20, and a second interlayer insulating layer 22.

The lower electrode 10 is an example of the first electrode. The upper electrode 12 is an example of the second electrode. The first interlayer insulating layer 20 is an example of the first insulating layer. The second interlayer insulating layer 22 is an example of the second insulating layer.

The transistor 300 has the same configuration as the transistor 300 according to the seventh embodiment.

The capacitor 201 includes a cell electrode 71, a plate electrode 72, and a capacitor insulating film 73.

The cell electrode 71 of the capacitor 201 is connected to, for example, the lower electrode 10. The plate electrode 72 is connected to the plate electrode line PL.

The upper electrode 12 is connected to the bit line BL. The gate electrode 16 is connected to the word line WL.

According to the ninth embodiment, by using the transistor 300 according to the seventh embodiment as a switching transistor of a DRAM, a semiconductor memory having improved memory characteristics is realized.

In the semiconductor memory device according to the sixth embodiment, the case where the transistor 100 according to the first embodiment is used as a switching transistor of the DRAM has been described as an example. However, instead of the transistor 100 according to the first embodiment, the transistors of the modification examples of the first embodiment, the transistor according to the second embodiment or its modification example, the transistor according to the third embodiment, the transistor according to the fourth embodiment or its modification example, or the transistor according to the fifth embodiment or its modification example can also be used.

In the semiconductor device according to the seventh embodiment or the semiconductor device according to the eighth embodiment, the oxide semiconductor layer 14 can be made to have a structure having a forward tapered shape or a reverse tapered shape.

In the semiconductor memory device according to the ninth embodiment, the case where the transistor 300 according to the seventh embodiment is used as a switching transistor of the DRAM has been described as an example. However, instead of the transistor 300 according to the seventh embodiment, the transistors of the modification examples of the seventh embodiment or the transistor according to the eighth embodiment or its modification examples can also be used.

In the semiconductor device according to any one of the first to fifth, seventh, and eighth embodiments, it is also possible to adopt a configuration including a core insulating layer surrounded by the oxide semiconductor layer 14.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
an oxide semiconductor layer provided between the first electrode and the second electrode;
a gate electrode surrounding at least a part of the oxide semiconductor layer;
a gate insulating layer, at least a part of the gate insulating layer provided between the gate electrode and the oxide semiconductor layer;
a first insulating layer provided between the first electrode and the gate electrode; and
a second insulating layer provided between the second electrode and the gate electrode,
wherein, in a cross section parallel to a first direction from the first electrode to the second electrode and including the oxide semiconductor layer, a direction connecting a first end of an interface between the first electrode and the first insulating layer on a side of the oxide semiconductor layer and a second end of an interface between the second electrode and the second insulating layer on the side of the oxide semiconductor layer is defined as a second direction,
in the cross section, a first portion of the oxide semiconductor layer is provided between the gate insulating layer and the first electrode in the second direction, and
in the cross section, a second portion of the oxide semiconductor layer is provided between the gate insulating layer and the second electrode in the second direction.

2. The semiconductor device according to claim 1, wherein, in the cross section, the gate insulating layer has a plano-convex shape.

3. The semiconductor device according to claim 1, wherein the first portion is in contact with the first insulating layer, and the second portion is in contact with the second insulating layer.

4. The semiconductor device according to claim 1, wherein a first region of the gate insulating layer is provided between the first insulating layer and the first portion, and a second region of the gate insulating layer is provided between the second insulating layer and the second portion.

5. The semiconductor device according to claim 4, wherein a thickness of the first region of the gate insulating layer in a direction from the first insulating layer to the first portion is equal to or less than half a thickness of the gate insulating layer between the gate electrode and the oxide semiconductor layer in a direction from the gate electrode to the oxide semiconductor layer, and
a thickness of the second region of the gate insulating layer in a direction from the second insulating layer to the second portion is equal to or less than half a thickness of the gate insulating layer between the gate electrode and the oxide semiconductor layer in the direction from the gate electrode to the oxide semiconductor layer.

6. The semiconductor device according to claim 1, wherein the gate insulating layer includes a first layer and a second layer provided between the first layer and the oxide semiconductor layer, and the second layer having a chemical composition different from a chemical composition of the first layer.

7. The semiconductor device according to claim 6, wherein the first layer is provided between the gate electrode and the oxide semiconductor layer, and
the second layer is provided between the gate electrode and the oxide semiconductor layer, between the first insulating layer and the first portion, and between the second insulating layer and the second portion.

8. The semiconductor device according to claim 6, wherein the first layer contains silicon (Si) and nitrogen (N), and the second layer contains silicon (Si) and oxygen (O).

9. The semiconductor device according to claim 1,
wherein the second direction crosses the first direction.

10. The semiconductor device according to claim 1,
wherein the oxide semiconductor layer contains zinc (Zn) and at least one element selected from a group consisting of indium (In), gallium (Ga), and aluminum (Al).

11. A semiconductor memory device, comprising:
the semiconductor device according to claim 1; and
a capacitor electrically connected to the first electrode or the second electrode.

12. A semiconductor device, comprising:
a first electrode;
a second electrode;
an oxide semiconductor layer provided between the first electrode and the second electrode;
a gate electrode surrounding at least a part of the oxide semiconductor layer; and
a gate insulating layer, at least a part of the gate insulating layer provided between the gate electrode and the oxide semiconductor layer,
wherein, in a cross section perpendicular to a first direction from the first electrode to the second electrode, at least one of the first electrode and the second electrode surrounds the oxide semiconductor layer, and the at least one of the first electrode and the second electrode directly contacts a part of a side surface of the oxide semiconductor.

13. The semiconductor device according to claim 12,
wherein the first electrode surrounds the oxide semiconductor layer, and the second electrode surrounds the oxide semiconductor layer.

14. The semiconductor device according to claim 12,
wherein the first electrode and the second electrode are formed of the same material.

15. The semiconductor device according to claim 14,
wherein each of the first electrode and the second electrode contains oxygen (O) and at least one element selected from a group consisting of indium (In), tin (Sn), zinc (Zn), and titanium (Ti).

16. The semiconductor device according to claim 12,
wherein the oxide semiconductor layer contains zinc (Zn) and at least one element selected from a group consisting of indium (In), gallium (Ga), and aluminum (Al).

17. A semiconductor memory device, comprising:
the semiconductor device according to claim 12; and
a capacitor electrically connected to the first electrode or the second electrode.

18. A semiconductor device, comprising:
a first electrode;
a second electrode;
an oxide semiconductor layer provided between the first electrode and the second electrode;
a gate electrode surrounding at least a part of the oxide semiconductor layer; and
a gate insulating layer, at least a part of the gate insulating layer provided between the gate electrode and the oxide semiconductor layer,
wherein, in a cross section perpendicular to a first direction from the first electrode to the second electrode, at least one of the first electrode and the second electrode is surrounded by the oxide semiconductor layer.

19. The semiconductor device according to claim 18,
wherein the first electrode is surrounded by the oxide semiconductor layer, and the second electrode is surrounded by the oxide semiconductor layer.

20. A semiconductor memory device, comprising:
the semiconductor device according to claim 18; and
a capacitor electrically connected to the first electrode or the second electrode.

\* \* \* \* \*